(12) United States Patent
Satou et al.

(10) Patent No.: US 11,233,958 B2
(45) Date of Patent: Jan. 25, 2022

(54) IMAGING DEVICE

(71) Applicant: Panasonic Intellectual Property Management Co., Ltd., Osaka (JP)

(72) Inventors: Yoshiaki Satou, Kyoto (JP); Shota Yamada, Shiga (JP); Masashi Murakami, Kyoto (JP); Yutaka Hirose, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 10 days.

(21) Appl. No.: 16/377,855

(22) Filed: Apr. 8, 2019

(65) Prior Publication Data

US 2019/0238767 A1 Aug. 1, 2019

Related U.S. Application Data

(63) Continuation of application No. PCT/JP2018/022308, filed on Jun. 12, 2018.

(30) Foreign Application Priority Data

Jul. 5, 2017 (JP) .............................. JP2017-131878
Jul. 5, 2017 (JP) .............................. JP2017-131879
May 31, 2018 (JP) .............................. JP2018-104972

(51) Int. Cl.
*H04N 5/361* (2011.01)
*H04N 5/369* (2011.01)
(Continued)

(52) U.S. Cl.
CPC ........... *H04N 5/361* (2013.01); *H01L 27/146* (2013.01); *H01L 27/14612* (2013.01);
(Continued)

(58) Field of Classification Search
CPC ...... H04N 5/3559; H04N 5/359; H04N 5/361; H04N 5/369; H04N 5/374; H01L 27/14612; H01L 27/14634; H01L 27/14636
See application file for complete search history.

(56) References Cited

U.S. PATENT DOCUMENTS 6,512,544 B1 * 1/2003 Merrill ............... H04N 5/35527
348/302
2006/0023097 A1 2/2006 Watanabe
(Continued)

FOREIGN PATENT DOCUMENTS

JP 2006-042121 2/2006
JP 2008-252695 10/2008
(Continued)

OTHER PUBLICATIONS

International Search Report of PCT application No. PCT/JP2018/022308 dated Sep. 4, 2018.

*Primary Examiner* — Daniel M Pasiewicz
(74) *Attorney, Agent, or Firm* — McDermott Will and Emery LLP

(57) ABSTRACT

An imaging device includes a semiconductor substrate that includes a first impurity region having n-type conductivity; a photoelectric converter that is electrically connected to the first impurity region and that converts light into charges; a capacitor that includes a first terminal and a second terminal, the first terminal being electrically connected to the first impurity region; and a voltage supply circuit electrically connected to the second terminal. The voltage supply circuit is configured to generate a first voltage and a second voltage different from the first voltage. The first impurity region accumulates positive charges generated by the photoelectric converter.

14 Claims, 34 Drawing Sheets

(51) Int. Cl.
  *H01L 27/146*   (2006.01)
  *H04N 5/355*    (2011.01)
  *H04N 5/374*    (2011.01)
  *H04N 5/359*    (2011.01)

(52) U.S. Cl.
  CPC .. *H01L 27/14634* (2013.01); *H01L 27/14636* (2013.01); *H01L 27/14643* (2013.01); *H01L 27/14665* (2013.01); *H04N 5/359* (2013.01); *H04N 5/3559* (2013.01); *H04N 5/369* (2013.01); *H04N 5/374* (2013.01)

(56) References Cited

U.S. PATENT DOCUMENTS

| | | | | |
|---|---|---|---|---|
| 2012/0200752 | A1* | 8/2012 | Matsunaga | H04N 5/37452 348/300 |
| 2014/0043510 | A1 | 2/2014 | Kasuga et al. | |
| 2015/0349008 | A1 | 12/2015 | Yamaguchi | |
| 2016/0013328 | A1* | 1/2016 | Tashiro | H01L 31/0232 250/208.1 |
| 2016/0014364 | A1* | 1/2016 | Tashiro | H04N 5/3698 348/300 |
| 2016/0035920 | A1* | 2/2016 | Tashiro | H04N 5/37452 250/208.1 |
| 2016/0037117 | A1* | 2/2016 | Ono | H04N 5/2173 348/308 |
| 2016/0079297 | A1 | 3/2016 | Sato et al. | |
| 2016/0190188 | A1 | 6/2016 | Murakami et al. | |
| 2016/0360132 | A1 | 12/2016 | Kanehara | |
| 2017/0154908 | A1* | 6/2017 | Tashiro | H01L 27/1461 |
| 2017/0180657 | A1* | 6/2017 | Tashiro | H04N 5/37452 |
| 2018/0249104 | A1* | 8/2018 | Sasago | H01L 27/14621 |

FOREIGN PATENT DOCUMENTS

| | | |
|---|---|---|
| JP | 2009-026892 | 2/2009 |
| JP | 2013-175951 | 9/2013 |
| JP | 2014-175896 | 9/2014 |
| JP | 2016-063216 | 4/2016 |
| JP | 2017-005404 | 1/2017 |
| JP | 2017-046333 | 3/2017 |
| JP | 2017-175345 | 9/2017 |
| WO | 2012/147302 | 11/2012 |
| WO | 2014/112279 | 7/2014 |

* cited by examiner

IMAGING DEVICE

BACKGROUND

1. Technical Field

The present disclosure relates to an imaging device.

2. Description of the Related Art

Charge-coupled device (CCD) image sensors and complementary metal-oxide-semiconductor (CMOS) image sensors are widely used in digital still cameras, digital cameras, and the like. As generally known, such an image sensor includes photodiodes formed on a semiconductor substrate.

A structure has also been proposed in which a photoelectric conversion unit including a photoelectric conversion layer is provided above a semiconductor substrate (e.g., refer to International Publication No. 2012/147302). An imaging device having such a structure is called a "multilayer imaging device". A multilayer imaging device includes a floating node that is electrically connected to a photoelectric conversion unit and that temporarily accumulates, as signal charges, positive or negative charges generated through photoelectric conversion. The floating node typically includes a diffusion region formed in a semiconductor substrate that supports the photoelectric conversion unit and a conductive member that electrically connects the photoelectric conversion unit and the diffusion region to each other. A CCD circuit or a CMOS circuit is provided on the semiconductor substrate, and a signal according to the charges accumulated in the floating node is read through the CCD circuit or the CMOS circuit.

SUMMARY

In a field of imaging devices, it is desired to reduce noise. In an imaging device, a resultant image might deteriorate due to leak current from or to an impurity region that accumulates charges generated through photoelectric conversion. It is therefore advantageous to reduce leak current. In the following description, leak current from or to an impurity region that accumulates charges generated through photoelectric conversion will be simply referred to as "dark current".

One non-limiting and exemplary embodiment provides the following.

In one general aspect, the techniques disclosed here feature an imaging device including a semiconductor substrate that includes a first impurity region having n-type conductivity; a photoelectric converter that is electrically connected to the first impurity region and that converts light into charges; a capacitor that includes a first terminal and a second terminal, the first terminal being electrically connected to the first impurity region; and a voltage supply circuit electrically connected to the second terminal. The voltage supply circuit is configured to generate a first voltage and a second voltage different from the first voltage. The first impurity region accumulates positive charges generated by the photoelectric converter.

According to the embodiment of the present disclosure, an imaging device capable of suppressing dark current is provided.

It should be noted that general or specific embodiments may be implemented as an element, a device, a module, a system, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
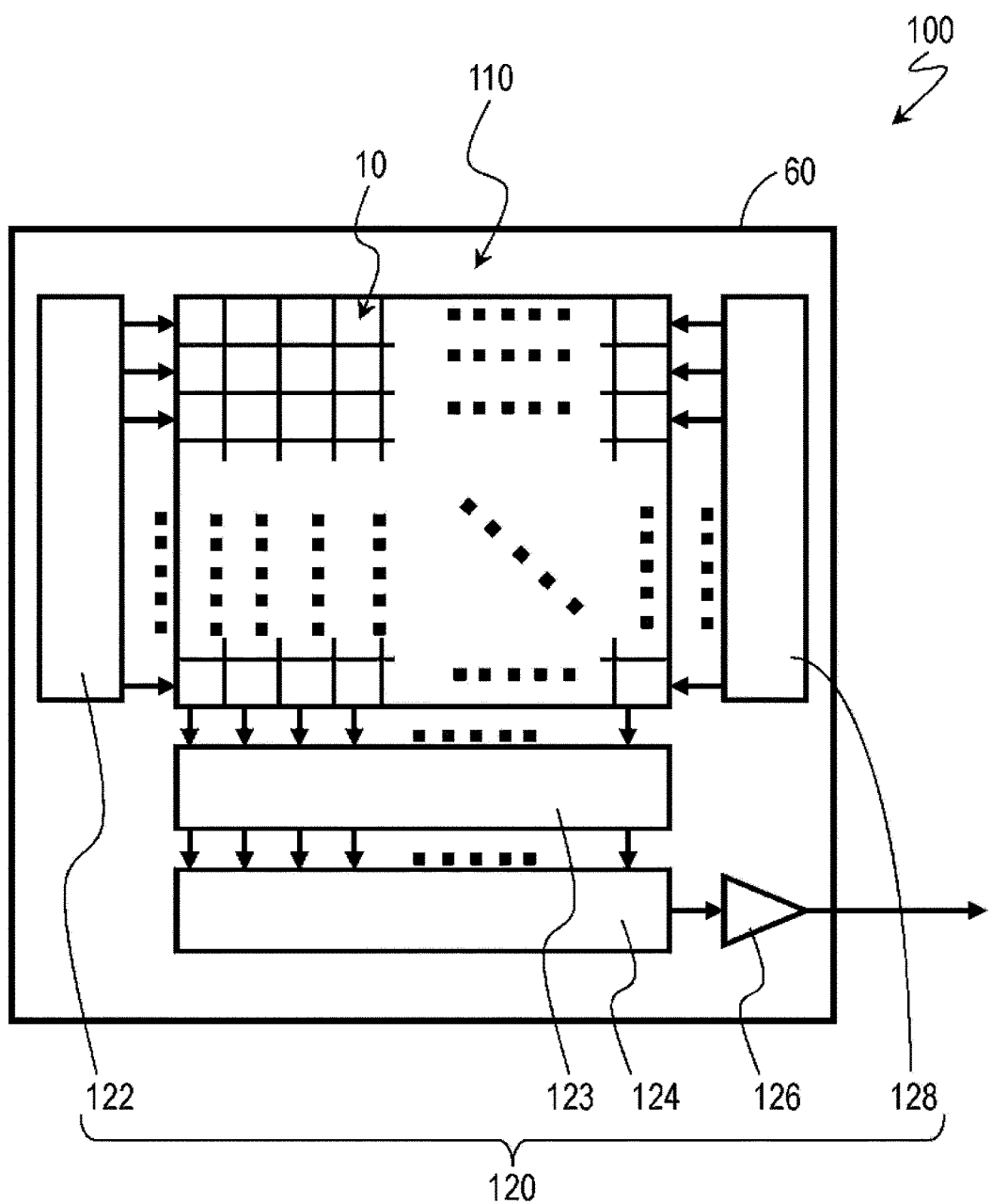
FIG. 1 is a diagram schematically illustrating an example of the configuration of an imaging device according to a first embodiment of the present disclosure.

Imaging devices described in the following items will be disclosed herein.

Item 1

An imaging device includes a semiconductor substrate that includes a first impurity region having n-type conductivity;

a photoelectric converter that is electrically connected to the first impurity region and that converts light into charges;

a capacitor that includes a first terminal and a second terminal, the first terminal being electrically connected to the first impurity region; and a voltage supply circuit electrically connected to the second terminal, wherein the voltage supply circuit is configured to generate a first voltage and a second voltage different from the first voltage, and the first impurity region accumulates positive charges generated by the photoelectric converter.

Item 2

The imaging device according to Item 1 includes a first transistor including the first impurity region as a source or a drain, wherein the voltage supply circuit supplies the first voltage to the second terminal in a first period, and supplies the second voltage to the second terminal in a second period after the first period, the first transistor being in on-state in the first period, the first transistor being in off-state in the second period.

Item 3

The imaging device according to Item 1 includes a first transistor including the first impurity region as a source or a drain, wherein the voltage supply circuit supplies the first voltage to the second terminal in a first period, and supplies the second voltage to the second terminal in a second period after the first period, the positive charges being accumulated in the first impurity region in the first period, the first transistor being in on-state in the second period.

Item 4

In the imaging device according to Item 2 or 3, the semiconductor substrate includes a second impurity region, the first transistor includes the second impurity region as the other of the source and the drain, and the first terminal is connected to the second impurity region.

Item 5

In the imaging device according to any of Items 2 to 4, the second voltage is greater than the first voltage.

Item 6

An imaging device includes a semiconductor substrate that includes a first impurity region having p-type conductivity;

a photoelectric converter that is electrically connected to the first impurity region and that converts light into charges;

a capacitor that includes a first terminal and a second terminal, the first terminal being electrically connected to the first impurity region; and a voltage supply circuit electrically connected to the second terminal, wherein the voltage supply circuit is configured to generate a first voltage and a second voltage different from the first voltage, and the first impurity region accumulates negative charges generated by the photoelectric converter.

Item 7

The imaging device according to Item 6 includes a first transistor including the first impurity region as a source or a drain, wherein the voltage supply circuit supplies the first voltage to the second terminal in a first period, and supplies the second voltage to the second terminal in a second period after the first period, the first transistor being in on-state in the first period, the first transistor being in off-state in the second period.

Item 8

The imaging device according to Item 6 includes a first transistor including the first impurity region as a source or a drain, wherein the voltage supply circuit supplies the first voltage to the second terminal in a first period, and supplies the second voltage to the second terminal in a second period after the first period, the negative charges being accumulated in the first impurity region in the first period, the first transistor being in on-state in the second period.

Item 9

In the imaging device according to Item 7 or 8,
the semiconductor substrate includes a second impurity region,
the first transistor includes the second impurity region as the other of the source and the drain, and
the first terminal is connected to the second impurity region.

Item 10

In the imaging device according to any of Items 7 to 9, the second voltage is less than the first voltage.

Item 11

In the imaging device according to any of Items 1 to 10,
the capacitor and the first impurity region are at least a part of a charge accumulation node that accumulates positive or negative charges generated by the photoelectric converter, and
a capacitance of the capacitor is lower than a capacitance of a part of the charge accumulation node other than the capacitor.

Item 12

In the imaging device according to any of Items 1 to 11,
the photoelectric converter includes a first electrode, a second electrode facing the first electrode, and a photoelectric conversion layer located between the first electrode and the second electrode, and
the first electrode is electrically connected to the first impurity region.

Item 13

In the imaging device according to any of Items 1 to 4 and 6 to 9, the photoelectric converter is an embedded photodiode.

Imaging devices described in the following items will also be disclosed herein.

Item 1

An imaging device includes a semiconductor substrate including a first impurity region and a second impurity region, a photoelectric converter electrically connected to the first impurity region, a first transistor that includes the first impurity region as a source region or a drain region and the second impurity region as another of the source region and the drain region, and a voltage supply circuit electrically connected to the second impurity region. The voltage supply circuit applies a first voltage to the second impurity region in a first period, in which the first transistor is on, and a second voltage, which is different from the first voltage, to the second impurity region in a second period, which comes after the first period and in which the first transistor is off.

According to Item 1, dark current due to a forward bias applied to a p-n junction between the first impurity region and an adjacent region when the first transistor is turned off can be suppressed.

Item 2

The imaging device according to Item 1 further includes a capacitor connected between the second impurity region and the voltage supply circuit.

According to Item 2, a difference between the first voltage and the second voltage becomes smaller.

Item 3

The imaging device according to Item 2 further includes a second transistor whose source region or drain region is electrically connected to the second impurity region.

Item 4

The imaging device according to Item 1 further includes a second transistor whose source region or drain region is electrically connected to the second impurity region. The voltage supply circuit is connected to another of the source region and the drain region of the second transistor.

According to Item 4, dark current due to a forward bias applied between a p-n junction between the second impurity region and an adjacent region when the second transistor is turned off is suppressed.

Item 5

In the imaging device according to Item 3 or 4, the second period is a period for which the second transistor remains on other than the first period.

According to Item 5, dark current due to variation in the potential of the first impurity region caused by coupling through the first transistor can be suppressed.

Item 6

In the imaging device according to Item 3 or 4, the second period starts when the second transistor is turned off.

According to Item 6, dark current due to variation in the potential of the second impurity region caused by coupling through the second transistor can be suppressed.

Item 7

An imaging device includes a semiconductor substrate including a first impurity region, a photoelectric converter electrically connected to the first impurity region, a first transistor that includes the first impurity region as a source region or a drain region and that supplies or does not supply a reset voltage to the first impurity region, and a voltage supply circuit electrically connected to the first impurity region. The voltage supply circuit applies a first voltage to the first impurity region in a first period, in which the first transistor is on, and a second voltage, which is different from the first voltage, to the first impurity region in a second period, which comes after the first period and in which the first transistor is off.

According to Item 7, dark current due to a forward bias applied to a p-n junction between the first impurity region and an adjacent region when the first transistor is turned off can be suppressed.

Item 8

The imaging device according to Item 7 further includes a capacitor connected between the first impurity region and the voltage supply circuit.

According to Item 8, a difference between the first voltage and the second voltage becomes smaller.

Item 9

The imaging device according to Item 7 or 8 further includes a second transistor whose source region or drain region is electrically connected to another of the source region and the drain region of the first transistor. The voltage supply circuit is connected to the first impurity region through the first transistor.

Item 10

The imaging device according to Item 3, 4, 5, 6, or 9 further includes a feedback circuit that includes the second transistor and that negatively feeds back an electric signal generated by the photoelectric converter.

According to Item 10, kTC noise can be reduced through the negative feedback.

Item 11

In the imaging device according to any of Items 1 to 10, the first transistor is of an n-type. The second voltage is higher than the first voltage.

According to Item 11, the potential of the first impurity region and/or the potential of a node between the first transistor and the second transistor can be kept from falling below a substrate potential of the semiconductor substrate.

Item 12

In the imaging device according to any of Items 1 to 10, the first transistor is of a p-type. The second voltage is lower than the first voltage.

According to Item 12, the potential of the first impurity region and/or the potential of a node between the first transistor and the second transistor can be kept from exceeding a substrate potential of the semiconductor substrate.

Item 13

An imaging device includes a semiconductor substrate including a first impurity region, a photoelectric converter electrically connected to the first impurity region, a reset transistor that includes the first impurity region as a source region or a drain region and that supplies or does not supply a reset voltage to the first impurity region, and a driving circuit connected to a gate of the reset transistor. The driving circuit sequentially applies a first voltage for turning on the reset transistor, a second voltage for turning off the reset transistor, and a third voltage between the first voltage and the second voltage to the gate to reset a potential of the first impurity region.

According to Item 13, deterioration of image quality due to dark current can be prevented while avoiding excessive complication of circuits.

Item 14

In the imaging device according to Item 13, the reset transistor is of an n-type. The third voltage is lower than the first voltage but higher than the second voltage.

According to Item 14, the potential of the first impurity region and/or the potential of a node between the first transistor and the second transistor can be kept from falling below a substrate potential of the semiconductor substrate.

Item 15

In the imaging device according to Item 13 or 14, a potential of the first impurity region becomes higher than a substrate potential of the semiconductor substrate when the driving circuit applies the third voltage to the gate.

According to Item 15, an effect of dark current upon a signal corresponding to a voltage level of a charge accumulation node after resetting can be suppressed.

Item 16

In the imaging device according to Item 13, the reset transistor is of a p-type. The third voltage is higher than the first voltage but lower than the second voltage.

According to Item 16, the potential of the first impurity region and/or the potential of a node between the first transistor and the second transistor can be kept from exceeding a substrate potential of the semiconductor substrate.

Item 17

In the imaging device according to Item 13 or 16, the potential of the first impurity region becomes lower than a substrate potential of the semiconductor substrate when the driving circuit applies the third voltage to the gate.

According to Item 17, an effect of dark current upon a signal corresponding to a voltage level of a charge accumulation node after resetting can be suppressed.

Item 18

A method for driving an imaging device including a photoelectric converter, a charge accumulation node electrically connected to the photoelectric converter, a detection circuit that detects signal charges accumulated in the charge accumulation node, and a reset transistor that discharges the signal charges includes resetting a potential of the charge accumulation node by sequentially applying a first voltage for turning on the reset transistor, a second voltage for turning off the reset transistor, and a third voltage between the first voltage and the second voltage to a gate of the reset transistor.

According to Item 18, deterioration of image quality due to dark current can be prevented while avoiding excessive complication of circuits.

Item 19

In the method according to Item 18, the charge accumulation node includes an n-type first impurity region formed on a semiconductor substrate. The third voltage is lower than the first voltage but higher than the second voltage.

Item 20

The method according to Item 19 further includes applying, as the second voltage, a voltage with which a potential of the charge accumulation node becomes lower than a substrate potential of the semiconductor substrate.

Item 21

In the method according to Item 18, the charge accumulation node includes a p-type first impurity region formed on a semiconductor substrate. The third voltage is higher than the first voltage but lower than the second voltage.

Item 22

The method according to Item 21 further includes applying, as the second voltage, a voltage with which a potential of the charge accumulation node becomes higher than a substrate potential of the semiconductor substrate is applied.

Item 23

In the imaging device according to any of Items 1 to 17 and 19 to 22, the photoelectric converter further includes a first electrode supported by the semiconductor substrate, a second electrode, and a photoelectric conversion layer located between the first electrode and the second electrode. The first electrode is electrically connected to the first impurity region.

Item 24

In the imaging device according to any of Items 1 to 23, the photoelectric converter is an embedded photodiode.

Item 25

An imaging device includes a plurality of pixels. Each of the plurality of pixels includes a photoelectric converter that generates charges through photoelectric conversion, a charge accumulation node that accumulates the charges, a reset transistor that is electrically connected to the charge accumulation node and that resets a potential of the charge accumulation node to a reference potential, an amplifying transistor that is electrically connected to the charge accumulation node and that outputs a signal voltage corresponding to the charges accumulated in the charge accumulation node, and a capacitor including an end electrically connected to the charge accumulation node and another end connected to a voltage source. In an exposure period, in which the charges are accumulated in the charge accumulation node, a first voltage is applied to the other end of the capacitor. In a reset period included in a non-exposure period, which is a period other than the exposure period, a second voltage, which is different from the first voltage, is applied to the other end. The reset period is a part of the non-exposure period. In the reset period, the reset transistor resets the potential of the charge accumulation node to the reference potential.

According to Item 25, an imaging device capable of reducing leak current is provided.

Item 26

In the imaging device according to Item 25, the second voltage is applied to the other end of the capacitor over the non-exposure period.

According to Item 26, when positive holes are used as signal charges, for example, dark current can be suppressed without deteriorating circuit characteristics by setting the potential of the charge accumulation node low in the exposure period and high in the non-exposure period.

Item 27

In the imaging device according to Item 25 or 26, the capacitor is electrically connected to a gate of the amplifying transistor.

According to Item 27, a change in the voltage of a control signal applied to the other end of the capacitor is given to a floating diffusion (FD) node through the capacitor.

Item 28

The imaging device according to Item 26 or 27 further includes a selection transistor that is electrically connected to the amplifying transistor and that selectively outputs a signal voltage. A control signal of the selection transistor is transmitted to the other end of the capacitor.

According to Item 28, since a control signal in a pixel can also be used as a control signal transmitted to the capacitor, the number of control signal lines used can be reduced.

Item 29

The imaging device according to Item 26 or 27 further includes a switch transistor that is electrically connected between the end of the capacitor and the charge accumulation node or between the voltage source and the other end and that connects the capacitor and the charge accumulation node to each other or disconnects the capacitor and the charge accumulation node from each other.

According to Item 29, for example, an FD potential control mode, in which the potential of the charge accumulation node is controlled, and a high gain mode, in which signal charges are efficiently converted, can be used.

Item 30

In the imaging device according to any of Items 25 to 29, the charges are positive holes. The second voltage is higher than the first voltage.

According to Item 30, an imaging device that is capable of reducing leak current and that uses positive holes as signal charges can be provided.

Item 31

In the imaging device according to Item 30, the reset transistor and the amplifying transistor are n-type transistors.

According to Item 31, when positive hole are used as signal charges, leak current can be appropriately reduced.

Item 32

In the imaging device according to any of Items 25 to 29, the charges are electrons. The second voltage is lower than the first voltage.

According to Item 32, an imaging device that is capable of reducing leak current and that uses electrons as signal charges can be provided.

Item 33

In the imaging device according to Item 32, the reset transistor and the amplifying transistor are p-type transistors.

According to Item 33, when electrons are used as signal charges, leak current can be appropriately reduced.

Item 34

In the imaging device according to Item 30, the first voltage is a ground voltage.

According to Item 34, power supply noise of the control signal applied to the capacitor can be kept from entering the charge accumulation node.

Item 35

In the imaging device according to Item 30, the second voltage is a ground voltage.

According to Item 35, power supply noise of the control signal applied to the capacitor can be kept from entering the charge accumulation node.

Item 36

In the imaging device according to any of Items 25 to 35, the amplifying transistor is a depletion transistor.

According to Item 36, because a high output is obtained from the amplifying transistor even when the potential of the charge accumulation node is low, a voltage range necessary to operate a current source of a source follower circuit can be secured.

Item 37

In the imaging device according to any of Items 25 to 36, the photoelectric converter includes a first electrode, a second electrode facing the first electrode, and a photoelectric conversion film that is located between the first electrode and the second electrode and that generates charges through photoelectric conversion.

According to Item 37, an imaging device that is capable of reducing leak current and that includes a photoelectric converter including a photoelectric conversion film is provided.

Embodiments of the present disclosure will be described in detail hereinafter. The following embodiments are general or specific embodiments. Values, shapes, materials, components, arrangement and connection modes of the components, steps, order of the steps, and the like mentioned in the following embodiments are examples, and do not limit the present disclosure. Various aspects described herein may be combined with each other insofar as no contradiction is caused. Among the components in the following embodiments, ones that are not described in the independent claims will be described as optional components. Components having substantially the same functions will be given the same reference numerals, and description thereof might be omitted.

First Embodiment

FIG. 1 schematically illustrates an example of the configuration of an imaging device according to a first embodiment of the present disclosure. An imaging device 100 illustrated in FIG. 1 includes a pixel array 110 including a plurality of pixels 10 and a peripheral circuit 120.

The pixel array 110 includes the plurality of pixels 10 arranged in a matrix of m rows and n columns. Here, m and n are natural numbers. The pixels 10 are arranged on a semiconductor substrate 60 in two dimensions, for example, and form an imaging area. The number and arrangement of the pixels 10 in the pixel array 110 are not limited to those illustrated in FIG. 1. For example, only one pixel 10 may be included in the imaging device 100. When the pixels 10 are arranged in the pixel array 110 in one dimension, the imaging device 100 may be used as a line sensor.

Each pixel 10 includes a photoelectric conversion unit that receives light and generates charge. The photoelectric conversion unit of each pixel 10 may include an embedded photodiode formed in the semiconductor substrate 60 or a part of a photoelectric conversion layer provided above an area of the semiconductor substrate 60 corresponding to the imaging area. Terms "above", "below", and the like herein are used to specify relative positions of members and do not limit the orientation of the imaging device 100 during use.

In the example of the configuration illustrated in FIG. 1, the peripheral circuit 120 includes a vertical scanning circuit 122, a signal holding circuit 123, a horizontal scanning circuit 124, an output amplifier 126, and a voltage supply circuit 128 that supplies a certain voltage to the pixels 10 in the pixel array 110. Here, the peripheral circuit 120 is provided on the semiconductor substrate 60 on which the pixel array 110 is formed. The arrangement of the peripheral circuit 120 is not limited to this example, and a part or the entirety of the peripheral circuit 120 may be provided on a substrate other than the semiconductor substrate 60, instead.

The vertical scanning circuit 122 is also called a "row scanning circuit" and connected to address signal lines and reset signal lines, for example, corresponding to rows of the pixels 10. The vertical scanning circuit 122 supplies certain signals to the address signal lines and the reset signal lines to accumulate and read signal charges in and from the pixels 10 and reset accumulated signal charges in units of rows. The peripheral circuit 120 may include two or more vertical scanning circuits 122. In FIG. 1, various signal lines such as the address signal lines and the reset signal lines are not illustrated for simplicity. Arrows illustrated in FIG. 1 schematically indicate flows of signals supplied to the various signal lines such as the address signal lines and the reset signal lines.

The signal holding circuit 123 is connected to vertical signal lines, which are not illustrated, provided for columns of the pixels 10 and has a function of temporarily holding signals output to the vertical signal lines. The signals may be held as analog values or digital values, which are obtained by performing analog-to-digital conversion. For example, the signal holding circuit 123 outputs, to the horizontal scanning circuit 124, a difference between a signal read from a pixel 10 after signal charges are accumulated and a signal read from the pixel 10 after the signal charges are reset. Calculation between signals may be performed in an analog manner or a digital manner. The horizontal scanning circuit 124 is also called a "column scanning circuit" and typically includes an analog-to-digital conversion circuit. The horizontal scanning circuit 124 has a function of transferring, to the output amplifier 126, differential signals obtained by the signal holding circuit 123 in units of rows of the pixels 10.

The voltage supply circuit 128 is electrically connected to the pixels 10 and supplies two or more certain voltages to the pixels 10 during operation of the imaging device 100 while switching between the two or more certain voltages. The voltage supply circuit 128 supplies a first voltage $V_A$ and a second voltage $V_B$ to the pixels 10 while switching between the first voltage $V_A$ and the second voltage $V_B$. The second voltage $V_B$ is different from the first voltage $V_A$.

The voltage supply circuit 128 may be configured in any manner insofar as the voltage supply circuit 128 can supply the certain voltages to the pixels 10, and is not limited to a power supply circuit of a certain type. The voltage supply circuit 128 may be a circuit that generates the certain voltages or a circuit that converts a voltage supplied from a power supply into the certain voltages. The voltage supply circuit 128 may be a part of the vertical scanning circuit 122. The voltages applied from the voltage supply circuit 128 to the pixels 10 are not limited to two different voltages. The voltage supply circuit 128 may supply three or more different voltages to the pixels 10, instead, while switching between the three or more different voltages.

Device Structure of the Pixels 10

Figure 2:
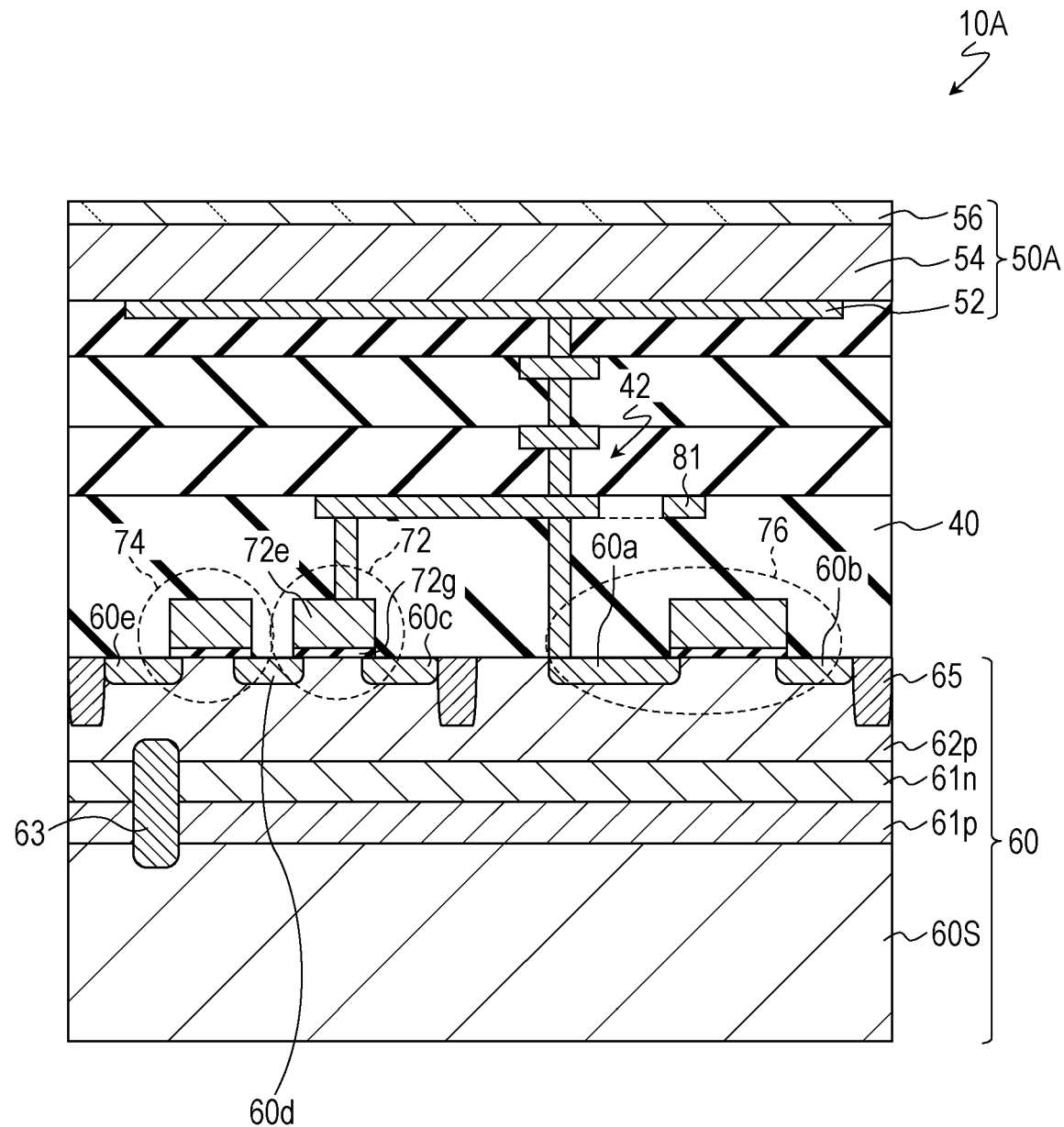
FIG. 2 is a diagram schematically illustrating an example of a cross-section of the device structure of a pixel.

FIG. 2 schematically illustrates an example of a cross-section of the device structure of a pixel 10. FIG. 2 only schematically illustrates shapes, dimensions, and arrangement of components of a pixel 10. The shapes, the dimensions, and the arrangement of the components illustrated in FIG. 2 are not necessarily shapes, dimensions, and arrangement of components of an actual device. The same holds for the other drawings of the present disclosure.

A pixel 10A illustrated in FIG. 2 is an example of each of the above-described pixels 10. The pixel 10A includes a part of the semiconductor substrate 60 and a photoelectric conversion unit 50A supported by an interlayer insulating layer 40 that covers the semiconductor substrate 60. In the example illustrated in FIG. 2, the photoelectric conversion unit 50A includes a photoelectric conversion layer 54 located above an area of the semiconductor substrate 60 corresponding to the imaging area. That is, a multilayer imaging device will be described hereinafter as the imaging device 100.

As schematically illustrated in FIG. 2, the semiconductor substrate 60 includes a base substrate 60S and one or more semiconductor layers formed on the base substrate 60S. Here, a p-type silicon substrate is used as an example of the base substrate 60S. The semiconductor substrate 60 is provided with impurity regions 60a to 60e and device separating regions 65. The impurity regions 60a to 60e are typically n-type diffusion regions.

As illustrated in FIG. 2, the photoelectric conversion unit 50A supported by the semiconductor substrate 60 includes a pixel electrode 52 on the interlayer insulating layer 40, an opposed electrode 56 located farther from the semiconductor substrate 60 than the pixel electrode 52 is, and the photoelectric conversion layer 54 located between the pixel electrode 52 and the opposite electrode 56. The pixel electrode 52 is composed of a metal such as aluminum or copper, a metal nitride, a conductive polysilicon obtained through doping, or the like. The pixel electrode 52 is spatially separated from pixel electrodes 52 of adjacent pixels 10A and consequently electrically separated from the pixel electrodes 52 of the adjacent pixels 10A. The opposed electrode 56 is composed of a conductive transparent material such as indium tin oxide (ITO). A term "transparent" herein means that at least part of light in a wavelength band to be detected is passed through, and visible light need not be passed through over a wavelength band thereof. Whereas the pixel electrode 52 is separated from the pixel electrodes 52 of the adjacent pixels 10A, the opposed electrode 56 is formed across a plurality of pixels 10A. The opposed electrode 56 is typically disposed above the semiconductor substrate 60 as a single continuous electrode.

The photoelectric conversion layer 54 is composed of an organic material or an inorganic material such as amorphous silicon. The photoelectric conversion layer 54 may be formed through vacuum deposition, for example, and have a thickness of about 500 nm. The photoelectric conversion layer 54 may include a layer formed of an organic material and a layer formed of an inorganic material. The photoelectric conversion layer 54 receives light incident through the opposed electrode 56 and generates positive and negative charges through photoelectric conversion. As with the opposed electrode 56, the photoelectric conversion layer 54 may be disposed above the semiconductor substrate 60 across the plurality of pixels 10A as a single continuous layer.

Although not illustrated in FIG. 2, a voltage line connected to a power supply, which is not illustrated, is connected to the opposed electrode 56, and the opposed electrode 56 receives a certain bias voltage during the operation of the imaging device 100. By applying the certain voltage and controlling the potential of the opposed electrode 56, the pixel electrode 52 can collect, as signal charges, either the positive charges or the negative charges generated through the photoelectric conversion.

The bias voltage applied to the opposed electrode 56 may be supplied from the voltage supply circuit 128, instead. When positive charges are used as signal charges, a bias voltage whose potential is higher than that of the pixel electrode 52 may be applied to the opposed electrode 56. In the following example, positive charges will be used as signal charges unless otherwise noted. Positive charges as signal charges are typically positive holes. Negative charges as signal charges, such as electrons, may of course be used, instead. When negative charges are used as signal charges, a bias voltage whose potential is lower than that of the pixel electrode 52 may be applied to the opposed electrode 56.

The pixel 10A includes a connection unit 42 disposed in the interlayer insulating layer 40. As schematically illustrated in FIG. 2, an end of the connection unit 42 is connected to the pixel electrode 52 of the photoelectric conversion unit 50A. The connection unit 42 includes a plurality of wiring layers and a plurality of plugs and electrically connects the photoelectric conversion unit 50A to a circuit formed on the semiconductor substrate 60. The plurality of wiring layers and the plurality of plugs are typically composed of a metal such as copper or tungsten or a metal compound such as a metal nitride or a metal oxide. In this example, a signal detection transistor 72, an address transistor 74, and a reset transistor 76 are formed on the semiconductor substrate 60.

N-channel field-effect transistors (FETs) typified by n-channel metal-oxide-semiconductor (MOS) FETs will be used as the signal detection transistor 72, the address transistor 74, and the reset transistor 76 hereinafter unless otherwise noted. As described later, p-type transistors may be used instead of n-type transistors. In this case, the base substrate 60S may be an n-type silicon substrate, and p-type impurity regions 60a to 60e are used.

The reset transistor 76 includes the impurity region 60a formed in the semiconductor substrate 60 as either a drain region or a source region, for example, and the impurity region 60b as the other of the drain region and the source region. As schematically illustrated in FIG. 2, the connection unit 42 is connected to the impurity region 60a, that is, the impurity region 60a is electrically connected to the pixel electrode 52 of the photoelectric conversion unit 50A through the connection unit 42.

Although not illustrated in FIG. 2, a reset voltage line for supplying a reset voltage, which is a reference voltage for resetting, is connected to the impurity region 60b. When turned on and off, the reset transistor 76 switches between supplying and not supplying of the reset voltage supplied from the reset voltage line to the impurity region 60a. Whether the impurity region 60a or the impurity region 60b serves as the drain region of the reset transistor 76 is determined depending on the potential of the impurity regions 60a and 60b. In the following description, the impurity regions 60a and 60b are the drain region and the source region, respectively, for convenience. Depending on a use condition of the imaging device 100, however, the drain region and the source region might be switched. When the imaging device 100 includes another transistor connected in series with the reset transistor 76, the same holds for the other transistor.

The signal detection transistor 72 includes a gate insulating layer 72g on the semiconductor substrate 60, a gate electrode 72e on the gate insulating layer 72g, the impurity region 60c as a drain region 60c, and the impurity region 60d as a source region. A power supply line, which is not illustrated, is connected to the impurity region 60c, and a power supply voltage of 3.3 V, for example, is applied to the impurity region 60c from the power supply line during the operation of the imaging device 100.

As illustrated in FIG. 2, the connection unit 42 is also connected to the gate electrode 72e of the signal detection transistor 72. That is, the gate electrode 72e of the signal detection transistor 72 is electrically connected to the pixel electrode 52 of the photoelectric conversion unit 50A through the connection unit 42.

In the configuration illustrated in FIG. 2, the address transistor 74 includes the impurity region 60d as a drain region and the impurity region 60e as a source region. Here, the address transistor 74 shares the impurity region 60d with the signal detection transistor 72 and is electrically connected to the signal detection transistor 72. A vertical signal line, which is not illustrated, is connected to the impurity region 60e. A circuit in the pixel 10A is electrically separated by the device separating regions 65 from circuits in adjacent pixels 10A. As illustrated in FIG. 2, a device separating region 65 is also provided between the signal detection transistor 72 and the reset transistor 76.

As described above, the connection unit 42 is connected to the pixel electrode 52. The impurity region 60a and the gate electrode 72e of the signal detection transistor 72 are electrically connected to the pixel electrode 52 through the connection unit 42. The pixel electrode 52, the connection unit 42, the impurity region 60a, and the gate electrode 72e function as a charge accumulation node that temporarily holds signal charges collected by the pixel electrode 52.

In the configuration illustrated in FIG. 2, the pixel 10A also includes a control line 81 electrically connected to the connection unit 42. The control line 81 is a signal line connected to the voltage supply circuit 128. That is, here, the impurity region 60a is electrically connected to the voltage supply circuit 128. As described later, a capacitor or the like may be provided between the impurity region 60a and the voltage supply circuit 128. The voltage supply circuit 128 is electrically connected to the connection unit 42, which is a part of the charge accumulation node, and switches an output of the voltage supply circuit 128 between the first voltage $V_A$ and the second voltage $V_B$. As a result, for example, the potential of the charge accumulation node after resetting can be temporarily changed.

Now, details of the configuration of the semiconductor substrate 60 will be described. As described above, the semiconductor substrate 60 includes one or more semiconductor layers on the base substrate 60S. In this example, the semiconductor layers on the base substrate 60S include a first p-type semiconductor layer 61p, an n-type semiconductor layer 61n, and a second p-type semiconductor layer 62p. As schematically illustrated in FIG. 2, the impurity regions 60a to 60e and the device separating regions 65 are formed in the second p-type semiconductor layer 62p as a p-well.

The n-type semiconductor layer 61n is located between the first p-type semiconductor layer 61p and the second p-type semiconductor layer 62p, and the potential of the n-type semiconductor layer 61n is controlled during the operation of the imaging device 100 through a well contact, which is not illustrated, provided outside the imaging area. The n-type semiconductor layer 61n suppresses entry of a small number of carriers into the charge accumulation node that accumulates signal charges from the base substrate 60S or the peripheral circuit 120.

In the configuration illustrated in FIG. 2, the semiconductor substrate 60 includes a p-type region 63 that penetrates through the first p-type semiconductor layer 61p and the n-type semiconductor layer 61n from the second p-type semiconductor layer 62p to the base substrate 60S. The p-type region 63 has a relatively high impurity concentration and electrically connects the second p-type semiconductor layer 62p and the base substrate 60S to each other. A substrate contact, which is not illustrated, is provided outside the imaging area, and the potential of the base substrate 60S and the second p-type semiconductor layer 62p is controlled through the substrate contact during the operation of the imaging device 100. In other words, the substrate potential of the semiconductor substrate 60 is controlled through the substrate contact during the operation of the imaging device 100. The voltage supply circuit 128 may supply the substrate potential of the semiconductor substrate 60 through the substrate contact. As in this example, when the signal detection transistor 72, the address transistor 74, and the reset transistor 76 are n-type transistors, the substrate potential is typically ground.

Suppression of Dark Current

As described above, the impurity region 60a is a part of the charge accumulation node that temporarily accumulates signal charges generated by the photoelectric conversion unit 50A. This is because a junction capacitor formed by a p-n junction between the impurity region 60a and the second p-type semiconductor layer 62p serves as a capacitor for accumulating at least part of signal charges.

The p-n junction between the impurity region 60a and the second p-type semiconductor layer 62p, however, causes a depletion layer. There are lattice defects in the semiconductor substrate 60. Various lattice defects are caused especially on a surface of the semiconductor substrate 60 due to impurities, dangling bonds, and the like. If there are lattice defects in the depletion layer, for example, charges different from intended signal charges are likely to enter the impurity region 60a. In other words, lattice defects in the depletion layer can cause dark current. The dark current decreases a signal-to-noise (S/N) ratio, thereby deteriorating the quality of a resultant image. In order to suppress deterioration of image quality due to dark current, it is advantageous to reduce the depletion layer in the semiconductor substrate 60 in size as much as possible and decrease the number of lattice defects in the depletion layer.

According to an examination conducted by the present inventors, in order to reduce in size the depletion layer formed through the p-n junction between the impurity region 60a and the second p-type semiconductor layer 62p, it is effective to adjust the potential of the impurity region 60a after signal charges are discharged from the impurity region 60a as close to the substrate potential as possible. That is, it is effective to adjust the potential of the impurity region 60a after resetting as close to the substrate potential as possible. When signal charges are positive holes and the substrate potential is ground, for example, it is advantageous to use a low voltage close to 0 V as a reset voltage.

When a difference between the potential of the impurity region 60a after resetting and the substrate potential is too small, however, the potential of the impurity region 60a might fall below the substrate potential if the potential of the impurity region 60a varies due to electrical coupling through circuit elements such as transistors connected to the impurity region 60a.

When an FET is connected to an n-type impurity region in a floating node that accumulates signal charges, for example, the potential of an impurity region can decrease as the FET is turned on and off due to electrical coupling through parasitic capacitance between a source and a drain. If the potential of the impurity region falls below the substrate potential at this time, a forward bias is applied to a p-n junction between the impurity region and an adjacent p-well, and positive holes undesirably enter the impurity region from a p-type silicon substrate as a base substrate. That is, dark current might be generated, and the quality of a resultant image might deteriorate.

The present inventors have found through examinations that entry of charges different from intended signal charges into an impurity region that accumulates the signal charges due to turning on and off of a transistor connected to the impurity region can be avoided, for example, by switching between the first voltage $V_A$ and the second voltage $V_B$ and changing the potential of the charge accumulation nodes after resetting.

Figure 3:
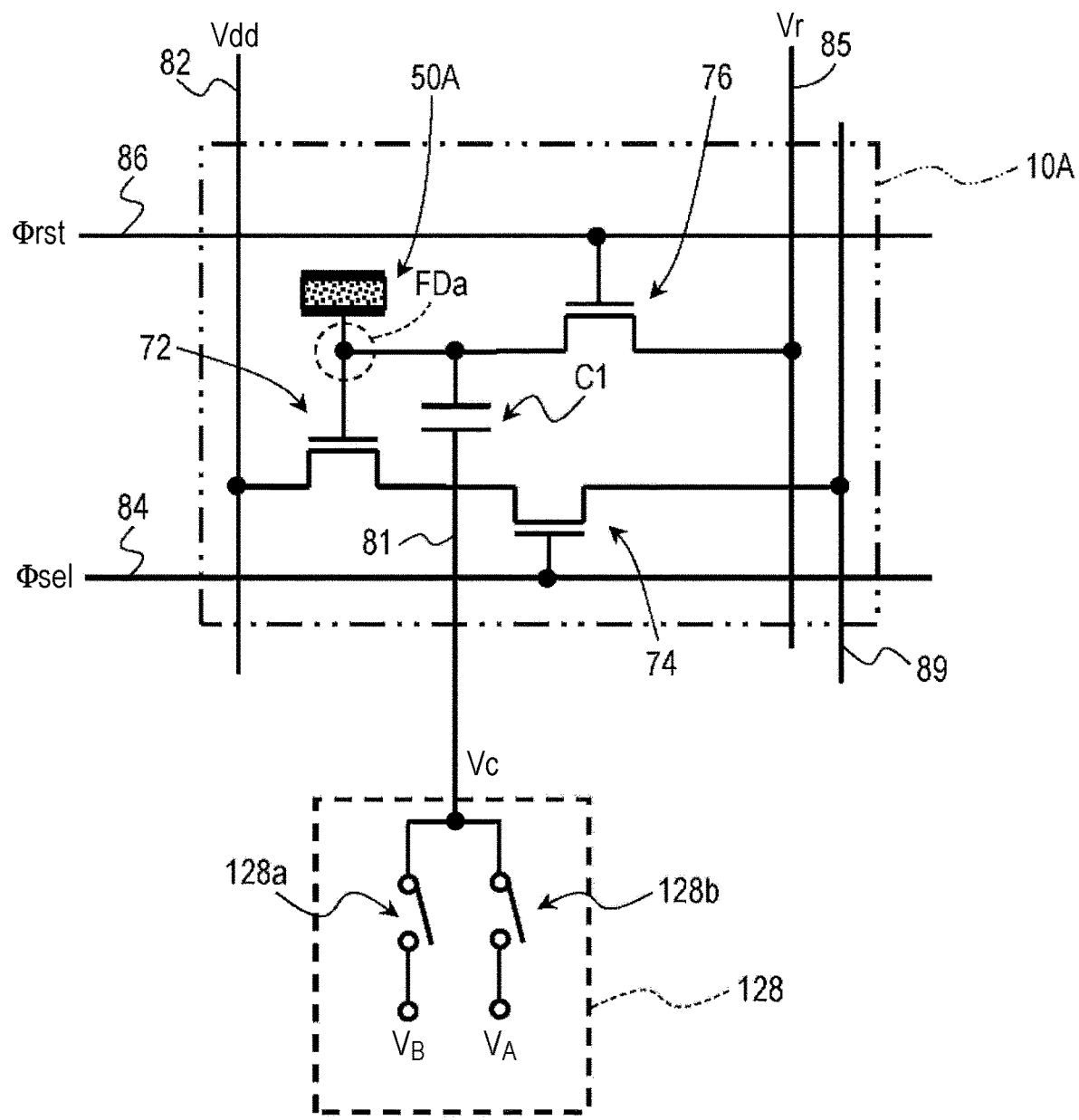
FIG. 3 is a diagram schematically illustrating a typical example of the circuit configuration of the pixel illustrated in FIG. 2.

FIG. 3 schematically illustrates a typical example of the circuit configuration of the pixel 10A illustrated in FIG. 2. In FIG. 3, the voltage line that supplies the certain bias voltage to the opposed electrode 56 of the photoelectric conversion unit 50A is not illustrated for simplicity. In other drawings, too, illustration of the voltage line that supplies the certain bias voltage to the opposed electrode 56 is omitted.

As illustrated in FIG. 3, a gate of the signal detection transistor 72 is connected to the photoelectric conversion unit 50A. A node FDa between the photoelectric conversion unit 50A and the signal detection transistor 72 corresponds to the charge accumulation node. A voltage corresponding to signal charges accumulated in the node FDa is applied to the gate of the signal detection transistor 72. As illustrated in FIG. 3, a power supply line 82 as a source follower power supply that supplies a power supply voltage Vdd is connected to a drain of the signal detection transistor 72, and a vertical signal line 89 is connected to a source of the signal detection transistor 72 through the address transistor 74. That is, the signal detection transistor 72 and the address transistor 74 form a source follower. An address signal line 84 connected to the vertical scanning circuit 122 is connected to a gate of the address transistor 74. The vertical scanning circuit 122 can transfer a signal from the pixel 10A to the vertical signal line 89 by controlling an address signal Φsel applied to the address signal line 84.

The node FDa will be focused upon. The reset transistor 76 is also connected to the node FDa. A source or a drain of the reset transistor 76, whichever is not connected to the node FDa, is connected to a reset voltage line 85. During the operation of the imaging device 100, a certain reset voltage Vr, for example, is applied to the reset voltage line 85. The reset signal line 86 connected to the vertical scanning circuit 122 is connected to a gate of the reset transistor 76. The vertical scanning circuit 122 can apply the reset voltage Vr to the charge accumulation node by controlling a reset signal Φrst applied to the reset signal line 86 and turning on the reset transistor 76. As described with reference to FIG. 2, the reset transistor 76 includes the impurity region 60a, which is a part of the charge accumulation node, as a drain region or a source region. When the reset transistor 76 is turned on, signal charges are discharged from the charge accumulation node, and the potential of the charge accumulation node is reset.

The voltage supply circuit 128 is also electrically connected to the node FDa. In this example, a capacitor C1 is provided between the node FDa and the control line 81 connected to the voltage supply circuit 128. In other words, the node FDa is connected to one of two ends of the capacitor C1. That is, in this example, the one end of the capacitor C1 is electrically connected to the impurity region 60a. The voltage supply circuit 128 is connected to another end of the capacitor C1.

The specific configuration of the capacitor C1 is not particularly limited. For example, the capacitor C1 may be a metal-insulator-semiconductor (MIS) capacitor provided in the interlayer insulating layer 40 or a depletion-mode MOS (DMOS) capacitor. Alternatively, the capacitor C1 may be a metal-insulator-metal (MIM) capacitor. When a MIM capacitor is used, a higher capacitance can be obtained.

In the example illustrated in FIG. 3, the voltage supply circuit 128 includes switching devices 128a and 128b such as FETs. That is, here, the voltage supply circuit 128 switches a voltage Vc applied to the control line 81 between the first voltage $V_A$ and the second voltage $V_B$ by turning on and off the voltage supply circuits 128a and 128b.

First Example of Operation of Imaging Device 100

Figure 4A:
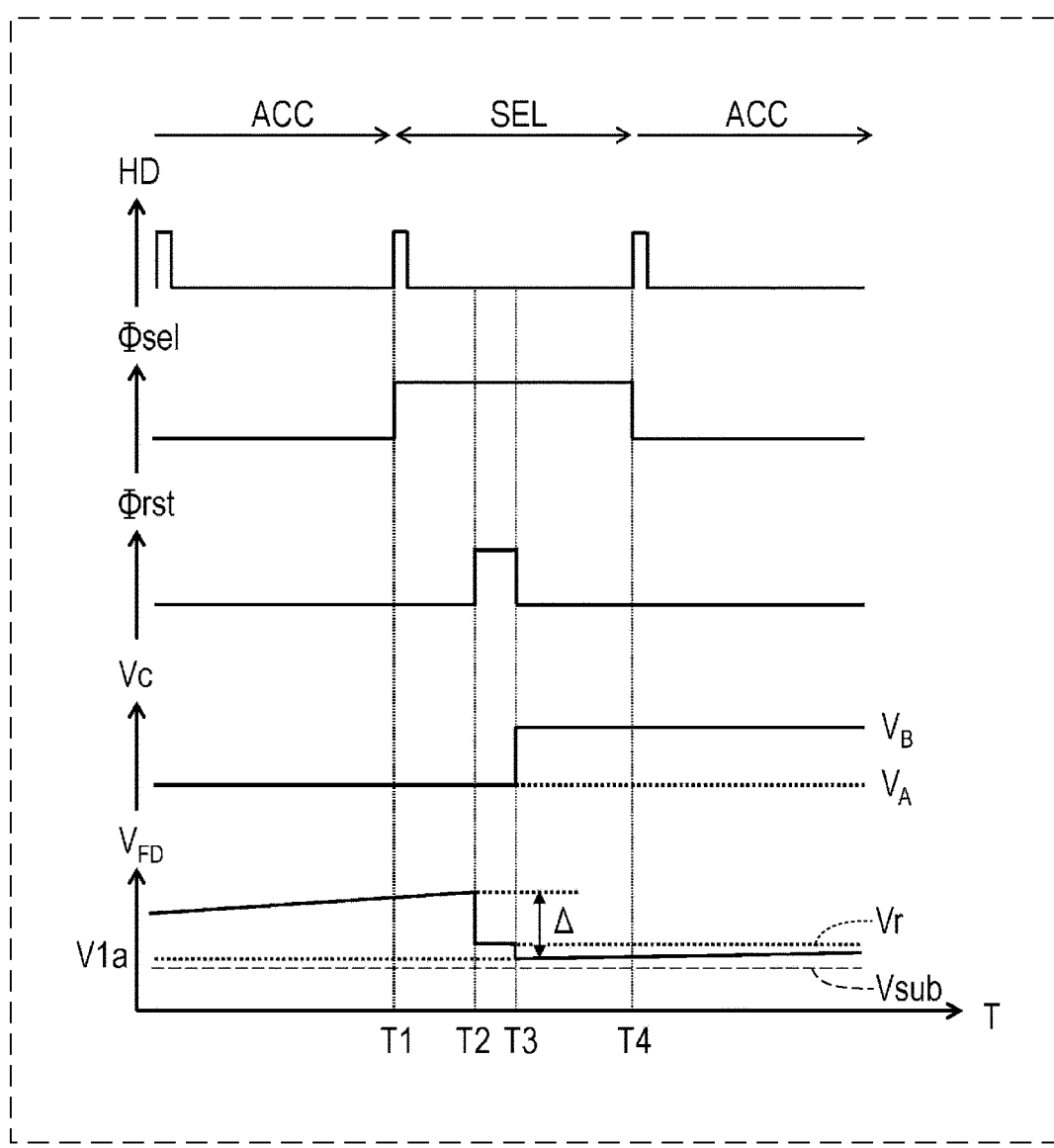
FIG. 4A is a timing chart illustrating an example of the operation of the pixel having the circuit configuration illustrated in FIG. 3.

Next, an example of the operation of the imaging device 100 will be described with reference to FIG. 4A. FIG. 4A is a timing chart illustrating an example of the operation of the pixel 10A having the circuit configuration illustrated in FIG. 3. A top part of FIG. 4A indicates a pulse of a horizontal synchronizing signal HD. A period between a rising edge and a next rising edge corresponds to a period 1H, which is one horizontal scanning period. In each period 1H, pixels 10A belonging to a certain row of the pixel array 110 are reset and signals are read from the pixels 10A. A double-headed arrow SEL illustrated in FIG. 4A indicates a selection period for which the address transistor 74 of the pixel 10A remains on, and arrows ACC indicate non-selection periods for which the address transistor 74 remains off.

A bottom part of FIG. 4A indicates temporal changes in the potential of the node FDa, that is, potential $V_{FD}$ of the impurity region 60a. A second lowest part of FIG. 4A indicates temporal changes in the voltage Vc applied to the control line 81 from the voltage supply circuit 128. Here, the first voltage $V_A$ is applied to the control line 81 at a time T1.

After signal charges are accumulated through exposure, the address signal Φsel is turned high at the time T1. By turning the address signal Φsel high, a first signal whose voltage level corresponds to the signal charges accumulated in the charge accumulation node is transferred to the vertical signal line 89 through the signal detection transistor 72 and the address transistor 74. The first signal is then temporarily held by the signal holding circuit 123 illustrated in FIG. 1.

Next, the reset signal Φrst is turned high at a time T2 to turn on the reset transistor 76. When the reset transistor 76 turns on, the signal charges are discharged from the charge accumulation node, and the potential of the charge accumulation node is reset. At this time, the reset voltage Vr is applied to the node FDa, and the potential $V_{FD}$ of the impurity region 60a decreases to Vr. The reset voltage Vr is higher than a substrate potential Vsub, that is, Vr>Vsub. When the substrate potential Vsub is 0 V, the reset voltage Vr is a positive voltage close to 0 V.

Next, the reset signal Φrst is turned low at a time T3 to turn off the reset transistor 76. As described with reference to FIG. 2, the reset transistor 76 includes the impurity region 60a as the drain region or the source region. When the reset transistor 76 turns off, therefore, the potential $V_{FD}$ of the impurity region 60a can further decrease from Vr due to electric coupling caused by parasitic capacitance of the reset transistor 76. As described above, if the potential $V_{FD}$ falls below the substrate potential Vsub at this time, positive holes undesirably enter the impurity region 60a.

At the time T3, however, not only the reset signal Φrst is turned low but also the voltage Vc applied to the control line 81 from the voltage supply circuit 128 is switched to the second voltage $V_B$. Here, the second voltage $V_B$ is higher than the first voltage $V_A$.

By switching the voltage Vc from the first voltage $V_A$ to the second voltage $V_B$, which is higher than the first voltage, the potential of the node FDa increases through the capacitor C1. In this example, the potential $V_{FD}$ of the impurity region 60a immediately after the reset transistor 76 is turned off is V1a, which satisfies Vr>V1a>Vsub. If the reset voltage Vr is 0.5 V, for example, V1a can be about 0.2 V. That is, the potential $V_{FD}$ of the impurity region 60a is kept from falling below the substrate potential Vsub by appropriately selecting the second voltage $V_B$ and switching the output of the voltage supply circuit 128 between the first voltage $V_A$ and the second voltage $V_B$. In this example, a potential difference of 0.2 V is secured between the substrate potential Vsub and the potential $V_{FD}$ of the impurity region 60a. That is, positive holes do not enter the impurity region 60a since the potential $V_{FD}$ does not fall below the substrate potential Vsub. In other words, dark current is suppressed. A specific value of the second voltage $V_B$ may be selected in consideration of the parasitic capacitance between the source and the drain of the reset transistor 76 such that the potential $V_{FD}$ satisfies V1a>Vsub when the reset transistor 76 is off.

After the reset transistor 76 is turned off but before a time T4, at which a next rising edge of the horizontal synchronizing signal HD appears, a second signal corresponding to a voltage level of the charge accumulation node after the discharge of the signal charges is transferred to the vertical signal line 89 through the address transistor 74. The signal holding circuit 123 outputs a difference Δ between the first and second signals to the horizontal scanning circuit 124 as a signal for representing an image. After the second signal is obtained, the address transistor 74 is turned off, and accumulation of signal charges for a next frame starts.

In the above example, in a first period between the times T2 and T3, for which the reset transistor 76 remains turned on, the voltage supply circuit 128 applies the first voltage $V_A$ to the impurity region 60a and, in a second period between the times T3 and T4 after the first period, switches the voltage applied to the impurity region 60a to the second voltage $V_B$. As described with reference to FIG. 4A, by switching the voltage applied to the impurity region 60a from the voltage supply circuit 128 to the second voltage $V_B$, which is higher than the first voltage $V_A$, it becomes possible, when the reset transistor 76 is turned off, to keep the potential $V_{FD}$ of the impurity region 60a from falling below the substrate potential Vsub. As a result, dark current caused by entry of positive holes into the impurity region 60a can be suppressed.

In addition, in the example illustrated in FIG. 3, the voltage Vc applied to the control line 81 is switched between the first voltage $V_A$ and the second voltage $V_B$ to change the potential of the node FDa through the capacitor C1. By providing the capacitor C1 between the impurity region 60a and the voltage supply circuit 128, the potential of the charge accumulation node can be controlled without affecting signal charges accumulated in the charge accumulation node.

As can be seen from FIG. 3, since the capacitor C1 is electrically connected to the node FDa, the capacitor C1 constitutes, as with the impurity region 60a, at least a part of the charge accumulation node that temporarily holds signal charges. In other words, the connection of the capacitor C1 to the node FDa increases the overall capacitance of the charge accumulation node. The capacitance of the capacitor C1 is desirably as low as possible for the following two reasons.

A first reason is that an increase in the overall capacitance of the charge accumulation node results in a decrease in conversion gain. The decrease in conversion gain in turn leads to a decrease in the S/N ratio because an effect of noise in subsequent circuits. In order to avoid a decrease in the S/N ratio, therefore, it is beneficial that the capacitance of the capacitor C1 is as low as possible.

A second reason is that if the capacitor C1 has a relatively high capacitance, noise in the control line 81 tends to affect the node FDa through the capacitor C1. Noise included in the voltage applied to the control line 81 can enter the node FDa due to electrical coupling through the capacitor C1. In a configuration in which a voltage supplied to the control line 81 is applied, through the capacitor C1, to charge accumulation nodes of pixels belonging to the same row, that is, when the switching between the first voltage $V_A$ and the second voltage $V_B$ is performed in units of rows, in particular, noise in the control line 81 can be observed as horizontal line noise on an image. Because horizontal line noise is more likely to be recognized by a viewer of an image than random noise at pixels, it is advantageous to suppress horizontal line noise.

If a capacitance of the capacitor C1 is denoted by $C_1$ and a capacitance of a part of the charge accumulation node other than the capacitor C1 is denoted by $C_{FD}$, the magnitude of variation in voltage applied to the node FDa is represented by a product of variation in the voltage of the control line 81 and $(C_1/(C_1+C_{FD}))$. In order to suppress horizontal line noise, too, the capacitance $C_1$ of the capacitor C1 is desirably as low as possible.

It is advantageous that the capacitance $C_1$ of the capacitor C1 is lower than the capacitance $C_{FD}$ of the part of the charge accumulation node other than the capacitor C1. By setting the capacitance $C_1$ of the capacitor C1 lower than the capacitance $C_{FD}$ of the part of the charge accumulation node other than the capacitor C1, a decrease in the S/N ratio due to the connection of the capacitor C1 to the node FDa can become smaller than a decrease in the S/N ratio at a time when an f-number is increased by one stop. By setting the capacitance $C_1$ of the capacitor C1 lower than half the capacitance $C_{FD}$, for example, a decrease in the S/N ratio due to the connection of the capacitor C1 to the node FDa can be kept as small as half a step of the f-number.

When electrons are used as signal charges instead of positive holes, too, the operation described with reference to FIG. 4A may be applied. When electrons are used as signal charges, however, the potential $V_{FD}$ of the impurity region 60a decreases as signal charges are accumulated in the charge accumulation node, in contrast to when positive holes are used as signal charges. When electrons are used as signal charges, therefore, the reset voltage Vr may be, for example, a higher positive voltage, namely about 3.3 V, in order to secure a sufficient difference between the substrate potential and potential $V_{FD}$ of the impurity region 60a.

Since the reset voltage Vr is a higher positive voltage, an effect of a decrease in the potential $V_{FD}$ of the impurity region 60a due to the electrical coupling caused by the parasitic capacitance of the reset transistor 76 when the reset transistor 76 is turned off is smaller. When electrons are used as signal charges, however, the reset voltage Vr needs to be higher to improve the number of saturated electrons. In order to secure the number of saturated electrons large enough to achieve a required dynamic range, therefore, it is advantageous to use positive holes as signal charges.

The reset transistor 76 may be a p-type transistor, instead. In this case, conductivity types of the components of the semiconductor substrate 60 need to be switched between the n-type and the p-type. When the reset transistor 76 is a p-type transistor, however, the second voltage $V_B$ is set lower than the first voltage $V_A$ as described hereinafter.

Figure 4B:
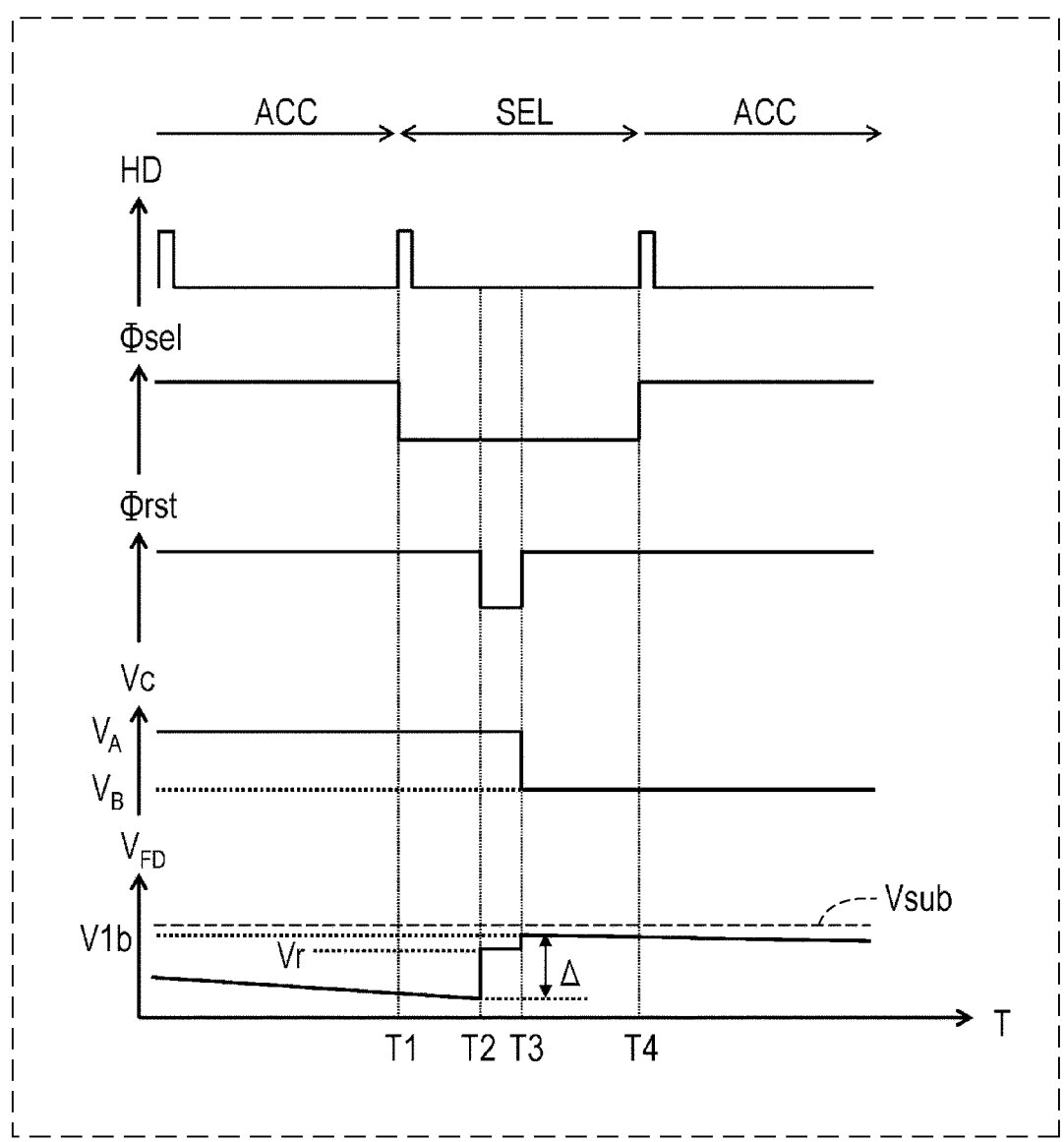
FIG. 4B is a timing chart illustrating an example of an operation at a time when a reset transistor of the pixel is a p-type transistor.

FIG. 4B is a timing chart illustrating an example of an operation at a time when the reset transistor 76 of the pixel 10A is a p-type transistor. When the reset transistor 76 is a p-type transistor, the substrate potential Vsub is higher than when the reset transistor 76 is an n-type transistor. The substrate potential Vsub may be, for example, about 3.3 V.

When the reset transistor 76 is a p-type transistor, an effect of a change in the potential $V_{FD}$ of the impurity region 60a due to the electrical coupling caused by the parasitic capacitance of the reset transistor 76 is smaller if positive holes are used as signal charges. A reason of this phenomenon is the same as when the reset transistor 76 is an n-type transistor and electrons are used as signal charges. In order to secure a sufficient number of saturated electrons, however, a sufficient potential difference needs to be secured between the substrate potential Vsub and the potential $V_{FD}$ of the impurity region 60a. When signal charges are electrons, on the other hand, the reset voltage Vr may be around 3.3 V, which is the substrate potential Vsub. When the reset transistor 76 is a p-type transistor, therefore, it becomes easier to secure a sufficient number of electrons for a required dynamic range while avoiding complication of circuits if electrons are used as signal charges.

An example of an operation when electrons are used as signal charges, therefore, will be described hereinafter. FIG. 4B illustrates an example of an operation at a time when the reset transistor 76 is a p-type transistor and electrons are used as signal charges. When the reset transistor 76 is a p-type transistor and electrons are used as signal charges, the signal detection transistor 72 and the address transistor 74 are also typically formed on the semiconductor substrate 60 as p-type transistors.

In the example illustrated in FIG. 4B, the potential $V_{FD}$ of the impurity region 60a gradually decreases in a period before the time T1 due to accumulation of signal charges through exposure. After the signal charges are accumulated, the address signal Φsel is turned low at the time T1 to turn on the address transistor 74 and transfer a first signal to the vertical signal line 89.

Next, the reset signal Φrst is turned low at the time T2 to turn on the reset transistor 76. As illustrated in FIG. 4B, the potential $V_{FD}$ of the impurity region 60a increases to Vr when the reset transistor 76 is turned on. A voltage close to but lower than the substrate potential Vsub, namely 2.8 V, for example, is use as the reset voltage Vr at this time.

Next, the reset signal Φrst is turned high at the time T3 to turn off the reset transistor 76. When the reset transistor 76 turns off, the potential $V_{FD}$ of the impurity region 60a can further increase from Vr due to the electrical coupling caused by the parasitic capacitance of the reset transistor 76. If the potential $V_{FD}$ exceeds the substrate potential Vsub at this time, a forward bias is applied to the p-n junction between the impurity region 60a and an adjacent region, and electrons undesirably enter the impurity region 60a from an n-type silicon substrate as a base substrate. In other words, dark current is caused.

At the time T3, however, not only the reset signal Φrst is turned high but also the voltage Vc applied to the control line 81 from the voltage supply circuit 128 is switched to the second voltage V$_B$, which is lower than the first voltage V$_A$. By switching the voltage Vc from the first voltage V$_A$ to the second voltage V$_B$, the potential of the node FDa between the photoelectric conversion unit 50A and the signal detection transistor 72 decreases through the capacitor C1 and, as illustrated in FIG. 4B, the potential V$_{FD}$ of the impurity region 60a does not exceed the substrate potential Vsub. In this example, the potential V$_{FD}$ of the impurity region 60a immediately after the reset transistor 76 is turned off is V1b, which satisfies Vsub>V1b>Vr. V1b may be about 3.1 V.

After the reset transistor 76 is turned off, a second signal corresponding to the voltage level of the charge accumulation node after signal charges are discharged is transferred to the vertical signal line 89, and an absolute value of a difference Δ between the first and second signals is obtained as an image signal. After the second signal is obtained, the address transistor 74 is turned off, and accumulation of signal charges for a next frame starts.

Second Example of Operation of Imaging Device 100

The operation of the imaging device 100 according to embodiments of the present disclosure is not limited to the example described with reference to FIGS. 4A and 4B. As described hereinafter, different voltages may be supplied to the control line 81 in each frame, for example, between an exposure period, in which signal charges are accumulated in the charge accumulation node, and a reset period included in a non-exposure period, which is a period other than the exposure period.

Figure 4C:
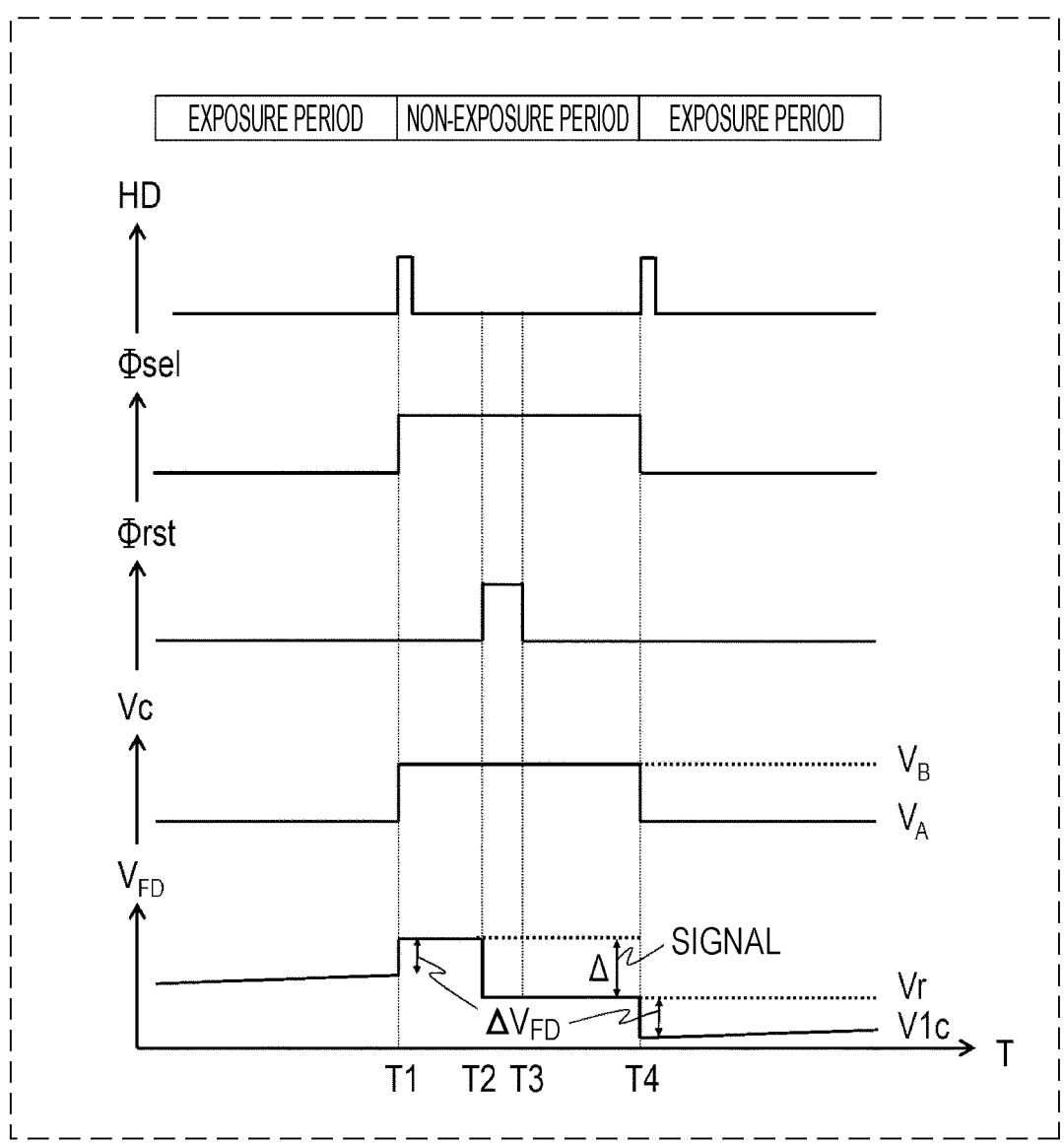
FIG. 4C is a timing chart illustrating another example of the operation of pixels.

FIG. 4C is a timing chart illustrating another example of the operation of pixels 10A, 10Ap, and 10Aq. In the example of the operation illustrated in FIG. 4C, the exposure period for accumulating signal charges in the charge accumulation node and the non-exposure period alternate as in the example illustrated in FIGS. 4A and 4B. The non-exposure period includes the reset period, in which the potential of the charge accumulation node is reset to a certain value.

Here, the pixel 10A illustrated in FIG. 3 is taken as an example. First, the address signal Φsel is turned high at the time T1. At the same time, the voltage applied to the control line 81 is switched from the first voltage V$_A$ to the higher second voltage V$_B$.

By switching the voltage applied to the control line 81 from the first voltage V$_A$ to the second voltage V$_B$, the potential of the node FDa temporarily increases due to capacitive coupling through the capacitor C1. A change ΔV$_{FD}$ in the potential of the node FDa at this time is represented by the following expression (1).

$$\Delta V_{FD} = (V_B - V_A)(C_1/(C_1 + C_{FD})) \quad (1)$$

The potential of the node FDa at this time is transferred to the vertical signal line 89 through the signal detection transistor 72 and the address transistor 74 as a first signal indicating a voltage level according to signal charges accumulated in the charge accumulation node.

At the time T2, the reset signal Φrst is turned high. As a result, the signal charges are discharged from the charge accumulation node through the reset transistor 76, and the potential of the charge accumulation node is reset to the reset voltage Vr.

At the time T3, the reset signal Φrst is turned low to turn off the reset transistor 76. A second signal corresponding to the voltage level of the charge accumulation node after the signal charges are discharged is transferred to the vertical signal line 89 through the address transistor 74 between the time T3 and the time T4, at which a next rising edge of the horizontal synchronizing signal HD appears.

In this example, a difference Δ between the first signal read between the time T1 and the time T2 and the second signal read between the time T3 and the time T4 is a true pixel signal representing an image.

At the time T4, the voltage applied to the control line 81 is reset to the first voltage V$_A$. The potential of the node FDa decreases from Vr to V1c due to the capacitive coupling through the capacitor C1. A change (Vr−V1c) in the potential of the node FDa is equal to the above-mentioned ΔV$_{FD}$.

If the capacitances C$_1$ and C$_{FD}$ are known, the change ΔV$_{FD}$ can be controlled by determining the first voltage V$_A$ and the second voltage V$_B$ on the basis of expression (1). The desired change ΔV$_{FD}$ can be achieved using the following procedure. First, when a product is designed, a capacitance ratio of a capacitor C1 of a target charge accumulation node to a part of the charge accumulation node other than the capacitor C1 is determined from the overall capacitance of the charge accumulation node. The amplitude of the voltage applied to the control line 81 during actual operation, that is, specific values of the first voltage V$_A$ and the second voltage V$_B$, is determined on the basis of expression (1).

It is desirable that either the first voltage V$_A$ or the second voltage V$_B$ be ground (0 V), because ground generally has a low impedance and power supply noise from the voltage supply circuit 128 connected to the control line 81 can be kept from entering the charge accumulation node. When the second voltage V$_B$ is ground, for example, the first voltage V$_A$ is a negative voltage.

In this example, the voltage supply circuit 128 supplies the first voltage V$_A$ to the control line 81 in the exposure period, in which signal charges are accumulated in the charge accumulation node including the impurity region 60a. When a row is selected, on the other hand, the voltage supply circuit 128 supplies the second voltage V$_B$, which is different from the first voltage V$_A$. The second voltage V$_B$ is the voltage supplied to the control line 81 during the reset period, which is a period included in the non-exposure period in which the reset transistor 76 is turned on. Different voltages may thus be supplied to the control line 81 between at least a reset period after an exposure period and another period. In this case, for example, the potential of the charge accumulation node can be temporarily decreased from the reset voltage Vr. By decreasing the potential of the charge accumulation node through the capacitor C1, a potential difference between the impurity region 60a and the second p-type semiconductor layer 62p, which is located adjacent to the impurity region 60a and connected to ground, for example, is reduced. As a result, a depletion layer formed by the p-n junction between the impurity region 60a and the second p-type semiconductor layer 62p is reduced in size, and dark current is suppressed. That is, dark current is suppressed by decreasing the potential of the charge accumulation node in the exposure period.

In the operation illustrated in FIG. 4C, the potential of the charge accumulation node increases by a difference between the second voltage V$_B$ and the first voltage V$_A$ when a row is selected. By adjusting the difference, therefore, source-drain voltages of the signal detection transistor 72 and transistors in subsequent circuits can be set within a voltage range within which these transistors are operable. The signal detection transistor 72 and the subsequent circuits can thus read a pixel signal or a reference signal normally.

Modification of First Embodiment

Figure 5:
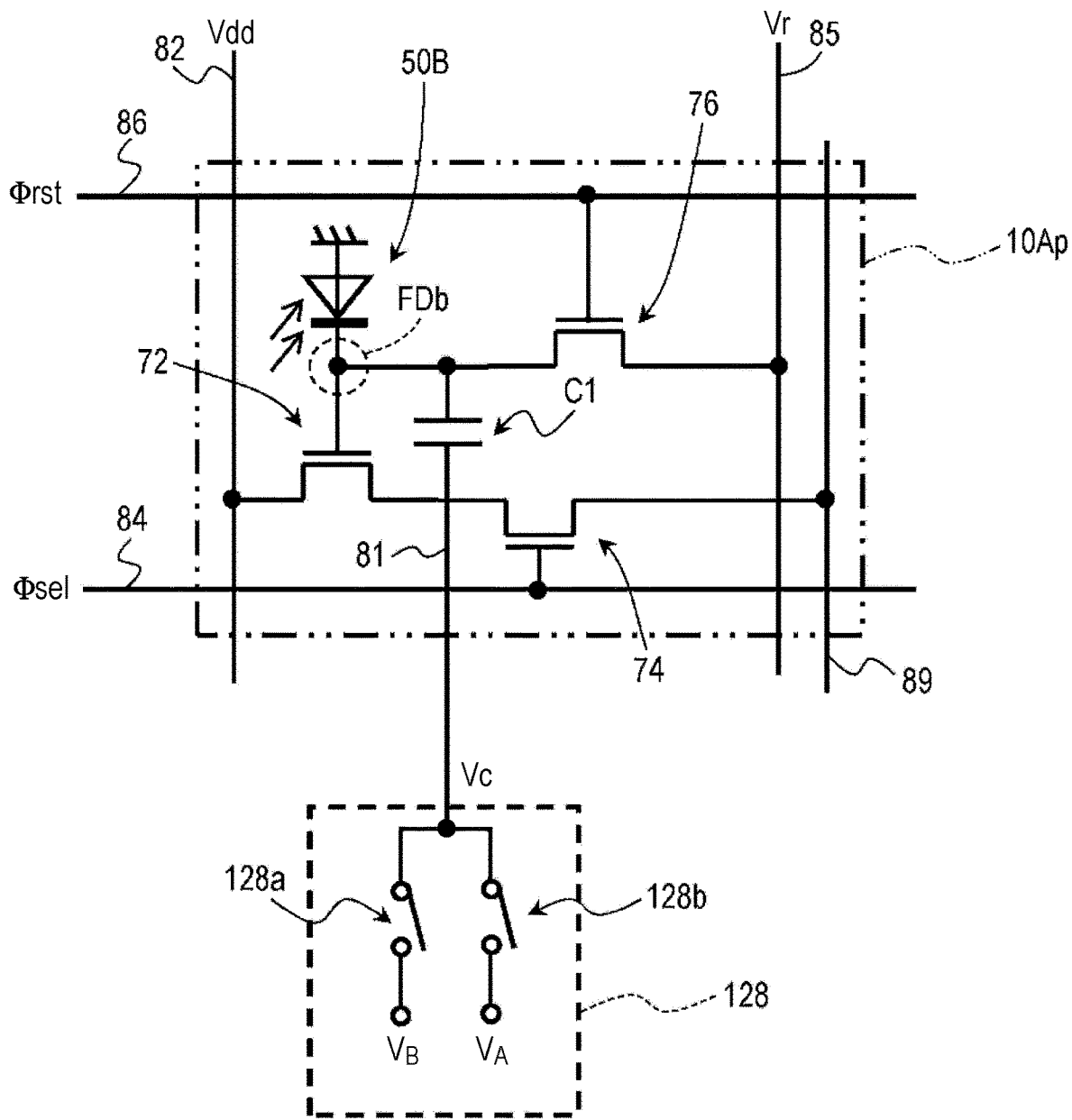
FIG. 5 is a diagram schematically illustrating another example of the circuit configuration of the pixel.

The imaging device 100 in the present disclosure is not limited to a multilayer imaging device. FIG. 5 schematically illustrates another example of the circuit configuration of the pixel 10. Unlike the pixel 10A described with reference to FIG. 3, a pixel 10Ap illustrated in FIG. 5 includes a photoelectric conversion unit 50B instead of the photoelectric conversion unit 50A. The photoelectric conversion unit 50B is, for example, an embedded photodiode formed in the semiconductor substrate 60.

As illustrated in FIG. 5, the photoelectric conversion unit 50B is connected to the gate of the signal detection transistor 72 in this example. In the configuration illustrated in FIG. 5, a node FDb between the photoelectric conversion unit 50B and the signal detection transistor 72 corresponds to a charge accumulation node. In other words, a p-n junction in the embedded photodiode, which is the photoelectric conversion unit 50B, the impurity region 60a, and the gate electrode 72e function as a charge accumulation node that temporarily holds charges generated by the photoelectric conversion unit 50B. The impurity region 60a may be a part of the p-n junction in the embedded photodiode.

The operation described with reference to FIGS. 4A and 4B may also be applied to the imaging device 100 including the pixel 10Ap. The potential of the node FDb can be increased through the capacitor C1, for example, by switching the voltage Vc applied to the control line 81 from the voltage supply circuit 128 from the first voltage $V_A$ to the second voltage $V_B$, which is higher than the first voltage $V_A$, when the reset signal Φrst is turned low. By appropriately selecting the second voltage $V_B$, the potential $V_{FD}$ of the impurity region 60a is kept from falling below the substrate potential Vsub, and dark current is suppressed. When a photoelectric conversion unit is an embedded photodiode, it is advantageous to use p-type transistors as the reset transistor 76 and the like and accumulate electrons as signal charges, because a wider dynamic range is achieved.

Figure 6:
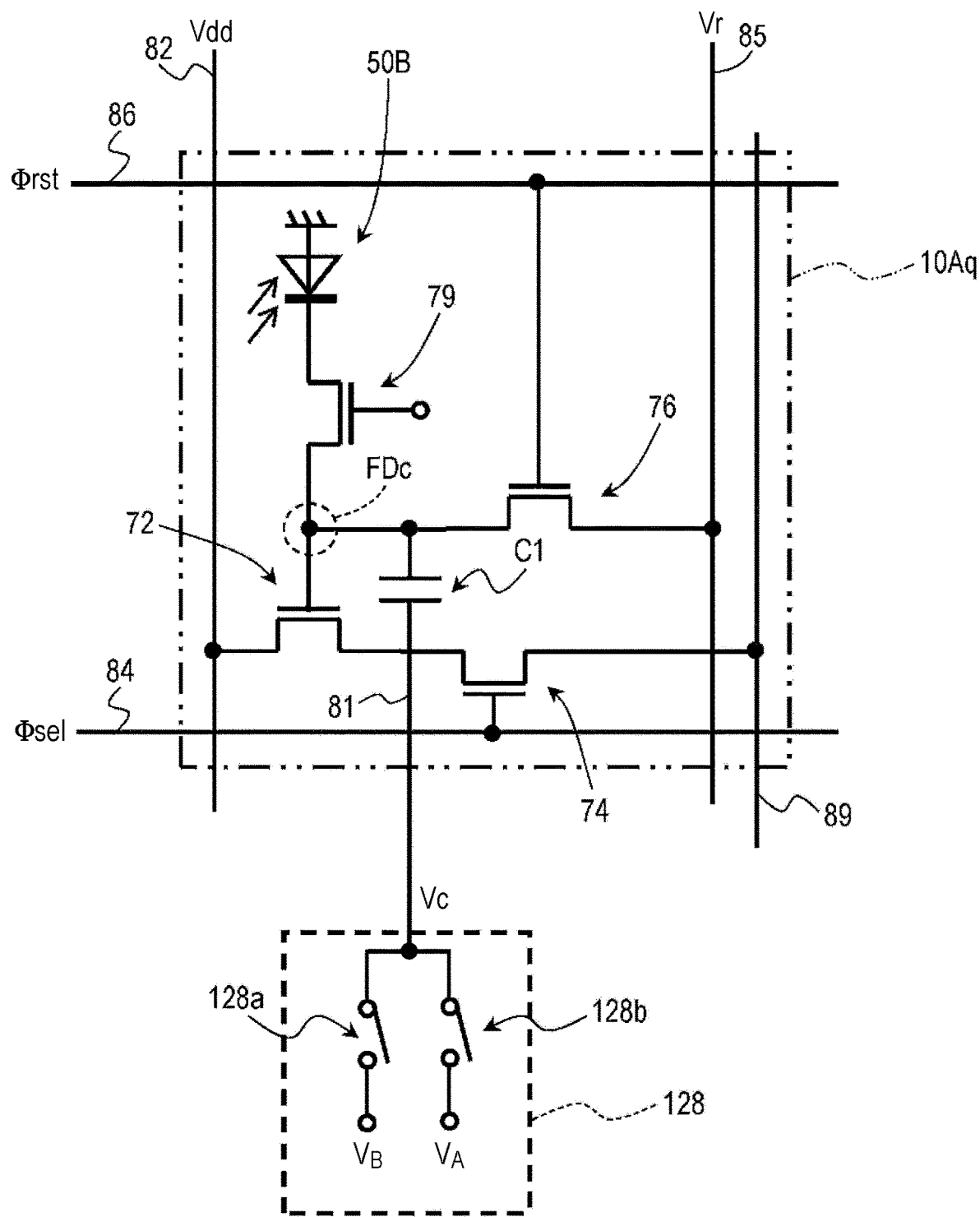
FIG. 6 is a diagram schematically illustrating another example of the circuit configuration of the pixel.

FIG. 6 schematically illustrates another example of the circuit configuration of the pixel 10. Unlike the circuit configuration of the pixel 10Ap described with reference to FIG. 5, a pixel 10Aq illustrated in FIG. 6 also includes a transfer transistor 79 connected between the gate of the signal detection transistor 72 and the photoelectric conversion unit 50B. The transfer transistor 79 transfers signal charges obtained by the photoelectric conversion unit 50B to a node FDc between the gate of the signal detection transistor 72 and the transfer transistor 79 at certain timings. The transfer transistor 79 is, for example, an n-channel MOS transistor. The transfer transistor 79 may share the impurity region 60a with the reset transistor 76 as either a source region or a drain region.

With the circuit configuration illustrated in FIG. 6, as with that of the pixel 10Ap illustrated in FIG. 5, the potential of the node FDc, which is a floating node, is increased through the capacitor C1 by switching the voltage Vc from the first voltage $V_A$ to the second voltage $V_B$, and the potential $V_{FD}$ of the impurity region 60a is kept from falling below the substrate potential Vsub. The voltage Vc is switched from the first voltage $V_A$ to the second voltage $V_B$, for example, when the reset transistor 76 is turned off after signal charges transferred to the node FDc are discharged by turning on the reset transistor 76.

Figure 7A:
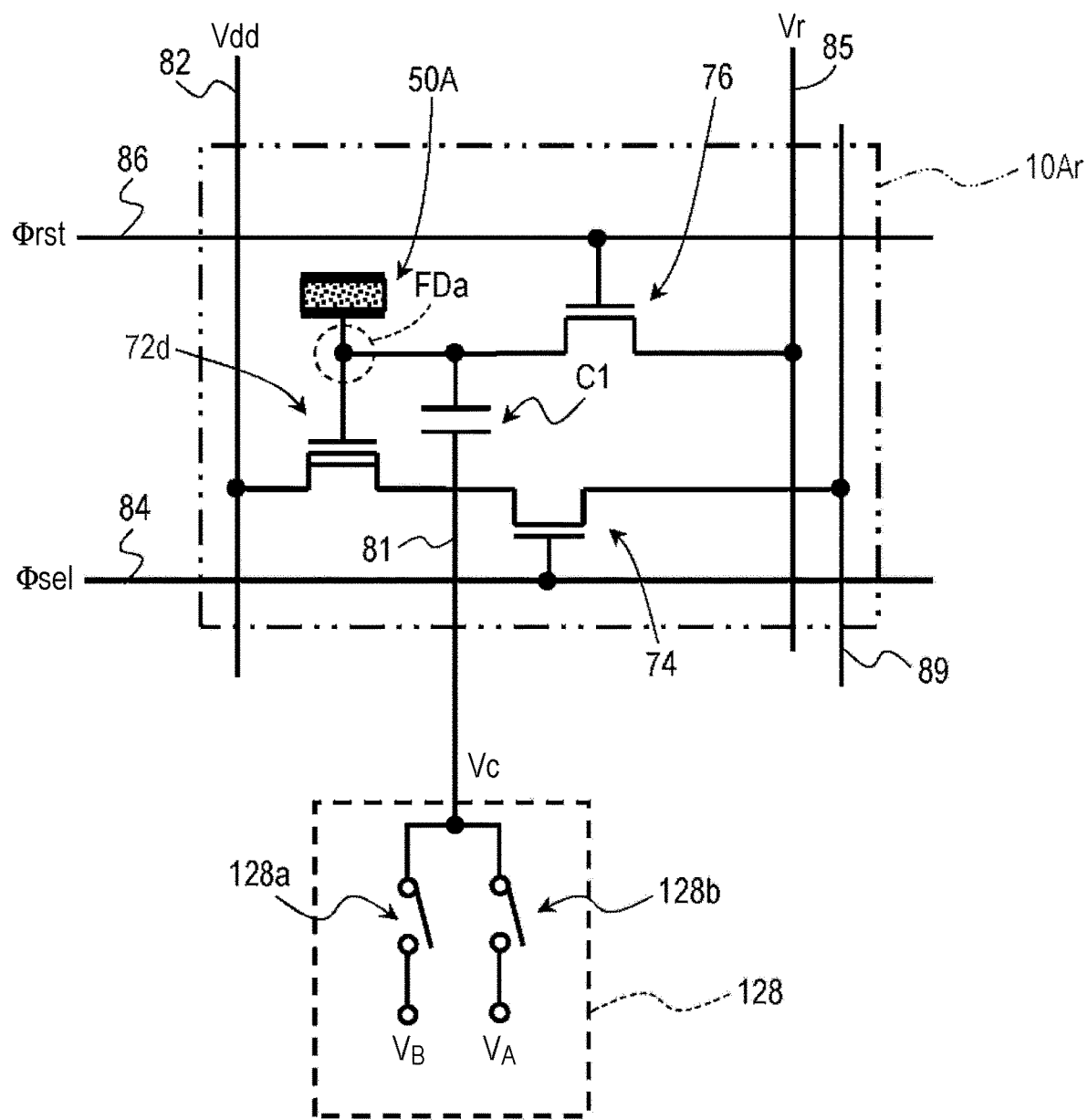
FIG. 7A is a diagram schematically illustrating another example of the circuit configuration of the pixel.
Figure 7B:
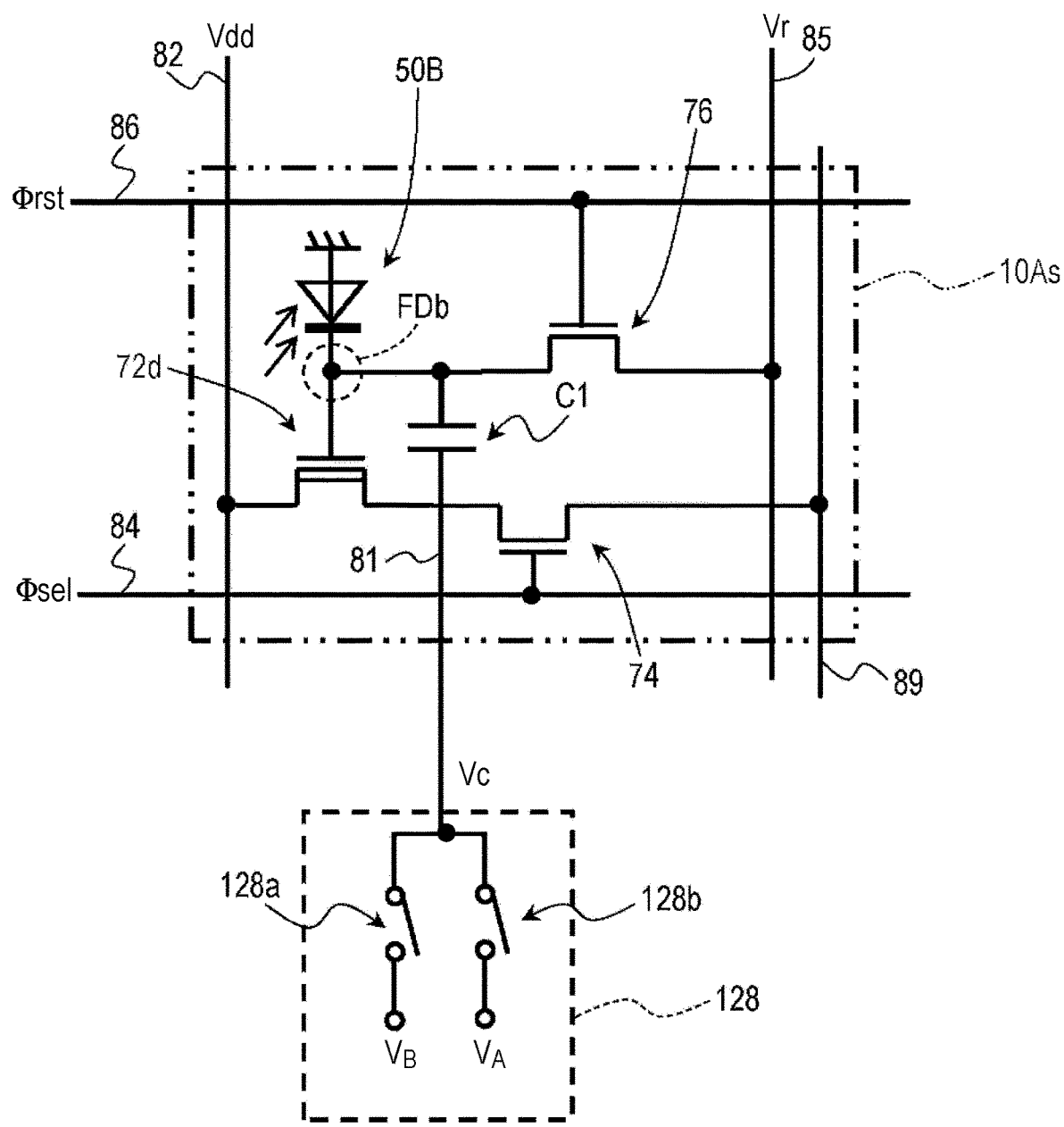
FIG. 7B is a diagram schematically illustrating another example of the circuit configuration of the pixel.

FIGS. 7A and 7B schematically illustrate other examples of the circuit configuration of the pixel 10.

Unlike the pixel 10A described with reference to FIG. 3, a pixel 10Ar illustrated in FIG. 7A includes a depletion-mode signal detection transistor 72 instead of the signal detection transistor 72. By using a depletion-mode transistor as the signal detection transistor 72d, a high output is obtained from the signal detection transistor 72d even if the potential of the node FDa is low. A voltage range necessary to operate a current source including a load circuit connected to the vertical signal line 89, therefore, can be secured more easily.

In the circuit configuration of a pixel 10As illustrated in FIG. 7B, the photoelectric conversion unit 50A of the pixel 10Ar illustrated in FIG. 7A is replaced by the photoelectric conversion unit 50B. As described above, the photoelectric conversion unit 50B is, for example, an embedded photodiode formed in the semiconductor substrate 60. Even when a photodiode is used, too, the signal detection transistor 72d may be a depletion-mode transistor.

Figure 8:
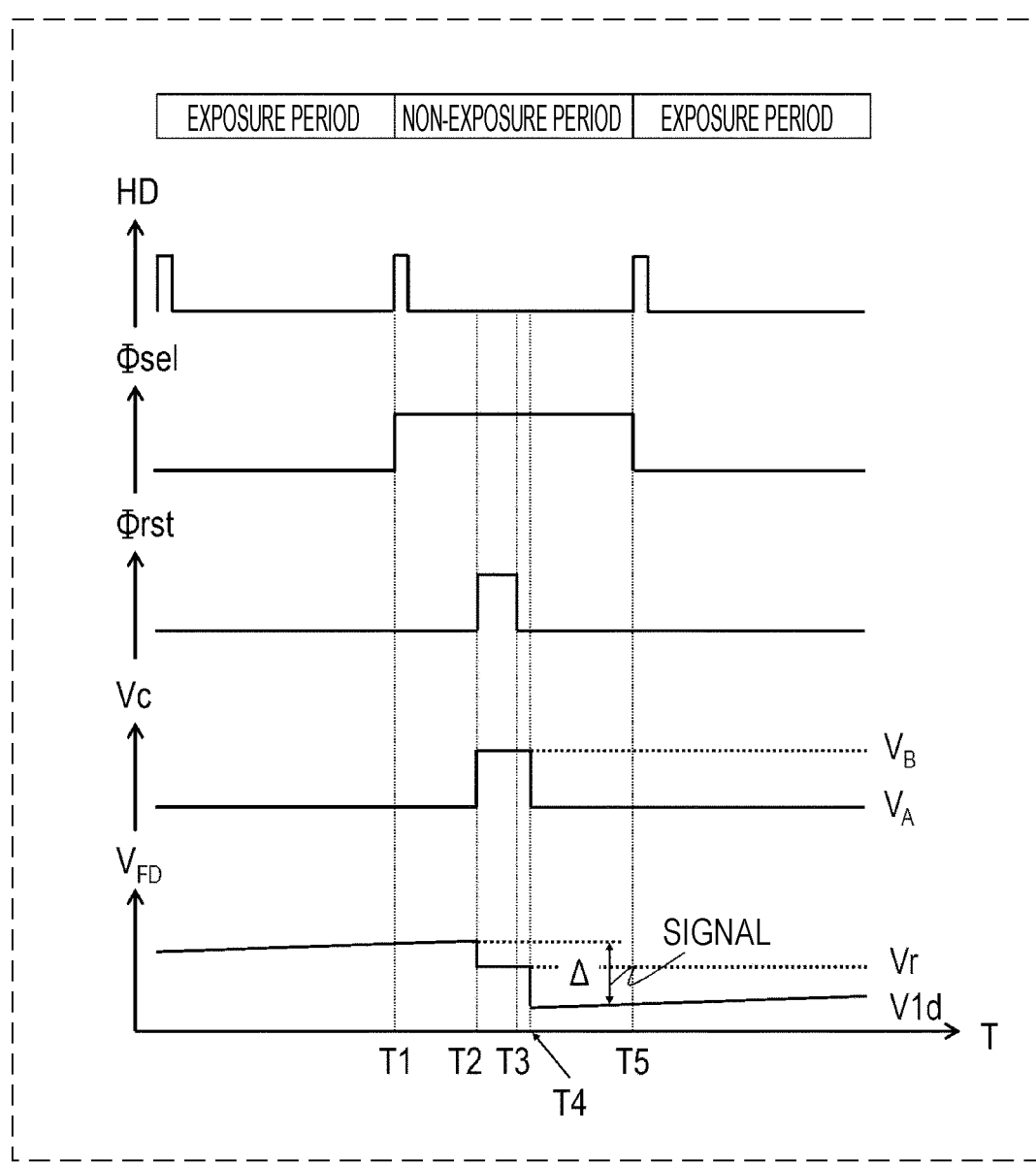
FIG. 8 is a timing chart illustrating an example of the operation of the pixel illustrated in FIG. 7A or the pixel illustrated in FIG. 7B.

FIG. 8 is a timing chart illustrating an example of the operation of the pixel 10Ar illustrated in FIG. 7A or the pixel 10As illustrated in FIG. 7B.

A waveform of the voltage Vc in the non-exposure period in this example is different from one in the operation sequence illustrated in FIG. 4C. As illustrated in FIG. 8, a period for which the voltage Vc applied to the control line 81 from the voltage supply circuit 128 remains at the higher second voltage $V_B$ is shorter in the non-exposure period. In the operation illustrated in FIG. 8, the voltage Vc is switched from the first voltage $V_A$ to the higher second voltage $V_B$ at the time T2, at which a rising edge of the reset signal Φrst appears, and reset to the first voltage $V_A$ after the reset signal Φrst is turned low at the time T3. By switching the voltage Vc applied to the control line 81 from the voltage supply circuit 128 to the first voltage $V_A$ after the reset transistor 76 is turned off, the potential of the charge accumulation node reflects the entirety of a change in the voltage Vc.

In the example illustrated in FIG. 8, the potential of the charge accumulation node decreases from the reset voltage Vr by $\Delta V_{FD}$ represented by expression (1) as a result of the switching of the voltage Vc at the time T4. As a result, the potential of the charge accumulation node decreases to V1d, which is lower than Vr. A true pixel signal representing an image of a subject is a difference between a first signal corresponding to the potential of the charge accumulation node at the time T1 and a second signal corresponding to the potential of the charge accumulation node at the time T4.

The first signal is transferred to the vertical signal line 89 between the time T1 and the time T2, and the second signal is transferred to the vertical signal line 89 between the time T4 and a time T5. That is, in this example, a pixel signal and a reference signal are read while the first voltage $V_A$ is applied to the control line 81. In this example, too, noise in a voltage output from the voltage supply circuit 128 is kept from entering the node FDa or FDb by setting the first voltage $V_A$ to 0 V.

Figure 9A:
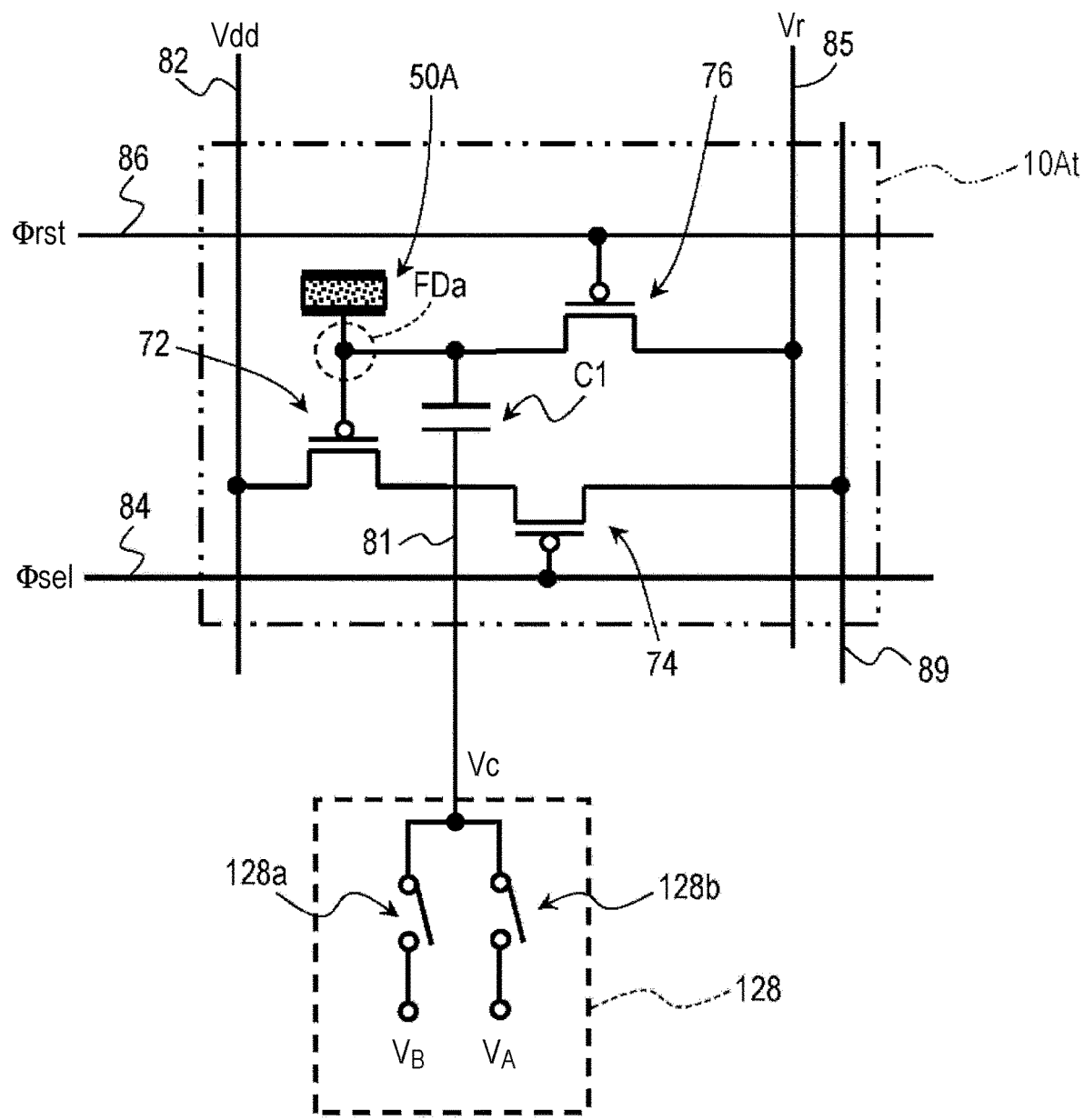
FIG. 9A is a diagram schematically illustrating another example of the circuit configuration of the pixel.
Figure 9B:
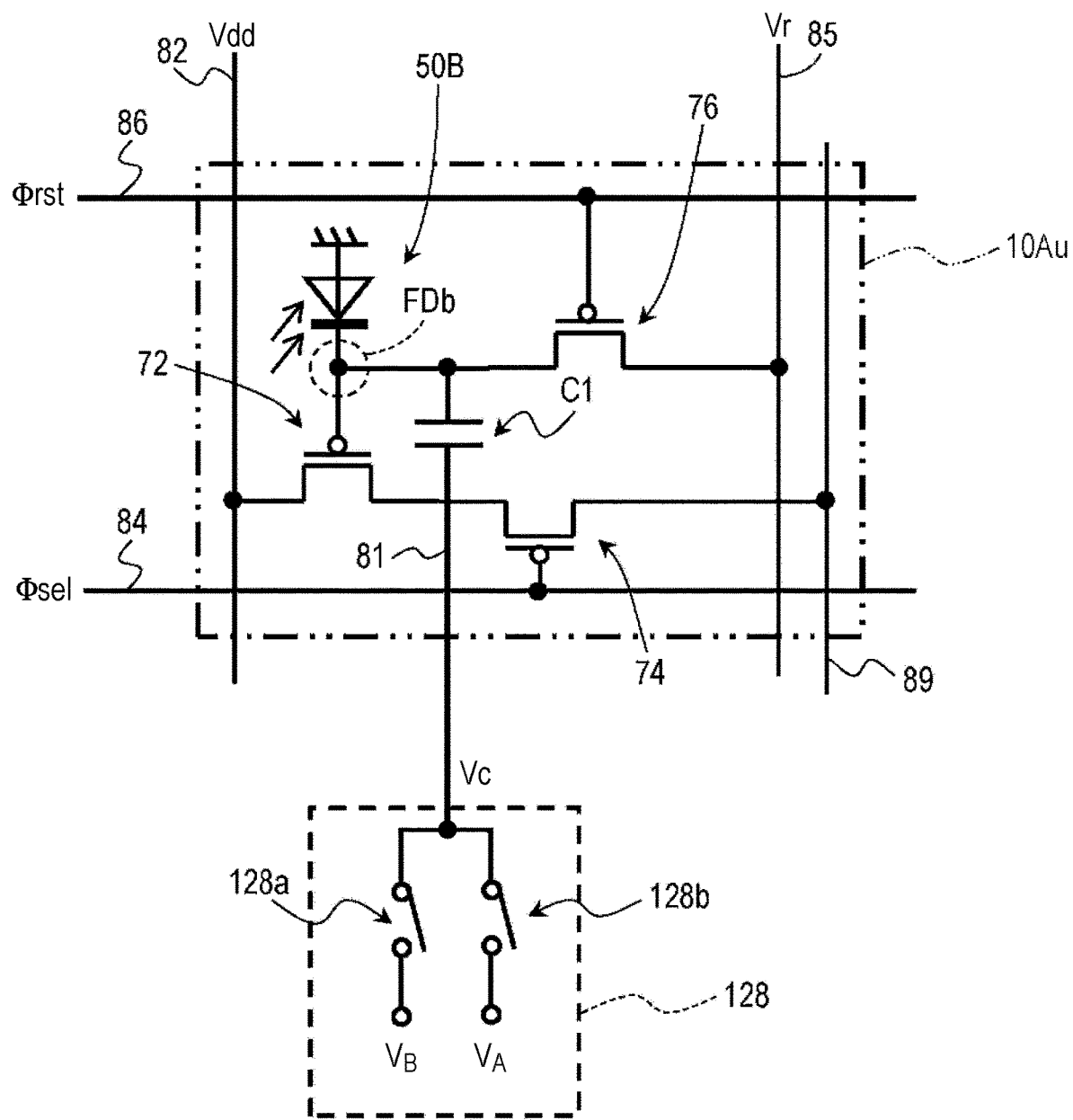
FIG. 9B is a diagram schematically illustrating another example of the circuit configuration of the pixel.

FIGS. 9A and 9B schematically illustrate other examples of the circuit configuration of the pixel 10. In the circuit configuration of a pixel 10At illustrated in FIG. 9A, the signal detection transistor 72, the address transistor 74, and the reset transistor 76 in the circuit configuration illustrated in FIG. 3 are replaced by p-type transistors. In the circuit configuration of a pixel 10Au illustrated in FIG. 9B, the signal detection transistor 72, the address transistor 74, and the reset transistor 76 in the circuit configuration illustrated in FIG. 5 are replaced by p-type transistors.

In the configurations illustrated in FIGS. 9A and 9B, electrons are typically used as signal charges. As described above, when the reset transistor 76 is a p-type transistor, it is easier to secure a sufficient number of saturated electrons for a required dynamic range while avoiding complication of circuits if electrons are used as signal charges.

Figure 10:
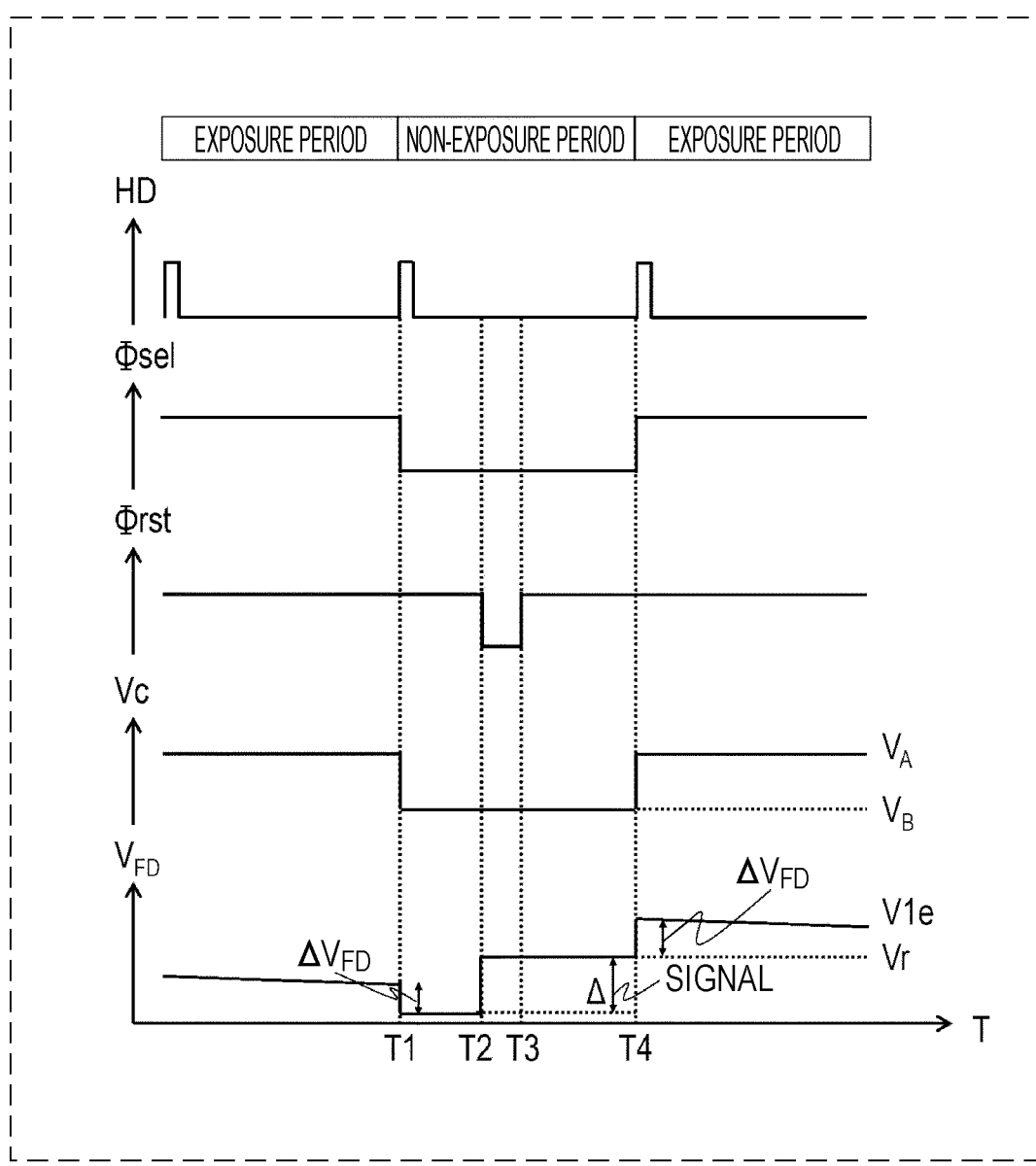
FIG. 10 is a timing chart illustrating an example of the operation of the pixel illustrated in FIG. 9A or the pixel illustrated in FIG. 9B.

FIG. 10 is a timing chart illustrating an example of the operation of the pixel 10At illustrated in FIG. 9A or the pixel 10Au illustrated in FIG. 9B. In the example illustrated in FIG. 10, the address signal Φsel is turned low at the time T1 to switch the voltage Vc applied to the control line 81 from a first voltage $V_A$ to a lower second voltage $V_B$. By turning the address signal Φsel low, the first signal is transferred from pixels in a selected row to the vertical signal line 89 through the signal detection transistor 72 and the address transistor 74. Here, the address signal Φsel remains low in the non-exposure period.

As can be seen from a part of the timing chart corresponding to the voltage $V_{FD}$, the potential of the charge accumulation node decreases due to capacitive coupling through the capacitor C1 by switching the voltage Vc applied to the control line 81 from the first voltage $V_A$ to the second voltage $V_B$. A change $\Delta V_{FD}$ in the potential at this time is represented by the above-mentioned expression (1) on the basis of a capacitive ratio of the capacitor C1 of the charge accumulation node to the part of the charge accumulation node other than the capacitor C1. A signal corresponding to the voltage $V_{FD}$ is transferred to the vertical signal line 89 as the first signal between the time T1 and the time T2.

In this example, the reset signal Φrst is turned low at the time T2 to perform resetting. That is, when the reset signal Φrst turns low, the reset transistor 76 is turned on, signal charges accumulated in the node FDa or FDb are discharged through the reset transistor 76, and the potential of the charge accumulation node is reset to the voltage Vr.

Next, the reset signal Φrst is turned high at the time T3 to turn off the reset transistor 76. Here, the second signal corresponding to the reset voltage Vr is transferred to the vertical signal line 89 between the time T3 and the time T4. As schematically illustrated in FIG. 10, a difference between the first signal read between the time T1 and the time T2 and the second signal read between the time T3 and the time T4 is output as a true pixel signal.

At the time T4, the voltage Vc applied to the control line 81 is reset to the first voltage $V_A$ from the second voltage $V_B$. As a result, the potential of the charge accumulation node increases from Vr to V1e due to the capacitive coupling through the capacitor C1. A change |Vr−V1e| at this time is equal to $\Delta V_{FD}$ at a time when the voltage Vc applied to the control line 81 has been decreased from the first voltage $V_A$ to the second voltage $V_B$.

When electrons are used as signal charges as in this example, it is advantageous, as described above, to use an n-type silicon substrate as the base substrate 60S and employ p-type impurity regions 60a to 60e. That is, it is desirable that the signal detection transistor 72, the address transistor 74, and the reset transistor 76 be p-type transistors.

When the base substrate 60S is a p-type silicon substrate and the reset transistor 76 is an n-channel MOS transistor, the substrate potential Vsub may be, for example, 0 V. It is assumed here that the reset transistor 76 is a p-channel MOS transistor and the substrate potential Vsub is 0 V. As schematically illustrated in FIG. 10, the voltage $V_{FD}$ decreases as electrons are accumulated in the charge accumulation node as signal charges. In order for the voltage applied to the p-n junction between the impurity region 60a and the adjacent region not to become a forward bias, therefore, the potential of the charge accumulation node needs to be reset to a value higher than the substrate potential Vsub before signal charges are accumulated.

As described above, when signal charges are electrons, the reset voltage Vr may be, for example, 3.3 V. In this case, as signal charges are accumulated, the potential of the charge accumulation node decreases from 3.3 V at a beginning of exposure, and a potential difference from the substrate potential Vsub decreases. A depletion layer, therefore, is reduced in size, and dark current is suppressed.

When positive holes are used as signal charges, it is advantageous to use n-channel MOS transistors in order to suppress dark current. This is because of the following reason.

If the reset transistor 76 is a p-type transistor, for example, the substrate potential Vsub may be about 3.3 V. If the base substrate 60S is an n-type silicon substrate and p-type impurity regions 60a to 60e are used, it is difficult to increase the potential $V_{FD}$ of the impurity region 60a higher than the substrate potential Vsub in order not to make the applied voltage a forward bias. In addition, as positive holes are accumulated in the charge accumulation node, the potential $V_{FD}$ of the impurity region 60a increases. The potential of the charge accumulation node, therefore, is reset to a value smaller than the substrate potential Vsub, namely 0 V, for example, before signal charges are accumulated. In this case, a difference between the potential of the charge accumulation node and the substrate potential Vsub at a beginning of exposure undesirably becomes larger than when the reset transistor 76 is an n-channel MOS transistor.

Figure 11A:
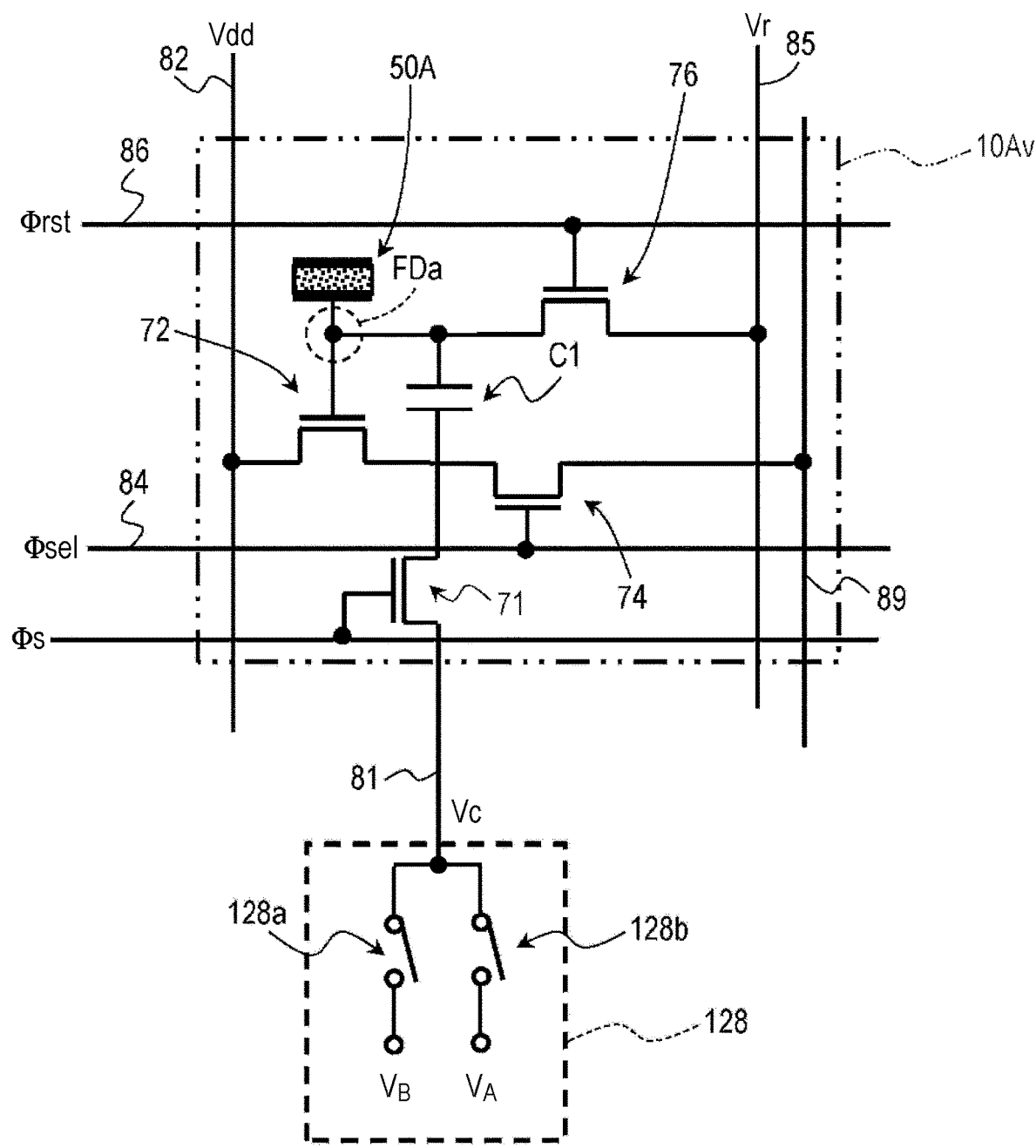
FIG. 11A is a diagram schematically illustrating another example of the circuit configuration of the pixel.
Figure 11B:
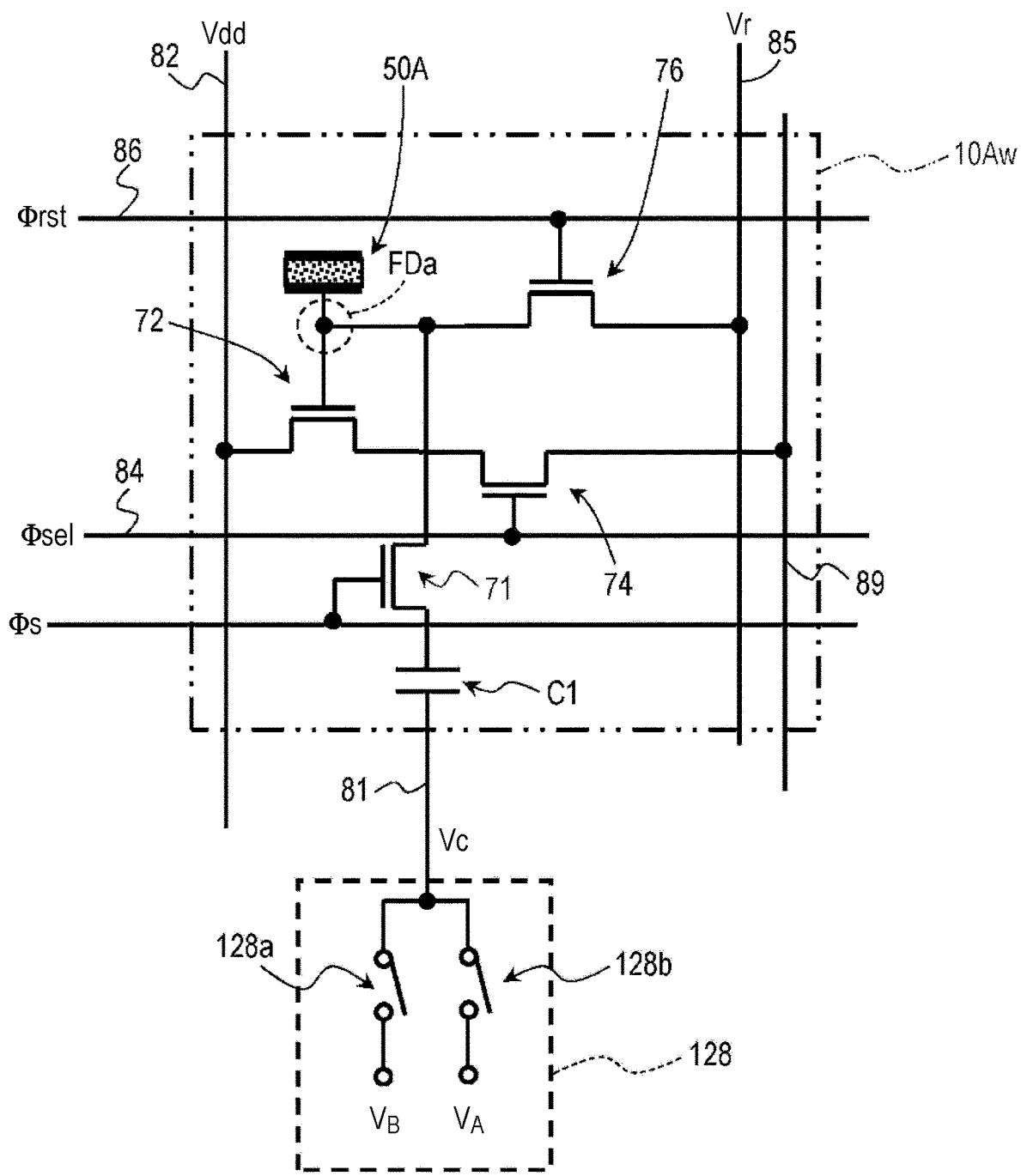
FIG. 11B is a diagram schematically illustrating another example of the circuit configuration of the pixel.

FIGS. 11A and 11B schematically illustrate other examples of the circuit configuration of the pixel 10.

Unlike the pixel 10A illustrated in FIG. 3, a pixel 10Av illustrated in FIG. 11A also includes a transistor 71 connected between the capacitor C1 and the control line 81. A difference between the pixel 10Av illustrated in FIG. 11A and a pixel 10Aw illustrated in FIG. 11B is that, in the pixel 10Aw, the transistor 71 is connected between the node FDa and the capacitor C1.

The transistor 71 in the pixel 10Av illustrated in FIG. 11A has a function as a switching device that connects the capacitor C1 and the voltage supply circuit 128 to each other or disconnects the capacitor C1 and the voltage supply circuit 128 from each other. The transistor 71 in the pixel 10Aw illustrated in FIG. 11B has a function as a switching device that connects the node FDa and the capacitor C1 to each other or disconnects the node FDa and the capacitor C1 from each other. With the circuit configuration illustrated in FIG. 11A, the overall capacitance of the charge accumulation node can be reduced by controlling the potential of a control signal Φs applied to a gate of the transistor 71 and turning off the transistor 71. With the circuit configuration illustrated in FIG. 11B, the capacitor C1 can be electrically disconnected from the node FDa.

As described in the above examples, the potential of the charge accumulation node can be controlled through the capacitor C1 by connecting the capacitor C1 to the node FDa or FDb and switching the voltage supplied to the control line 81. Because the overall capacitance of the charge accumulation node increases as a result of the connection of the capacitor C1, conversion gain when signal charges are converted into voltage can decrease.

As illustrated in FIGS. 11A and 11B, the transistor 71 may be provided between the capacitor C1 and the voltage supply circuit 128 or between the node FDa or FDb and the capacitor C1. In this case, the overall capacitance of the charge accumulation node can be changed by turning on and off the transistor 71. In other words, by turning on and off the transistor 71, an FD potential control mode, in which the potential of the charge accumulation node is controlled through the capacitor C1, and a high gain mode, in which signal charges are efficiently converted into voltage signals, can be used. In the FD potential control mode, the voltage supply circuit 128 is electrically connected to the charge accumulation node through the capacitor C1 by turning on the transistor 71, and in the high gain mode, the overall capacitance of the charge accumulation node is decreased by turning off the transistor 71.

Mode switching may be automatically performed on the basis of an exposure period or an operation temperature with which an effect upon dark current becomes significant, or may be performed on the basis of an instruction from a user. The FD potential control mode may be selected, for example, for imaging with a long exposure period of longer than 1 second or a temperature of higher than 80° C. An operation sequence in the FD potential control mode may be the same as that described with reference to FIG. 4A, 4B, 4C, 8, or 10, and description thereof is omitted.

Figure 11C:
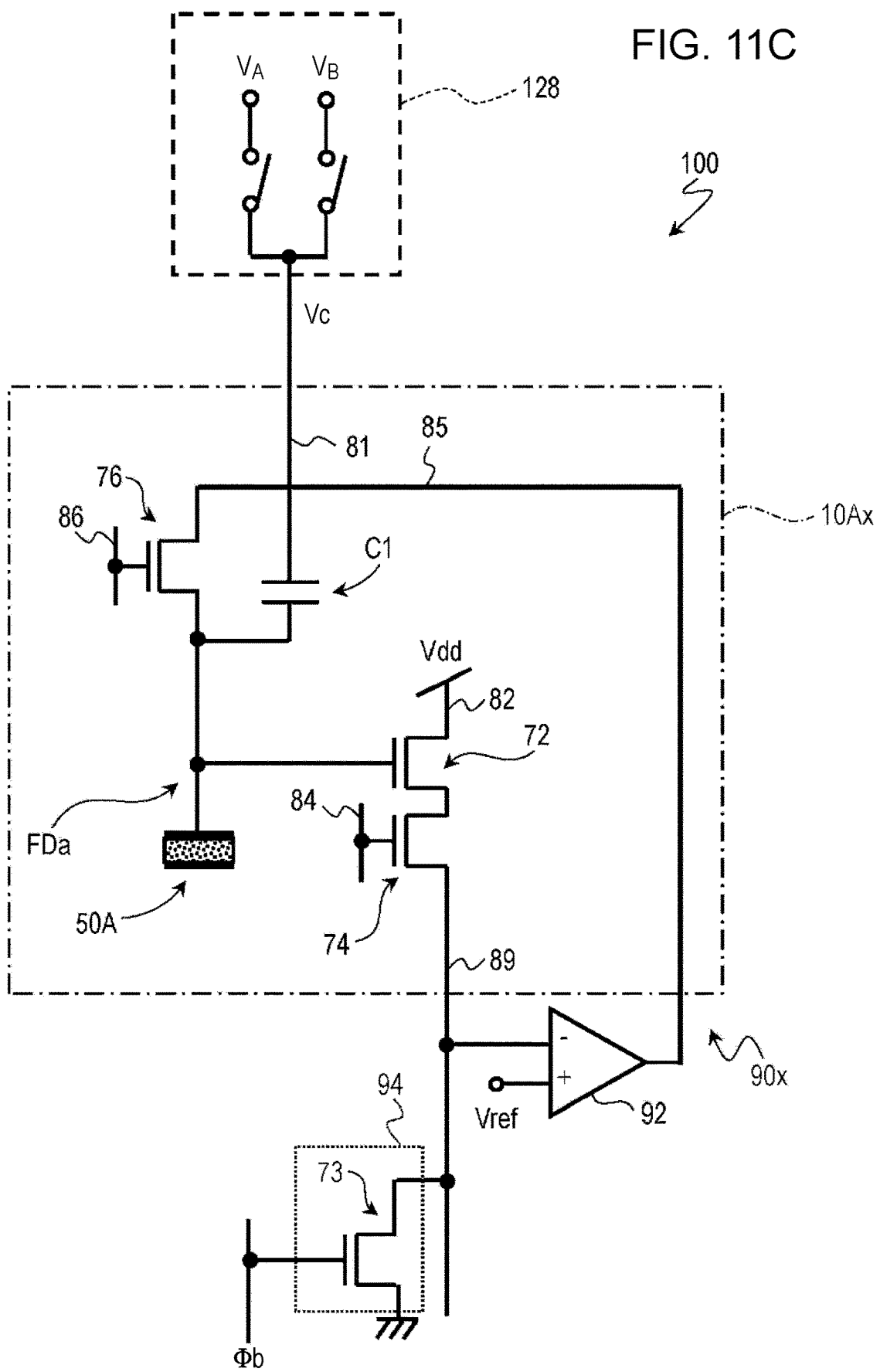
FIG. 11C is a diagram schematically illustrating another example of the circuit configuration of the pixel.

FIG. 11C schematically illustrates another example of the circuit configuration of the pixel 10. In the configuration illustrated in FIG. 11C, the imaging device 100 includes a load transistor 73 connected to the vertical signal line 89. The load transistor 73 is an n-channel MOS transistor, for example, and functions as a current source 94.

In the example illustrated in FIG. 11C, the imaging device 100 includes a feedback circuit 90x. The feedback circuit 90x includes an inverting amplifier 92 whose inverting input terminal is connected to the vertical signal line 89. The inverting amplifier 92 is provided for the vertical signal line 89 for each column of a pixel 10Ax. Here, the reset voltage line 85 is connected to an output terminal of the inverting amplifier 92. In the example illustrated in FIG. 11C, the signal detection transistor 72, the address transistor 74, the inverting amplifier 92, and the reset transistor 76 form a feedback loop that negatively feeds back electric signals generated by the photoelectric conversion unit 50A.

During the operation of the imaging device 100, a voltage Vref of 1 V or about 1 V, for example, is supplied to a non-inverting input terminal of the inverting amplifier 92. The voltage Vref may be any voltage within a range between a power supply voltage Vdd and ground. When the feedback loop is formed, the voltage of the vertical signal line 89 becomes the voltage Vref input to the non-inverting input terminal of the inverting amplifier 92. In other words, as a result of the formation of the feedback loop, the potential of the node FDa can be reset such that the voltage of the vertical signal line 89 becomes the voltage Vref.

First and second signals are transferred to the vertical signal line 89 by a source follower formed by the signal detection transistor 72 and the current source 94. If the potential of the node FDa at the time of the transfer is low, a voltage generated in the vertical signal line 89 through the signal detection transistor 72 also becomes low. As a result, a source-drain voltage necessary for an operation in a saturation region might not be secured, and the load transistor 73 might operate in a linear region. Consequently, the source follower might not operate normally, and the linearity of signals might be affected.

The load transistor 73 can operate in the saturation region if a current obtained by the current source 94 is set small, but in this case, reading speed of signals might decrease. In addition, the voltage of the vertical signal line 89 might decrease, and a signal input to the inverting amplifier 92 might fall out of an operation range, which prevents the feedback circuit 90x from operating normally. That is, the potential of the node FDa might not be reset such that the voltage of the vertical signal line 89 becomes the voltage Vref.

The operation sequence described with reference to FIG. 4C, 8, or 10, for example, may be applied to the imaging device 100 including the pixel 10Ax. That is, the potential of the charge accumulation node is temporarily increased or decreased through the capacitor C1 at least in a part of the non-exposure period by switching the voltage supplied to the control line 81 between the first voltage $V_A$ and the second voltage $V_B$. When positive holes are used as signal charges, for example, the potential of the charge accumulation node is selectively increased in the non-exposure period by switching the voltage applied to the control line 81 from the voltage supply circuit 128.

By selectively setting the potential of the charge accumulation node high in the non-exposure period, the load transistor 73 does not operate in the linear region, and the first and second signals can be read from the pixels normally. Since the reading of signals and the feedback operation are performed in the non-exposure period, the potential of the charge accumulation node may be so low in the exposure period that the load transistor 73 operates in the linear region. By setting the potential of the charge accumulation node low in the exposure period, dark current can be suppressed without deteriorating circuit characteristics.

Second Embodiment

Figure 12:
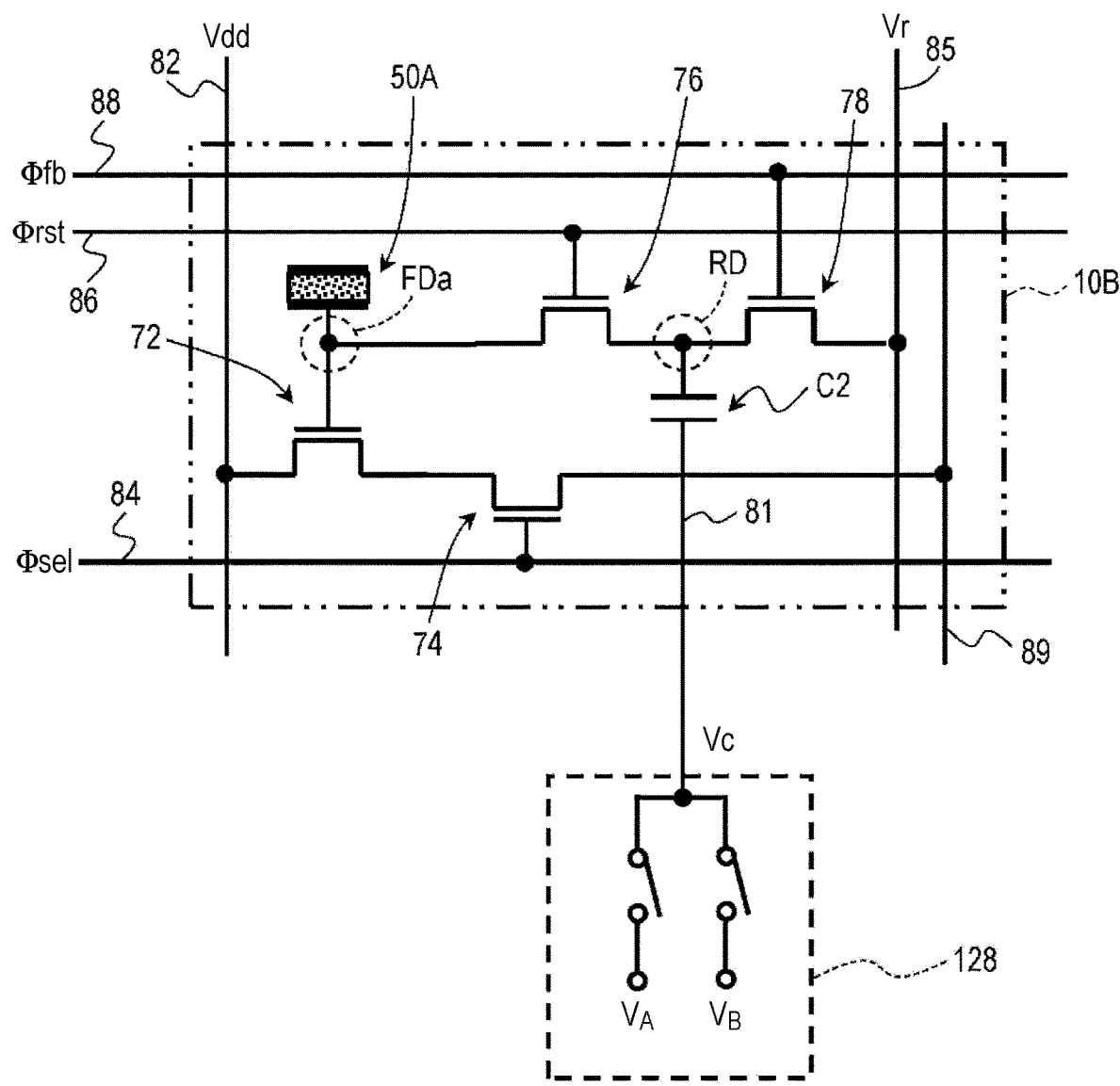
FIG. 12 is a diagram schematically illustrating an example of the circuit configuration of a pixel included in an imaging device according to a second embodiment of the present disclosure.

FIG. 12 schematically illustrates an example of the circuit configuration of a pixel 10B included in an imaging device according to a second embodiment of the present disclosure. As with the pixel 10A illustrated in FIG. 3, the pixel 10B illustrated in FIG. 12 is an example of the pixel 10. A main difference between the pixel 10B illustrated in FIG. 12 and the pixel 10A illustrated in FIG. 3 is that the pixel 10B further includes a transistor 78 connected to either the source or the drain of the reset transistor 76, whichever is not connected to the node FDa. Another difference is that, in the pixel 10B, the voltage supply circuit 128 is electrically connected to a node RD provided between the reset transistor 76 and the transistor 78. In this example, the voltage supply circuit 128 is electrically connected to the impurity region 60a through the reset transistor 76.

As illustrated in FIG. 12, each pixel 10 of the imaging device 100 may further include the transistor 78 connected to the reset transistor 76. The transistor 78 is an n-channel MOS transistor, for example, and may include the impurity region 60b, which is the source region or the drain region of the reset transistor 76, as a drain region or a source region thereof. In the configuration illustrated in FIG. 12, the reset voltage line 85 is connected to a source or a drain of the transistor 78, whichever is not connected to the reset transistor 76, and the certain reset voltage Vr is applied to the transistor 78 during the operation of the imaging device 100. A signal line 88 that supplies a signal Φfb for turning on and off the transistor 78 to the transistor 78 is connected to a gate of the transistor 78. The signal line 88 is connected to the vertical scanning circuit 122, for example, and the vertical scanning circuit 122 may be configured in such a way as to control the potential of the signal line 88.

In this example, the voltage supply circuit 128 is connected to the node RD between the reset transistor 76 and the transistor 78 through a capacitor C2. That is, in this example, the voltage supply circuit 128 is connected not to the impurity region 60a of the reset transistor 76 but to the impurity region 60b through the capacitor C2. The capacitor C2 connected between the control line 81 and the impurity region 60b may have the same configuration as the capacitor C1. The configuration of the capacitor C2 need not necessarily be the same as that of the capacitor C1.

Figure 13:
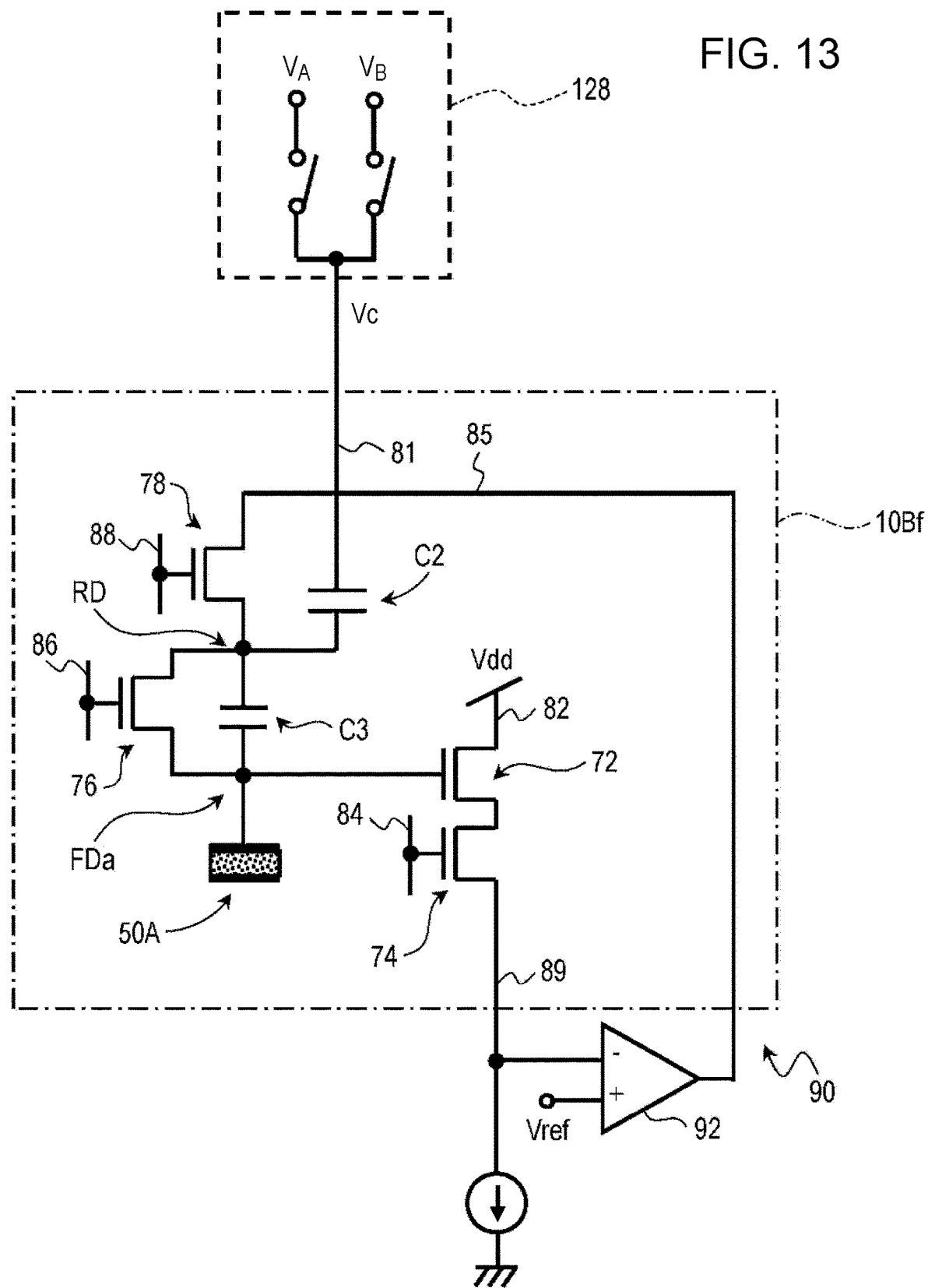
FIG. 13 is a diagram illustrating a more specific example in which the circuit configuration illustrated in FIG. 12 is applied.

FIG. 13 illustrates a more specific example in which the circuit configuration illustrated in FIG. 12 is applied. A pixel 10Bf illustrated in FIG. 13 is an example of the pixel 10B illustrated in FIG. 12 and includes a feedback circuit 90. In the configuration illustrated in FIG. 13, the feedback circuit 90 includes, as in the example described with reference to FIG. 11C, the inverting amplifier 92 whose inverting input terminal is connected to the vertical signal line 89.

In the configuration illustrated in FIG. 13, the pixel 10Bf includes a capacitor C3 connected in parallel with the reset transistor 76. When the address transistor 74 and at least the transistor 78 are on, the feedback circuit 90 forms a feedback loop that negatively feeds back electric signals generated by the photoelectric conversion unit 50A. The feedback loop includes the transistor 78.

As generally known, when a transistor is turned on or off, thermal noise called "kTC noise" is generated. After the potential of the node FDa is reset, kTC noise generated by simply turning off the reset transistor 76 undesirably remains in the charge accumulation node before signal charges are accumulated. As described in International Publication No. 2012/147302, however, kTC noise generated when a reset transistor is turned off can be reduced through negative feedback. The entire contents of International Publication No. 2012/147302 are incorporated herein by reference.

In the circuit configurations illustrated in FIGS. 12 and 13, the node RD between the reset transistor 76 and the transistor 78 is a floating node. As described above, the transistor 78 may include the impurity region 60b as a drain region. When the transistor 78 is turned off, therefore, the potential of the impurity region 60b might fall below the substrate potential Vsub due to electrical coupling caused by parasitic capacitance of the transistor 78. If the potential of the impurity region 60b falls below the substrate potential Vsub, an unintended change might be caused in the potential of the impurity region 60b due to entry of positive holes from a p-well, and the S/N ratio might decrease. Here, however, the voltage supply circuit 128 is electrically connected to the impurity region 60b. As described hereinafter, the potential of the impurity region 60b can be kept from falling below the substrate potential Vsub by switching the voltage Vc applied to the control line 81 from the voltage supply circuit 128 between the first voltage $V_A$ and the second voltage $V_B$.

Figure 14A:
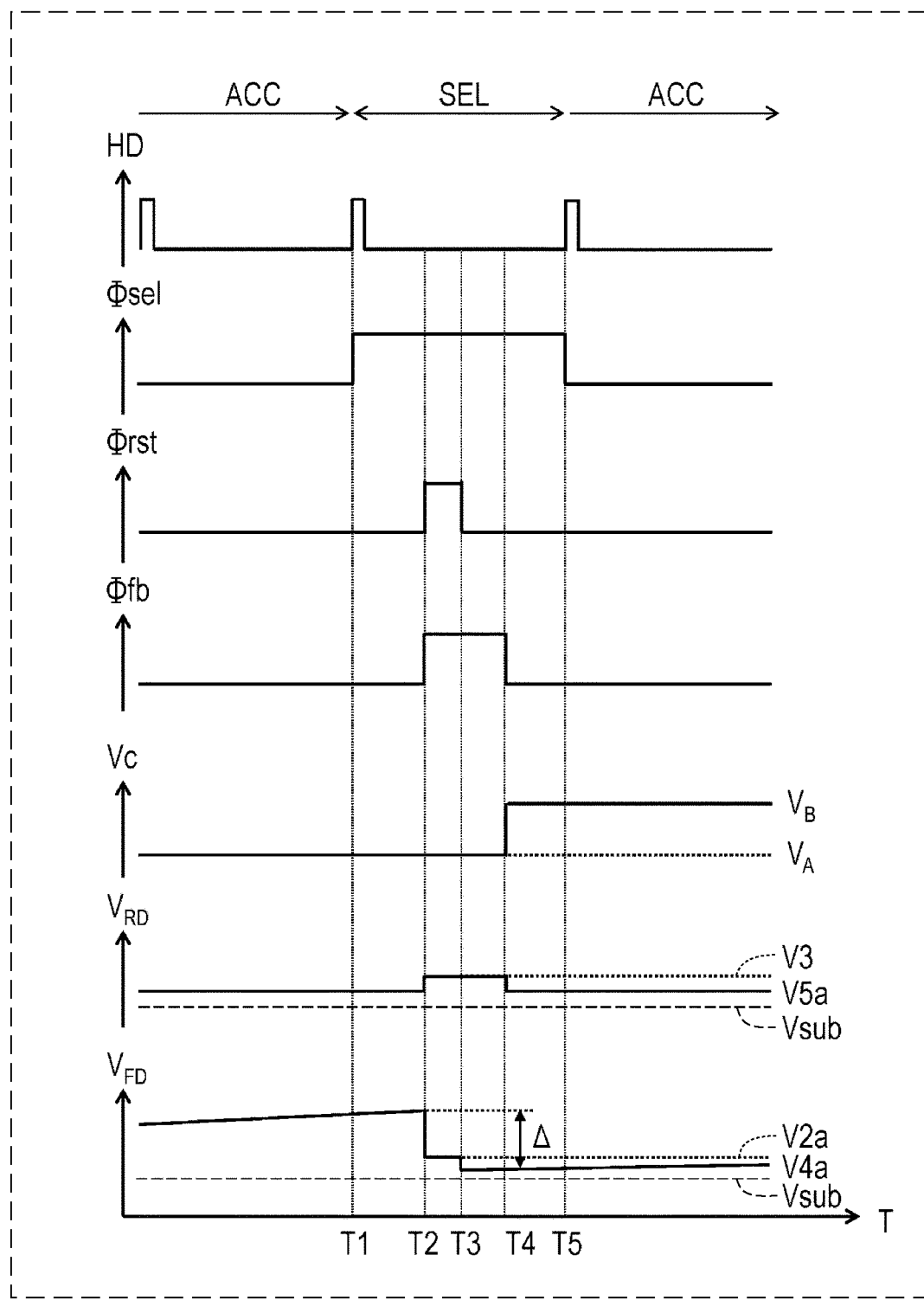
FIG. 14A is a timing chart illustrating an example of the operation of a pixel having the circuit configuration illustrated in FIG. 13.

FIG. 14A is a timing chart illustrating an example of the operation of the pixel 10Bf having the circuit configuration illustrated in FIG. 13. A second lowest part of FIG. 14A indicates temporal changes in the potential of the node RD, that is, a potential $V_{RD}$ of the impurity region 60b. As can be seen from a part indicating temporal changes in the voltage Vc, the first voltage $V_A$ is applied to the control line 81 at the time T1 as in the first example described with reference to FIGS. 4A and 4B.

After signal charges are accumulated through exposure, the address signal Φsel is turned high at the time T1. At this time, a first signal whose voltage level corresponds to the signal charges accumulated in the charge accumulation node is read.

Next, the reset signal Φrst and a signal Φfb are turned high at the time T2. That is, the reset transistor 76 and the transistor 78 are turned on. As a result, a feedback loop is formed, and the potential of the node FDa is reset. The potential of the node FDa decreases to a voltage V2a with which the voltage of the vertical signal line 89 becomes Vref. The voltage Vref applied to the non-inverting input terminal of the inverting amplifier 92 satisfies V2a>Vsub. In the example illustrated in FIG. 14A, the potential $V_{RD}$ of the node RD increases to a voltage V3 when the reset transistor 76 and the transistor 78 are turned on. As illustrated in FIG. 14A, the voltage V3 satisfies V3>Vsub.

Next, the reset signal Φrst is turned low at the time T3 to turn off the reset transistor 76. When the reset transistor 76 is turned off, the potential $V_{FD}$ of the impurity region 60a decreases from V2a to V4a due to the electrical coupling caused by the parasitic capacitance of the reset transistor 76. As described above, if the potential $V_{FD}$ falls below the substrate potential Vsub, positive holes undesirably enter the impurity region 60a. The potential $V_{FD}$ can be kept from falling below the substrate potential Vsub by appropriately selecting the voltage Vref applied to the non-inverting input terminal of the inverting amplifier 92. In this example, V4a>Vsub is satisfied by appropriately selecting the voltage Vref. In order to reduce the depletion layer in size, it is advantageous that V4a be as close to Vsub as possible insofar as V4a>Vsub is satisfied.

As described above, when the reset transistor 76 is turned off, kTC noise is generated. In the circuit configuration illustrated in FIG. 13, however, the capacitor C3 is provided between the node FDa and the node RD, and a feedback loop including the capacitor C3 is formed while the transistor 78 is not off. A signal output from the transistor 78, therefore, is attenuated by an attenuation circuit formed by the capacitor C3 and parasitic capacitance of the node FDa.

After the reset transistor 76 is turned off, the signal Φfb is turned low to turn off the transistor 78. At the time T4, not only the reset transistor 76 is turned off but also the voltage Vc applied to the control line 81 from the voltage supply circuit 128 is switched to the second voltage $V_B$.

As schematically illustrated in FIG. 14A, when the transistor 78 is turned off, the potential $V_{RD}$ of the impurity region 60b decreases due to the electrical coupling caused by the parasitic capacitance of the transistor 78. In this example, when the transistor 78 is turned off, the potential $V_{RD}$ is decreased from V3 to V5a. If V5a<Vsub, positive holes, which cause noise, undesirably enter the impurity region 60b.

As can be seen from the part of FIG. 14A indicating the voltage Vc, the voltage Vc is switched from the first voltage $V_A$ to the second voltage $V_B$, which is higher than the first voltage $V_A$, when the voltage supply circuit 128 turns on the transistor 78. By switching the voltage Vc from the first voltage $V_A$ to the second voltage $V_B$, the potential $V_{RD}$ of the node RD increases through the capacitor C2 and can be kept from falling below the substrate potential Vsub. The second voltage $V_B$ may be selected such that the potential $V_{RD}$ satisfies V5a>Vsub when the transistor 78 is off, in consideration of the parasitic capacitance between the source and the drain of the transistor 78.

When the transistor 78 is turned off, the potential of the signal line 88 may be gradually decreased from high to low past a threshold voltage of the transistor 78. When the potential of the signal line 88 is gradually decreased from high to low, the resistance of the transistor 78 gradually increases. When the resistance of the transistor 78 increases, an operation band of the transistor 78 becomes narrower, and a frequency band of a feedback signal also becomes narrower.

When the voltage of the signal line 88 has become low, the transistor 78 is turned off, and the feedback loop is canceled. If the operation band of the transistor 78 is sufficiently lower than an operation band of the signal detection transistor 72, thermal noise generated by the transistor 78 is suppressed by the feedback circuit 90 to $1/(1+AB)^{1/2}$. "A" in the expression denotes the gain of the feedback circuit 90, and "B" denotes an attenuation ratio of the attenuation circuit formed by the capacitor C3 and the parasitic capacitance of the node FDa. If the capacitance of capacitor C3 and the parasitic capacitance of the node FDa are denoted by Cc and Cf, respectively, the attenuation ratio B is represented as B=Cc/(Cc+Cf). It is therefore advantageous in terms of reduction of an effect of thermal noise that the capacitance Cc of the capacitor C3 is as low as possible compared to the capacitance of the capacitor C2. By turning off the transistor 78 with the operation band of the transistor 78 lower than the operation band of the signal detection transistor 72, kTC noise remaining in the node FDa can be reduced. When the transistor 78 is an n-type transistor and off herein, the voltage of the signal line 88 is lower than the threshold voltage of the transistor 78. When the transistor 78 is a p-type transistor and off herein, the voltage of the signal line 88 is higher than the threshold voltage of the transistor 78.

After the transistor 78 is turned off, a second signal corresponding to the voltage level of the charge accumulation node is read before the time T5, at which a next rising edge of the horizontal synchronizing signal HD appears. As in the first example described with reference to FIGS. 4A and 4B, a difference Δ between the first and second signals is output to the horizontal scanning circuit 124 as an image signal.

As described above, in this example, the voltage supply circuit 128 applies the first voltage $V_A$ to the impurity region 60b in a first period, in which the reset transistor 76 is on. The voltage supply circuit 128 applies the second voltage $V_B$ to the impurity region 60b in a second period, which comes after the reset transistor 76 is turned off and in which the transistor 78 is turned off.

According to the second embodiment, the potential V2a of the impurity region 60a when the reset transistor 76 and the transistor 78 are on and the potential V4a of the impurity region 60a when the transistor 78 has been turned off become as low as possible and close to the substrate potential Vsub without falling below the substrate potential Vsub. In addition, the potential V3 of the impurity region 60b when the transistor 78 is on and the potential V5a of the impurity region 60b when the transistor 78 has been turned off become as low as possible and close to the substrate potential Vsub without falling below the substrate potential Vsub. Dark current due to variation in the potential $V_{RD}$ caused by the electrical coupling through the transistor 78, therefore, is suppressed, and an image signal can be obtained without deteriorating image quality.

Figure 14B:
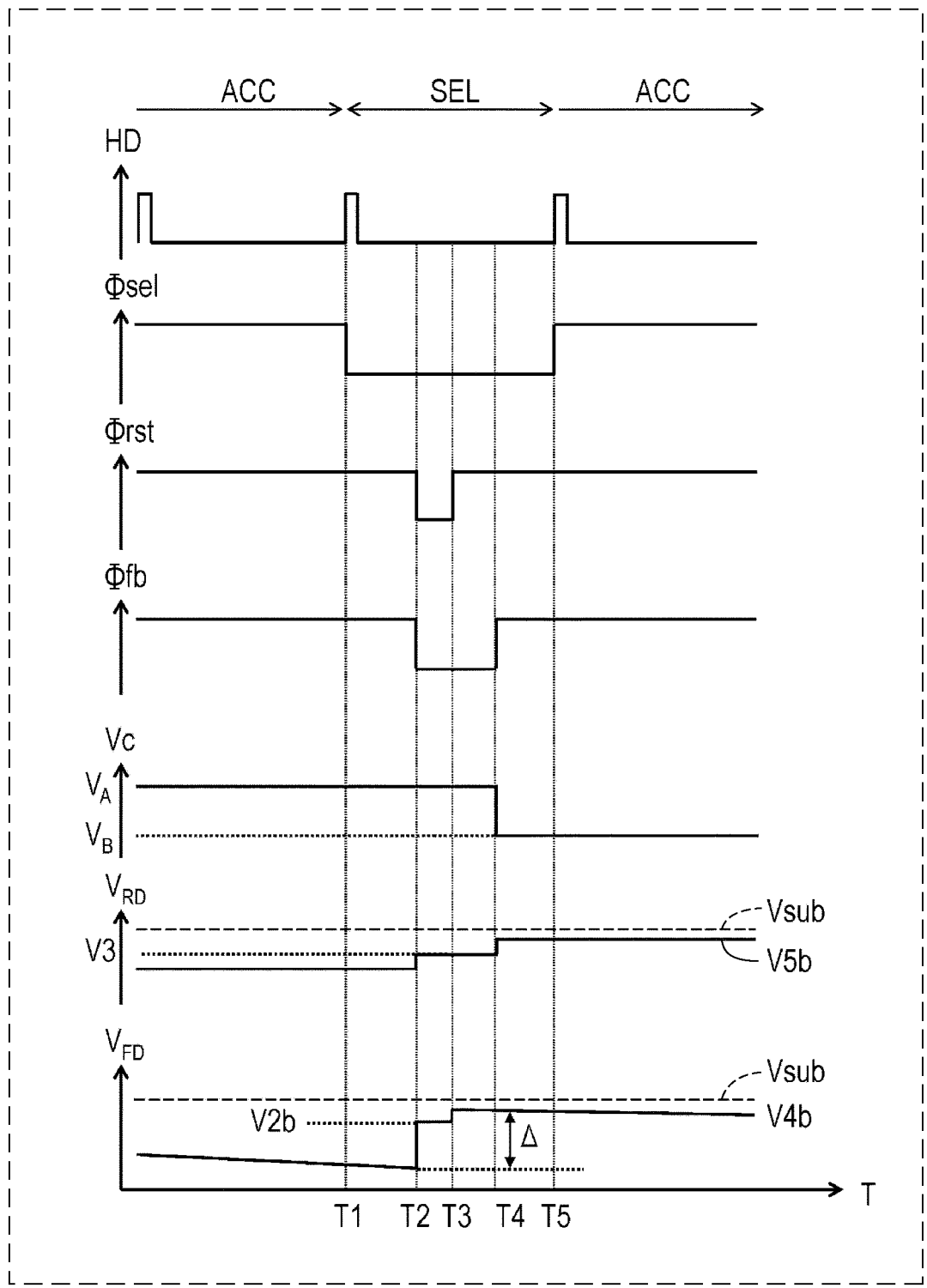
FIG. 14B is a timing chart illustrating an example of an operation at a time when a reset transistor and a transistor of the pixel are p-type transistors.

The reset transistor 76 and the transistor 78 may be p-type transistors, instead. FIG. 14B is a timing chart illustrating an example of an operation at a time when the reset transistor 76 and the transistor 78 of the pixel 10Bf are p-type transistors. As in the example described with reference to FIG. 4B, an example in which electrons are used as signal charges will be described. In this case, the signal detection transistor 72 and the address transistor 74, too, are typically p-type transistors.

After signal charges are accumulated through exposure, the address signal Φsel is turned low at the time T1 to read a first signal. Next, the reset transistor 76 and the transistor 78 are turned on at the time T2 to form a feedback loop. As a result of the formation of the feedback loop, the potential of the node FDa is reset to a voltage V2b, with which the voltage of the vertical signal line 89 becomes Vref. The voltage Vref is a value with which V2B<Vsub is satisfied. In this example, the potential $V_{RD}$ of the node RD increase to V3 when the reset transistor 76 and the transistor 78 are turned on. The voltage V3 satisfies V3<Vsub.

Next, the reset transistor 76 is turned off at the time T3. Here, the potential $V_{FD}$ of the impurity region 60a increases from V2b to V4b when the reset transistor 76 is turned off. Because dark current is generated if the potential $V_{FD}$ exceeds the substrate potential Vsub, the voltage Vref applied to the non-inverting input terminal of the inverting amplifier 92 is appropriately selected so that the potential $V_{FD}$ does not exceed the substrate potential Vsub. In order to reduce the depletion layer in size, it is advantageous that V4b be as close to Vsub as possible insofar as V4b<Vsub is satisfied.

After the reset transistor 76 is turned off, the transistor 78 is turned off at the time T4. At this time, the transistor 78 may be turned off by gradually increasing the potential of the signal line 88 from low to high past the threshold voltage of the transistor 78. When the transistor 78 is turned off, the potential $V_{RD}$ of the impurity region 60b can increase due to the electrical coupling caused by the parasitic capacitance of the transistor 78. In this example, the potential $V_{RD}$ increases from V3 to V5b when the transistor 78 is turned off.

If V5b>Vsub is satisfied at this time, electrons, which cause noise, undesirably enter the impurity region 60b. As illustrated in FIG. 14B, the potential $V_{RD}$ of the node RD can be decreased through the capacitor C2 by turning off the transistor 78 and switching the voltage Vc applied to the control line 81 from the voltage supply circuit 128 to the second voltage $V_B$, which is lower than the first voltage $V_A$, and the potential $V_{RD}$ can be kept from exceeding the substrate potential Vsub.

After the transistor 78 is turned off, a second signal corresponding to the voltage level of the charge accumulation node is read before the time T5, at which a next rising edge of the horizontal synchronizing signal HD appears. A difference between the first and second signals is output to the horizontal scanning circuit 124 as an image signal.

Dark current due to variation in the potential $V_{RD}$ caused by the electrical coupling through the transistor 78 can thus be suppressed by switching the voltage Vc from the first voltage $V_A$ to the second voltage $V_B$, which is lower than the first voltage $V_A$, when the transistor 78 is turned off, even when the reset transistor 76 and the transistor 78 are p-type transistors.

Modifications of Second Embodiment

Figure 15:
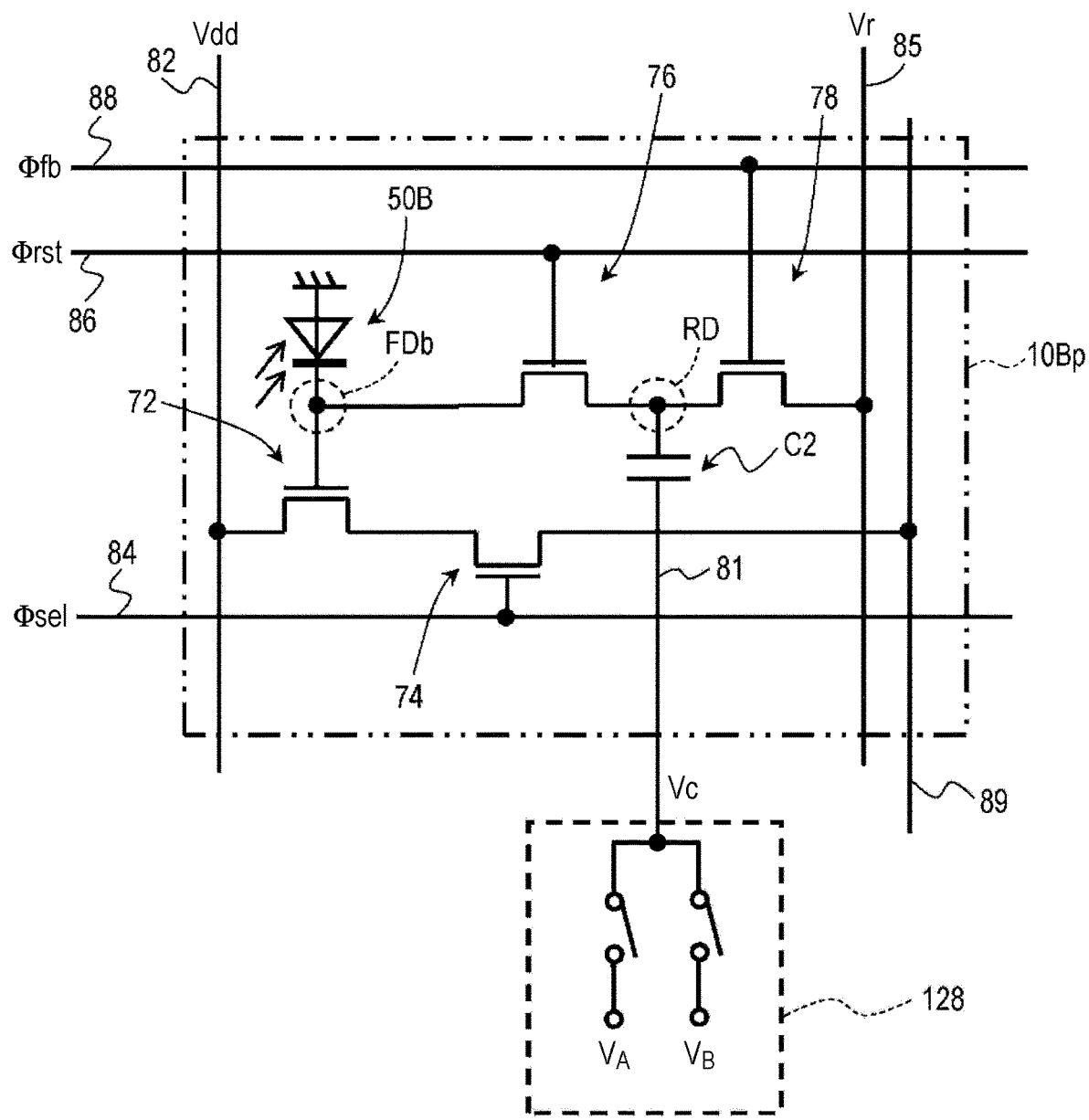
FIG. 15 is a diagram illustrating an imaging device according to a modification of the second embodiment of the present disclosure.

FIG. 15 illustrates an imaging device according to a modification of the second embodiment of the present disclosure. In the circuit configuration of a pixel 10Bp illustrated in FIG. 15, the photoelectric conversion unit 50A of the pixel 10B illustrated in FIG. 12 is replaced by the photoelectric conversion unit 50B.

The operation of the imaging device 100 including the pixel 10Bp may be the same, for example, as that described with reference to FIG. 14A or 14B. That is, in the first period, in which the reset transistor 76 is on, the first voltage $V_A$ may be applied to the impurity region 60b, and in the second period, which comes after the reset transistor 76 is turned off and in which the transistor 78 is off, the second voltage $V_B$ may be applied to the impurity region 60b.

With the circuit configuration illustrated in FIG. 15, as with that of the pixel 10B illustrated in FIG. 12, the potential of the node RD, which is a floating node, is increased, for example, through the capacitor C2 by switching the voltage Vc from the first voltage $V_A$ to the second voltage $V_B$. Dark current, therefore, can be suppressed while keeping the potential $V_{RD}$ of the impurity region 60b from falling below the substrate potential Vsub when the transistor 78 is turned off. As with the pixel 10Aq illustrated in FIG. 6, the transfer transistor 79 may be connected between the gate of the signal detection transistor 72 and the photoelectric conversion unit 50B.

Figure 16:
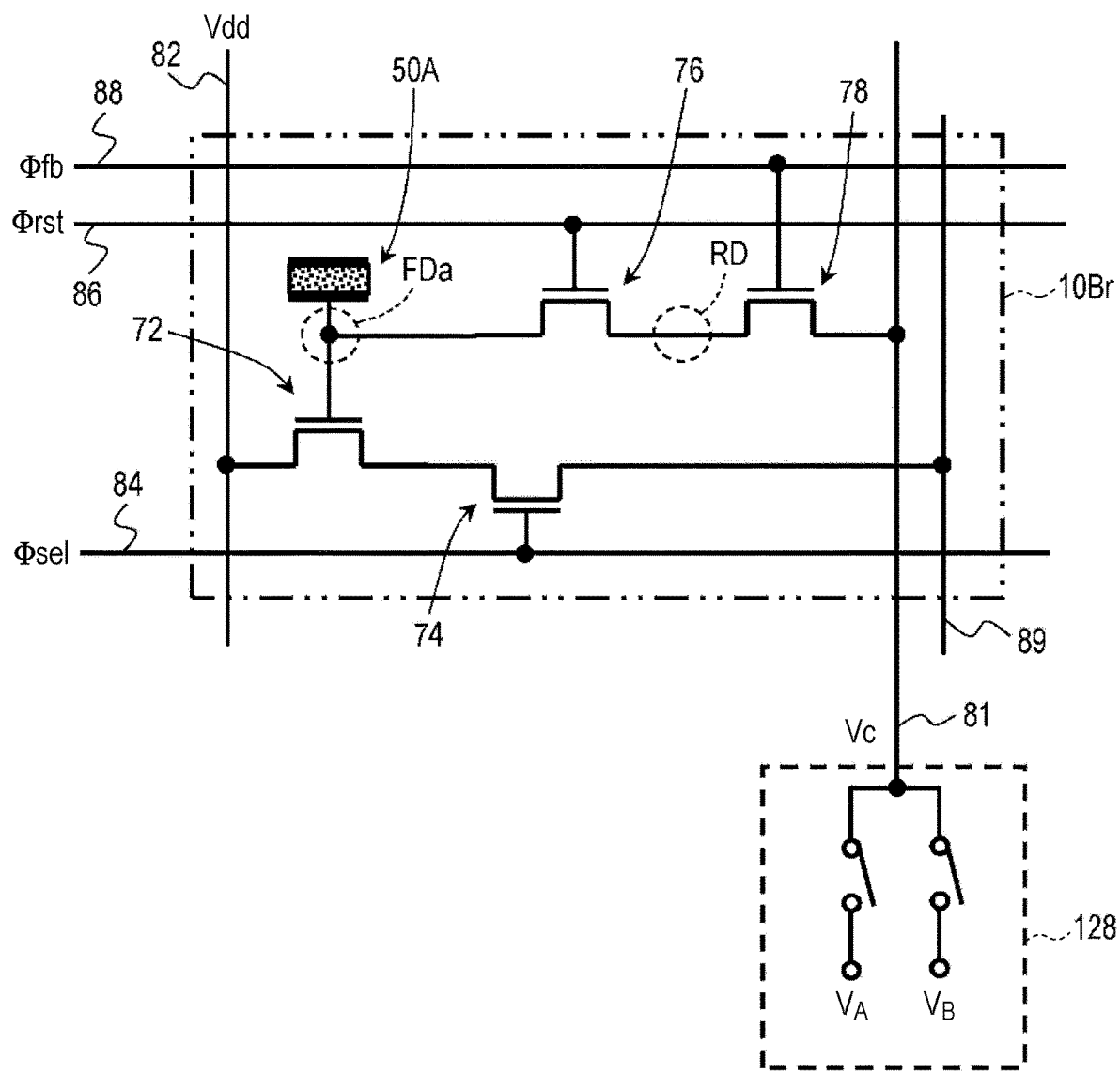
FIG. 16 is a diagram illustrating an imaging device according to another modification of the second embodiment of the present disclosure.

FIG. 16 illustrates an imaging device according to another modification of the second embodiment of the present disclosure. A pixel 10Br illustrated in FIG. 16 is an example of the pixel 10. A main difference between the pixel 10Br illustrated in FIG. 16 and the pixel 10B described with reference to FIG. 12 is that, in the pixel 10Br, the voltage supply circuit 128 is electrically connected not to the node RD between the transistor 78 and the reset transistor 76 but to the source or the drain of the transistor 78, whichever is not connected to the reset transistor 76. That is, in the example illustrated in FIG. 16, the control line 81 connected to the voltage supply circuit 128 is connected to the source or the drain of the transistor 78, whichever is not connected to the reset transistor 76.

Third Example of Operation of Imaging Device 100

Figure 17A:
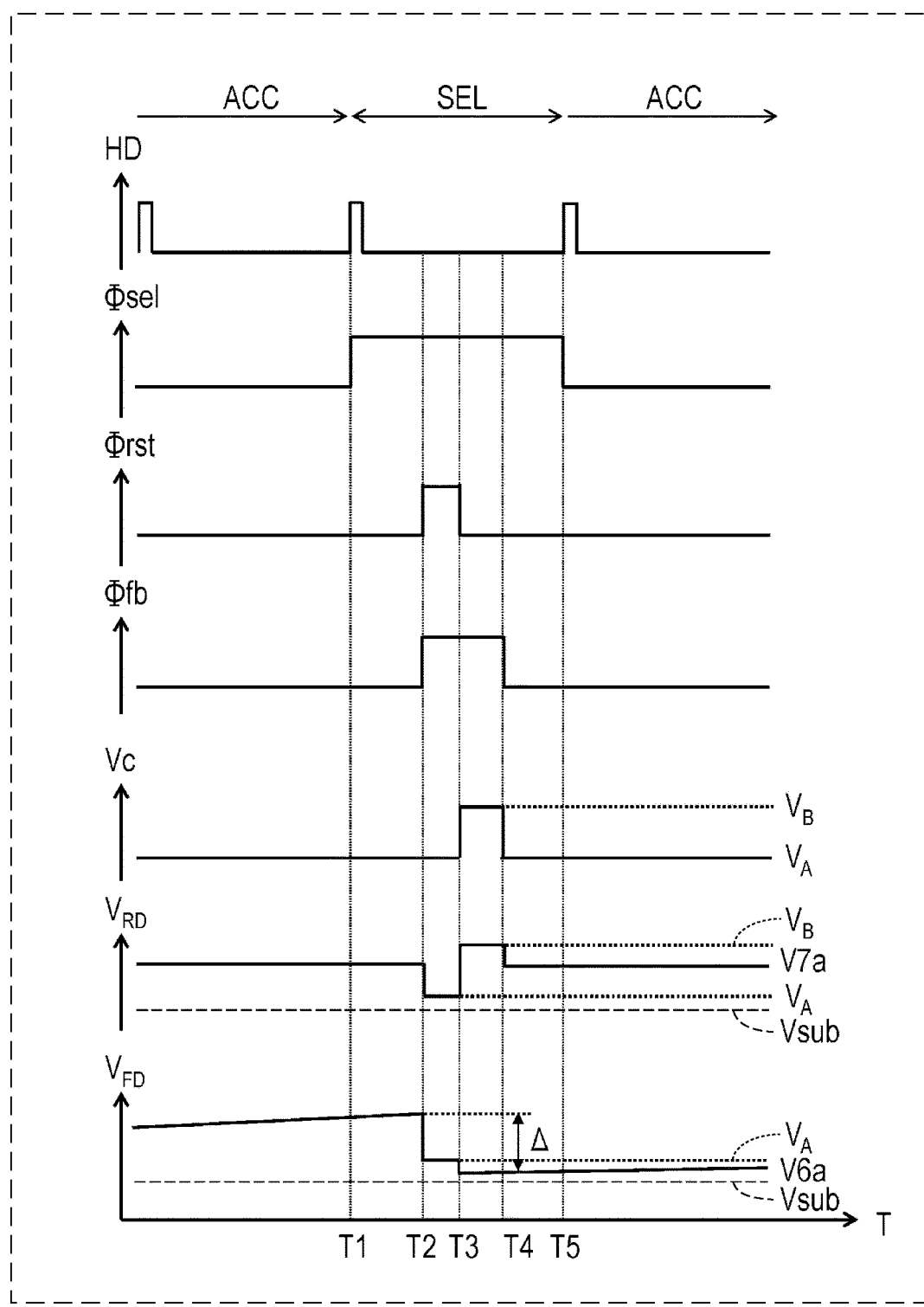
FIG. 17A is a timing chart illustrating an example of the operation of the pixel having the circuit configuration illustrated in FIG. 16.

FIG. 17A is a timing chart illustrating an example of the operation of the pixel 10Br having the circuit configuration illustrated in FIG. 16. The operation illustrated in FIG. 17A is different from that described with reference to FIG. 14A in terms of the timing at which the voltage applied to the control line 81 is switched between the first voltage $V_A$ and the second voltage $V_B$.

After signal charges are accumulated through exposure, the address signal Φsel is turned high at the time T1, and a first signal whose voltage level corresponds to the signal charges accumulated in the charge accumulation node is read.

Next, the reset signal Φrst and the signal Φfb are turned high at the time T2 to turn on the reset transistor 76 and the transistor 78. As can be seen from a part of the timing chart indicating the voltage Vc, the voltage supply circuit 128 applies the first voltage $V_A$ to the control line 81 at the time T2. When the reset transistor 76 and the transistor 78 are turned on, the potential $V_{FD}$ of the impurity region 60a and the potential $V_{RD}$ of the impurity region 60b change to $V_A$. By making the first voltage $V_A$ higher than a voltage applied to a substrate contact to achieve the substrate potential Vsub, the potential $V_{FD}$ of the impurity region 60a and the potential $V_{RD}$ of the impurity region 60b can be kept from falling below the substrate potential Vsub of the semiconductor substrate 60.

Next, the reset transistor 76 is turned off at the time T3. When the reset transistor 76 is turned off, the potential $V_{FD}$ of the impurity region 60a can decrease from $V_A$ due to the electrical coupling caused by the parasitic capacitance of the reset transistor 76. If the potential $V_{FD}$ of the impurity region 60a falls below the substrate potential Vsub as a result of the turning off of the reset transistor 76, positive holes undesirably enter the impurity region 60a.

In the example illustrated in FIG. 17A, however, the voltage supply circuit 128 switches the voltage applied to the control line 81 from the first voltage $V_A$ to the second voltage $V_B$ when the reset transistor 76 is turned off. At this time, the transistor 78 is on, and the potential $V_{RD}$ of the impurity region 60b changes to $V_B$ as illustrated in FIG. 17A.

As described above, an FET has a parasitic capacitance between a source and a drain and functions as a capacitor when off. The potential $V_{FD}$ of the impurity region 60a, therefore, can be increased through the reset transistor 76 that is off by increasing the voltage applied to the control line 81 from the first voltage $V_A$ to the second voltage $V_B$. By appropriately selecting the first voltage $V_A$ and the second voltage $V_B$, a decrease in the potential $V_{FD}$ caused when the reset transistor 76 is turned off can be reduced or eliminated, and the potential $V_{FD}$ of the impurity region 60a can be kept from falling below the substrate potential Vsub. In this example, the potential $V_{FD}$ of the impurity region 60a changes to V6a, which satisfies V6a>Vsub.

Next, the transistor 78 is turned off at the time T4. In this example, the voltage applied to the control line 81 is reset to the first voltage $V_A$ from the second voltage $V_B$ when the transistor 78 is turned off. When the transistor 78 is turned off, the potential $V_{RD}$ of the impurity region 60b can decrease due to the electrical coupling through the transistor 78. In this example, the potential $V_{RD}$ of the impurity region 60b decreases from $V_B$ to V7a.

The potential $V_{RD}$ of the impurity region 60b immediately before the transistor 78 is turned off, however, is $V_B$. Since the transistor 78 is turned off with the second voltage $V_B$, which is higher than the first voltage $V_A$ close to the substrate potential Vsub, applied, the potential $V_{RD}$ can be kept from falling below the substrate potential Vsub. As illustrated in FIG. 17A, V7a>Vsub is established. The second voltage $V_B$ may be selected such that V7a>Vsub is satisfied. It is advantageous in terms of reduction of the depletion layer in size that the second voltage $V_B$ is as low as possible insofar as V7a>Vsub is satisfied. The voltage applied to the control line 81 need not be switched when the transistor 78 is turned off, and the second voltage $V_B$ may continue to be applied to the control line 81 even after the time T4, instead. The parasitic capacitance between the source and the drain of the reset transistor 76 is relatively low, and the potential $V_{FD}$ of the impurity region 60a is hardly affected even if the potential $V_{RD}$ of the impurity region 60b decreases from $V_B$ to V7a.

After the transistor 78 is turned off, a second signal corresponding to the voltage level of the charge accumulation node is read before the time T5, at which a next rising edge of the horizontal synchronizing signal HD appears. A difference Δ between the first and second signals is output to the horizontal scanning circuit 124 as an image signal.

The third example illustrated in FIG. 17A is the same as the example described with reference to FIG. 14A in that that the first voltage $V_A$ is applied to the impurity region 60b in the first period, in which the reset transistor 76 is on. In this example, however, the voltage supply circuit 128 applies the second voltage $V_B$ to the impurity region 60b in a period for which the transistor 78 remains on other than the first period. With this control, too, the potential $V_{RD}$ of the impurity region 60b can be kept from falling below the substrate potential Vsub. In addition, dark current due to variation in the potential $V_{FD}$ of the impurity region 60a caused by the electrical coupling through the reset transistor 76 that is off can be suppressed.

The control in the example described with reference to FIG. 14A may be applied to the circuit configuration illustrated in FIG. 16. Now, FIG. 14A is referred to again. In the example illustrated in FIG. 14A, the transistor 78 is turned off at the time T4. This is the same as in the third example. When the transistor 78 is turned off, the potential $V_{RD}$ of the impurity region 60b can decrease due to the electrical coupling through the transistor 78 as described above. As illustrated in FIG. 14A, however, the voltage applied to the control line 81 is switched to the second voltage $V_B$ when the transistor 78 is turned off, and a decrease in the potential due to the electrical coupling through the transistor 78 can be reduced. This is because the transistor 78 is off after the time T4 and functions as a capacitor since the transistor 78 has a parasitic capacitance between the source and the drain thereof although the source and the drain are not conductive. That is, the potential $V_{RD}$ of the impurity region 60*b* can be controlled through the electrical coupling caused by the parasitic capacitance of the transistor 78. By controlling the potential $V_{RD}$ through the transistor 78, the potential $V_{RD}$ can be kept from falling below the substrate potential Vsub when the transistor 78 is turned off, and positive holes can be kept from entering the impurity region 60*b*.

The transistor 78 after being turned off can achieve the same function as the capacitor C2 illustrated in FIG. 12. The parasitic capacitance between the source and the drain, however, is relatively low. For this reason, as in the circuit configuration illustrated in FIG. 12, the potential $V_{RD}$ of the impurity region 60*b* can be varied more largely by connecting the voltage supply circuit 128 to the node RD through the capacitor C2 having a higher capacitance even if a difference between the first voltage $V_A$ and the second voltage $V_B$ is smaller. In other words, a decrease in the potential $V_{RD}$ when the transistor 78 is turned off can be reduced more effectively with the circuit configuration illustrated in FIG. 12 than with the circuit configuration illustrated in FIG. 16. As a result, the first voltage $V_A$ becomes closer to the substrate potential Vsub.

Figure 17B:
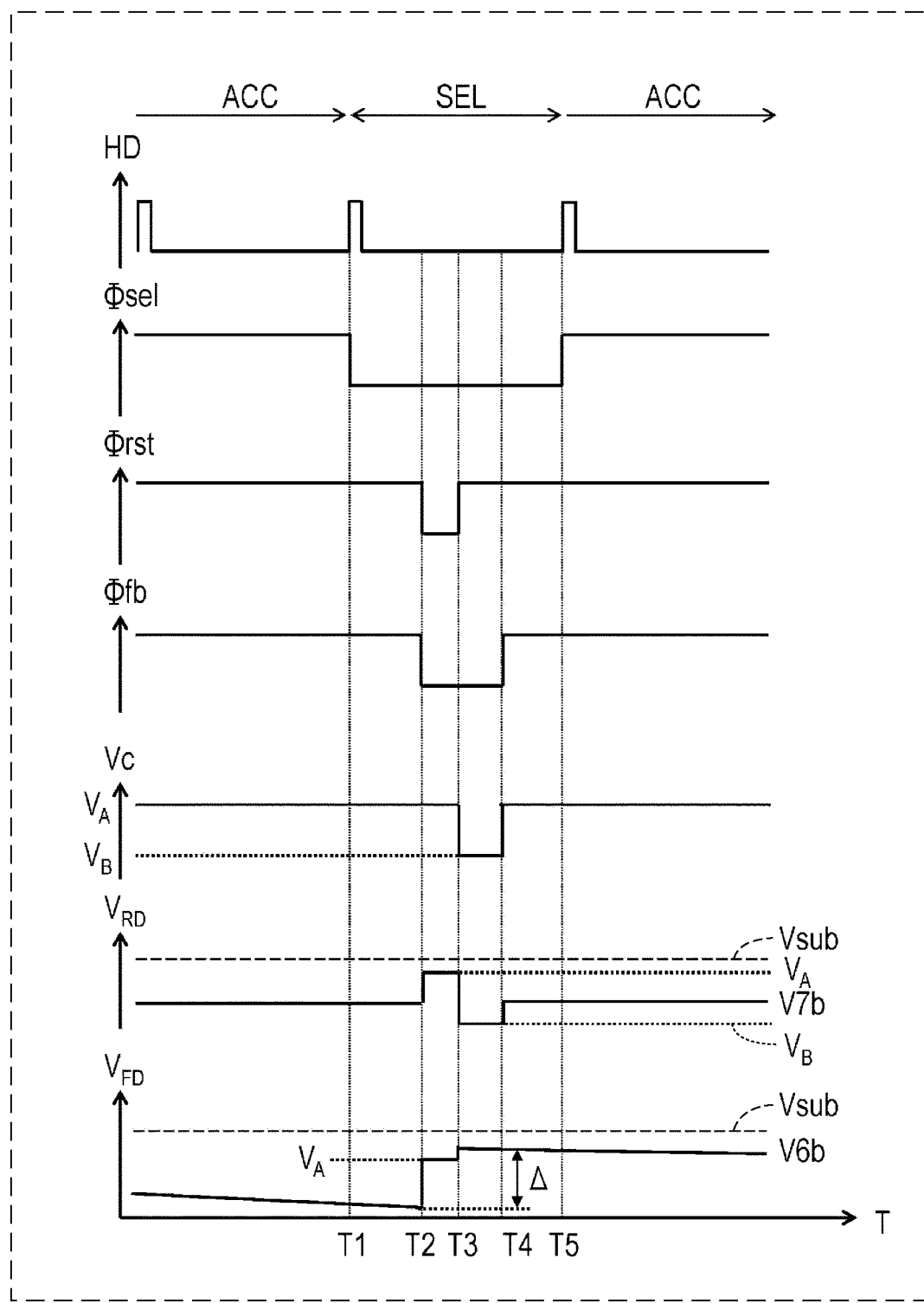
FIG. 17B is a timing chart illustrating an example of an operation at a time when the reset transistor and the transistor of the pixel are p-type transistors and electrons are used as signal charges.

FIG. 17B illustrates an example of an operation at a time when the reset transistor 76, the transistor 78, the signal detection transistor 72, and the address transistor 74 of the pixel 10Br are p-type transistors and electrons are used as signal charges. As described later, in the operation illustrated in FIG. 17B, the timing at which the voltage applied to the control line 81 is switched between the first voltage $V_A$ and the second voltage $V_B$ is the same as in the operation described with reference to FIG. 17A. Here, however, the second voltage $V_B$ is lower than the first voltage $V_A$.

In the example illustrated in FIG. 17B, the address transistor 74 is turned off at the time T1 after signal charges are accumulated through exposure, and a first signal whose voltage level corresponds to the signal charges accumulated in the charge accumulation node is read. Next, the reset signal Φrst and the signal Φfb are turned low at the time T2 to turn on the reset transistor 76 and the transistor 78. Here, the voltage supply circuit 128 applies the first voltage $V_A$ to the control line 81 at the time T2, and the potential $V_{FD}$ of the impurity region 60*a* and the potential $V_{RD}$ of the impurity region 60*b* change to $V_A$. The first voltage $V_A$ is lower than the voltage for achieving the substrate potential Vsub so that the potential $V_{FD}$ and the potential $V_{RD}$ do not exceed the substrate potential Vsub.

Next, the reset transistor 76 is turned off at the time T3. When the reset transistor 76 turns off, the potential $V_{FD}$ of the impurity region 60*a* can increase from $V_A$ due to the electrical coupling caused by the parasitic capacitance of the reset transistor 76. At this time, as illustrated in FIG. 17B, the potential $V_{RD}$ of the impurity region 60*b* changes to $V_B$ by switching the voltage applied to the control line 81 from the first voltage $V_A$ to the second voltage $V_B$, which is lower than the first voltage $V_A$, when the reset transistor 76 is turned off. In addition, by switching the voltage applied to the control line 81 from the first voltage $V_A$ to the second voltage $V_B$, the potential $V_{FD}$ of the impurity region 60*a* can be decreased through the reset transistor 76 that is off. As a result, the potential $V_{FD}$ of the impurity region 60*a* can be kept from exceeding the substrate potential Vsub when the reset transistor 76 is turned off. In this example, the potential $V_{FD}$ of the impurity region 60*a* changes to V6*b* that satisfies V6*b*<Vsub.

Next, the transistor 78 is turned off and the voltage applied to the control line 81 is reset to the first voltage $V_A$ from the second voltage $V_B$ at the time T4. At this time, the potential $V_{RD}$ of the impurity region 60*b* can increase due to the electrical coupling through the transistor 78. Here, however, the transistor 78 is turned off with the second voltage $V_B$, which is lower than the first voltage $V_A$ close to the substrate potential Vsub, applied to the control line 81, and if the potential $V_{RD}$ of the impurity region 60*b* immediately after the transistor 78 is turned off is denoted by V7*b*, V7*b*<Vsub is established. That is, the potential $V_{RD}$ is kept from exceeding the substrate potential Vsub.

After the transistor 78 is turned off, a second signal corresponding to the voltage level of the charge accumulation node is read before the time T5, at which a next rising edge of the horizontal synchronizing signal HD appears. A difference between the first and second signals is output to the horizontal scanning circuit 124 as an image signal.

With this control, the potential $V_{RD}$ of the impurity region 60*b* can be kept from exceeding the substrate potential Vsub. In addition, dark current due to variation in the potential $V_{FD}$ of the impurity region 60*a* caused by the electrical coupling through the reset transistor 76 that is off can be suppressed. When the reset transistor 76, the transistor 78, the signal detection transistor 72, and the address transistor 74 of the pixel 10Br are p-type transistors and electrons are used as signal charges, the control described with reference to FIG. 14B can be applied.

Figure 18:
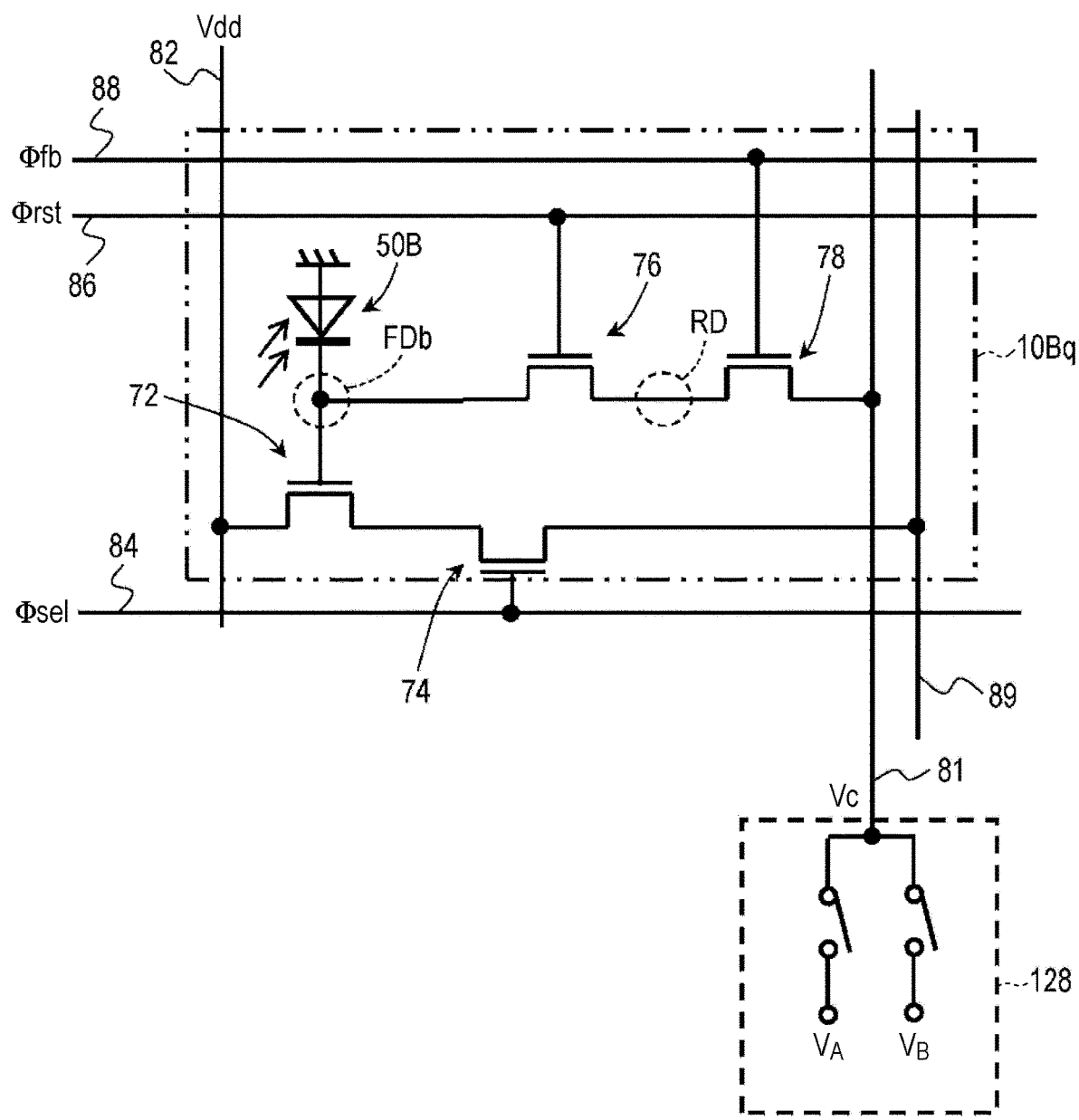
FIG. 18 is a diagram illustrating an imaging device according to another modification of the second embodiment of the present disclosure.

FIG. 18 illustrates an imaging device according to another modification of the second embodiment of the present disclosure. In the circuit configuration of a pixel 10Bq illustrated in FIG. 18, the photoelectric conversion unit 50A of the pixel 10Br illustrated in FIG. 16 is replaced by the photoelectric conversion unit 50B. The operation of the imaging device 100 including the pixel 10Bq may be the same as that described with reference to FIG. 17A or 17B. That is, the second voltage $V_B$ may be applied to the impurity region 60*b* in a period for which the transistor 78 remains on other than a first period, in which the reset transistor 76 is on. With this control, for example, the potential $V_{RD}$ of the impurity region 60*b* can be kept from falling below the substrate potential Vsub.

The operation described with reference to FIG. 14A or 14B may be applied to the circuit configuration illustrated in FIG. 18. As with the pixel 10Aq illustrated in FIG. 6, the transfer transistor 79 may be connected between the signal detection transistor 72 and the photoelectric conversion unit 50B.

Third Embodiment

Figure 19A:
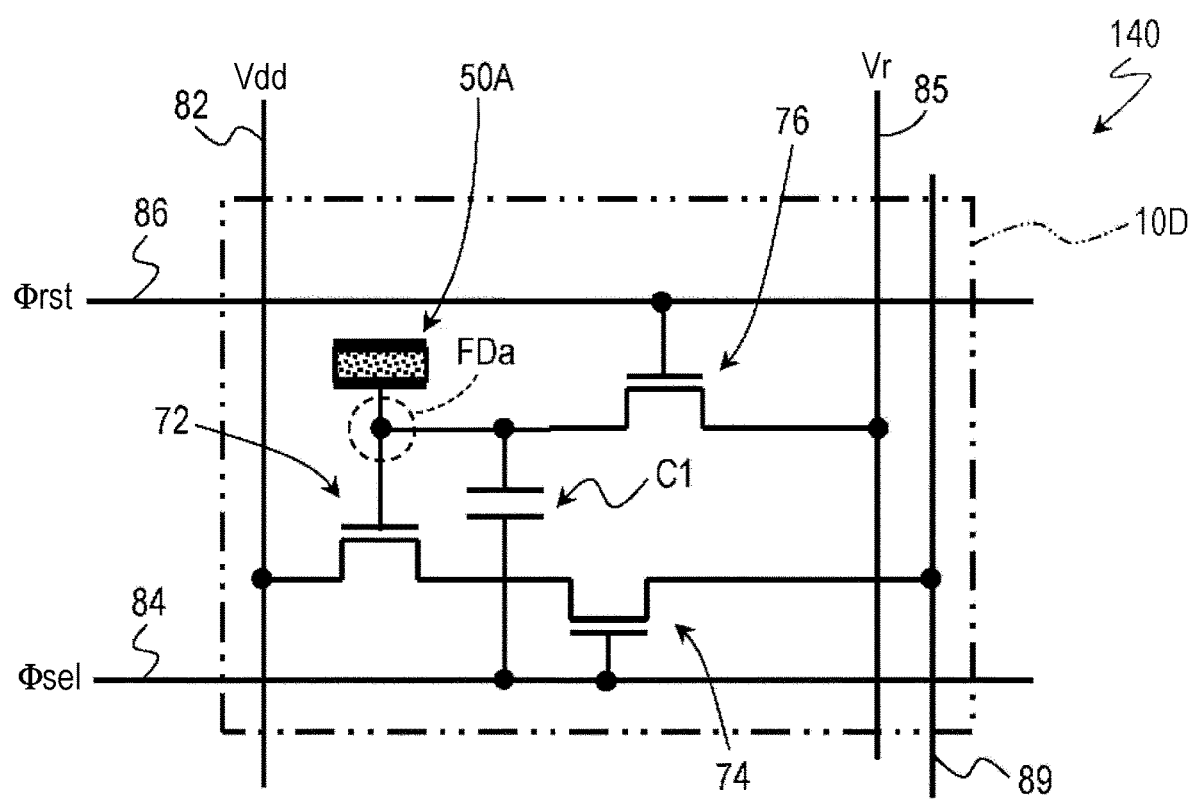
FIG. 19A is a diagram schematically illustrating an example of the circuit configuration of a pixel included in an imaging device according to a third embodiment of the present disclosure.
Figure 19B:
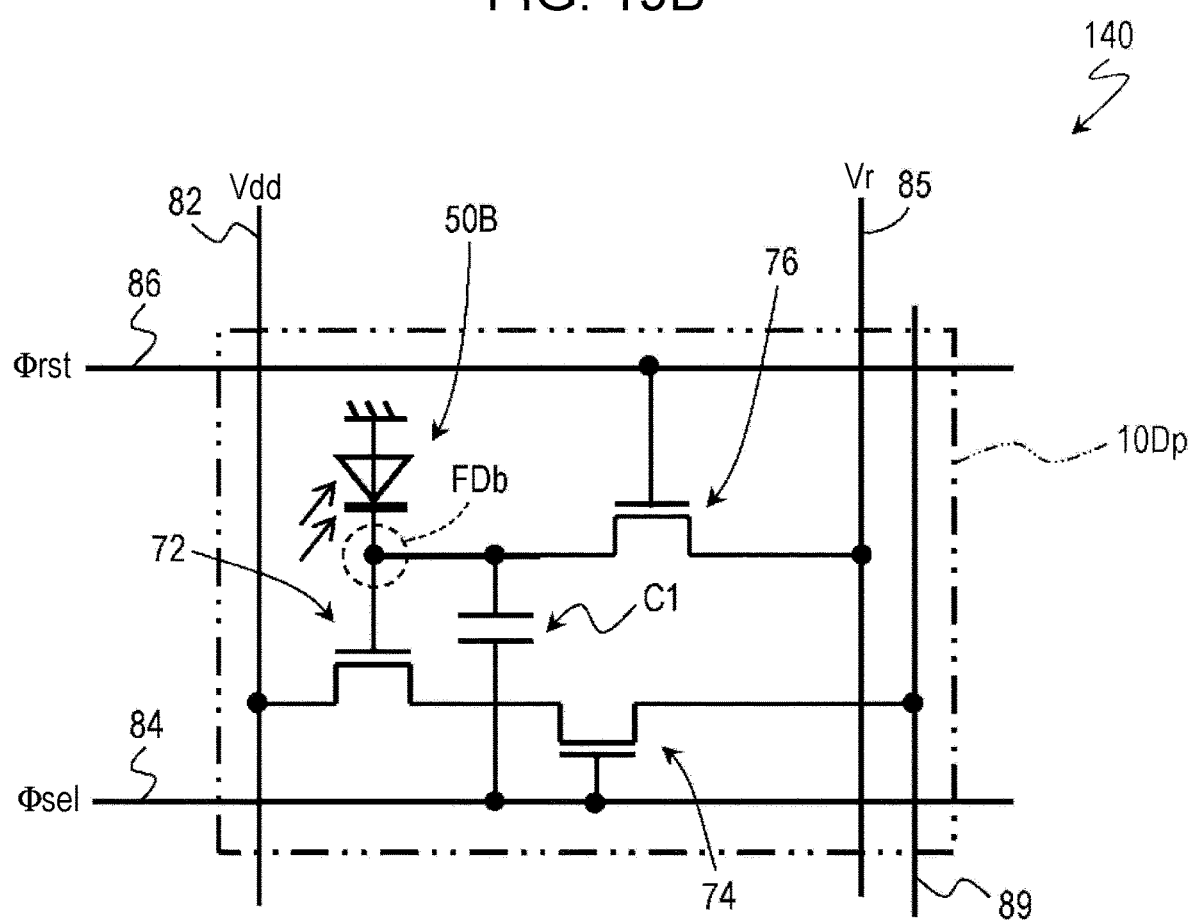
FIG. 19B is a diagram schematically illustrating another example of the circuit configuration of the pixel included in the imaging device according to the third embodiment of the present disclosure.

FIGS. 19A and 19B schematically illustrate examples of the circuit configuration of a pixel included in an imaging device according to a third embodiment of the present disclosure. An imaging device 140 illustrated in FIG. 19A includes a pixel 10D. As with the circuit configuration described with reference to FIG. 3, the pixel 10D includes the signal detection transistor 72, the address transistor 74, and the reset transistor 76. In the circuit configuration of a pixel 10Dp illustrated in FIG. 19B, the photoelectric conversion unit 50A of the pixel 10D illustrated in FIG. 19A is replaced by the photoelectric conversion unit 50B.

A main difference between the pixel 10D illustrated in FIG. 19A and the pixel 10A described with reference to FIG.

3 is that, in the pixel 10D, the voltage supply circuit 128 is not connected to the node FDa and the node FDa and the address signal line 84 are electrically connected to each other through the capacitor C1. The pixel 10D has the device structure described with reference to FIG. 2 except that the control line 81 is not provided in the interlayer insulating layer 40. In the pixel 10Dp illustrated in FIG. 19B, as in the pixel 10D illustrated in FIG. 19A, a terminal of the capacitor C1 that is not connected to the node FDb is connected to the address signal line 84.

The address signal Φsel is input to the terminal of the capacitor C1 connected to the address signal line 84. In these examples of the circuit, therefore, the potential of the node FDa or FDb can be controlled by controlling the address signal Φsel. The address signal line 84, however, need not necessarily be connected to a terminal of the capacitor C1. When positive holes are used as signal charges, for example, a control signal whose level is high during a reset period and low during a period in which a row is not selected may be input to a terminal of the capacitor C1 that is not connected to the node FDa or FDb. For example, the reset signal Φrst or another control signal may be input to the terminal of the capacitor C1 that is not connected to the node FDa or FDb.

Figure 20:
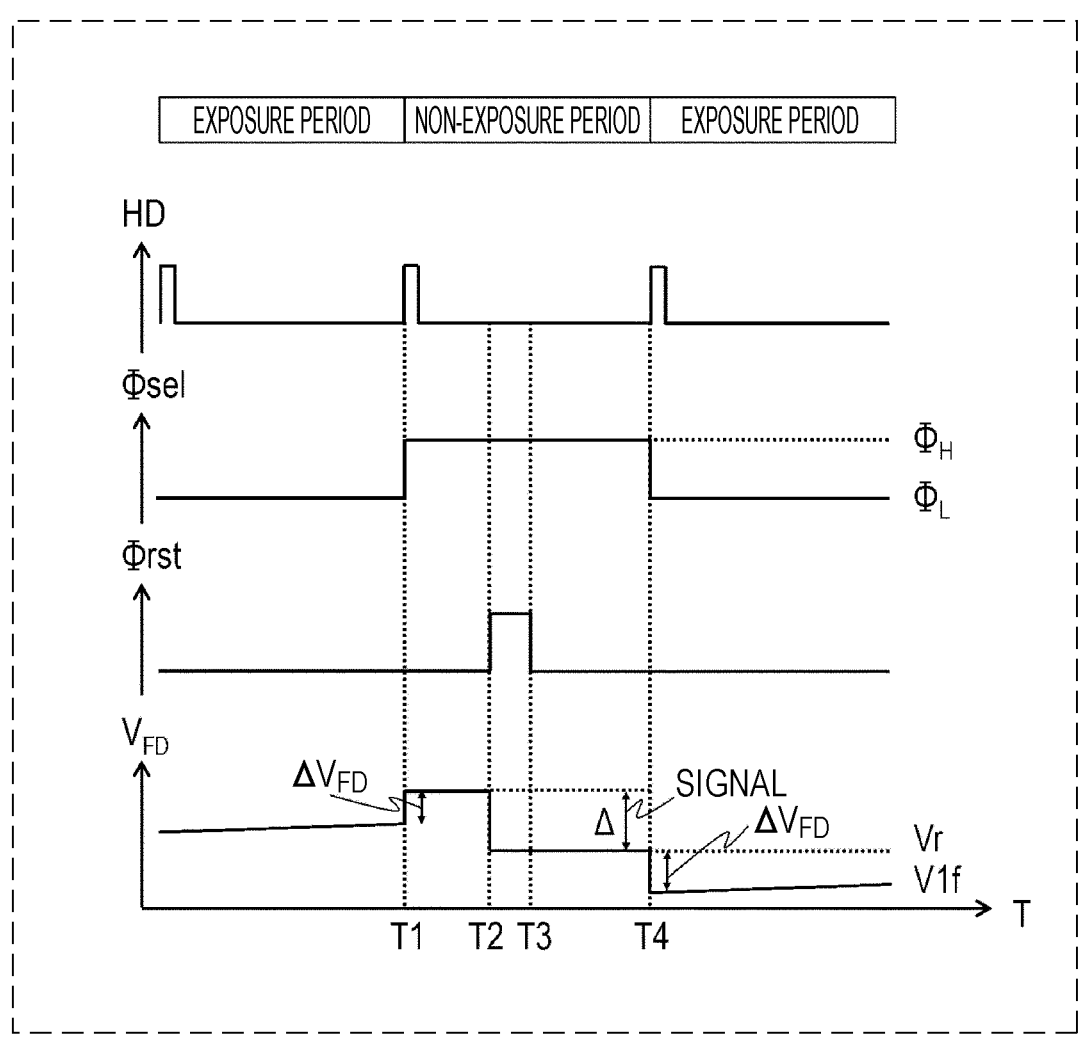
FIG. 20 is a timing chart illustrating an example of the operation of the pixel having the circuit configuration illustrated in FIG. 19A.

FIG. 20 is a timing chart illustrating an example of the operation of the pixel 10D having the circuit configuration illustrated in FIG. 19A. In an operation sequence illustrated in FIG. 20, unlike in the operation sequence described with reference to FIG. 4C, the address signal Φsel, which also plays a role of the voltage Vc illustrated in FIG. 4C, switches between a high-level signal $\Phi_H$ and a low-level signal $\Phi_L$. The low-level signal $\Phi_L$ corresponds to the first voltage $V_A$, and the high-level signal $\Phi_H$ corresponds to the second voltage $V_B$.

In the pixel 10D, the node FDa is capacitively coupled with the address signal line 84 through the capacitor C1. The potential of the node FDa, therefore, can be increased by turning the address signal Φsel high at the time T1. A change $\Delta V_{FD}$ in the potential at this time is represented by expression (2).

$$\Delta V_{FD} = (\Phi_H - \Phi_L)(C_1/(C_1 + C_{FD})) \quad (2)$$

By switching the address signal Φsel to the low-level signal $\Phi_L$ at the time T4, the potential of the node FDa decreases by $\Delta V_{FD}$ represented by expression (2). The potential of the charge accumulation node can thus be controlled using the Φsel, and, as illustrated in FIG. 20, for example, the potential of the node FDa when the address signal Φsel has been reset to the low-level signal $\Phi_L$ can be set to a potential V1f lower than the reset voltage Vr. Because the potential $V_{FD}$ of the impurity region 60a when a row has been selected and resetting has been performed has been increased to the reset voltage Vr, the second signal can be normally read within a voltage range within which subsequent circuits of the signal detection transistor 72 are operable.

According to the third embodiment, the number of signal lines can be decreased since the potential of the charge accumulation node is controlled through the capacitive coupling using the address signal Φsel. As a result, the pixel can be reduced in size. The capacitor C1 is not limited to a MIS capacitor or a MIM capacitor. The capacitor C1 may be achieved by a parasitic capacitance between wires, instead. For example, the capacitor C1 may be achieved by a parasitic capacitance between the gate of the signal detection transistor 72 and a signal line.

Fourth Embodiment

Figure 21:
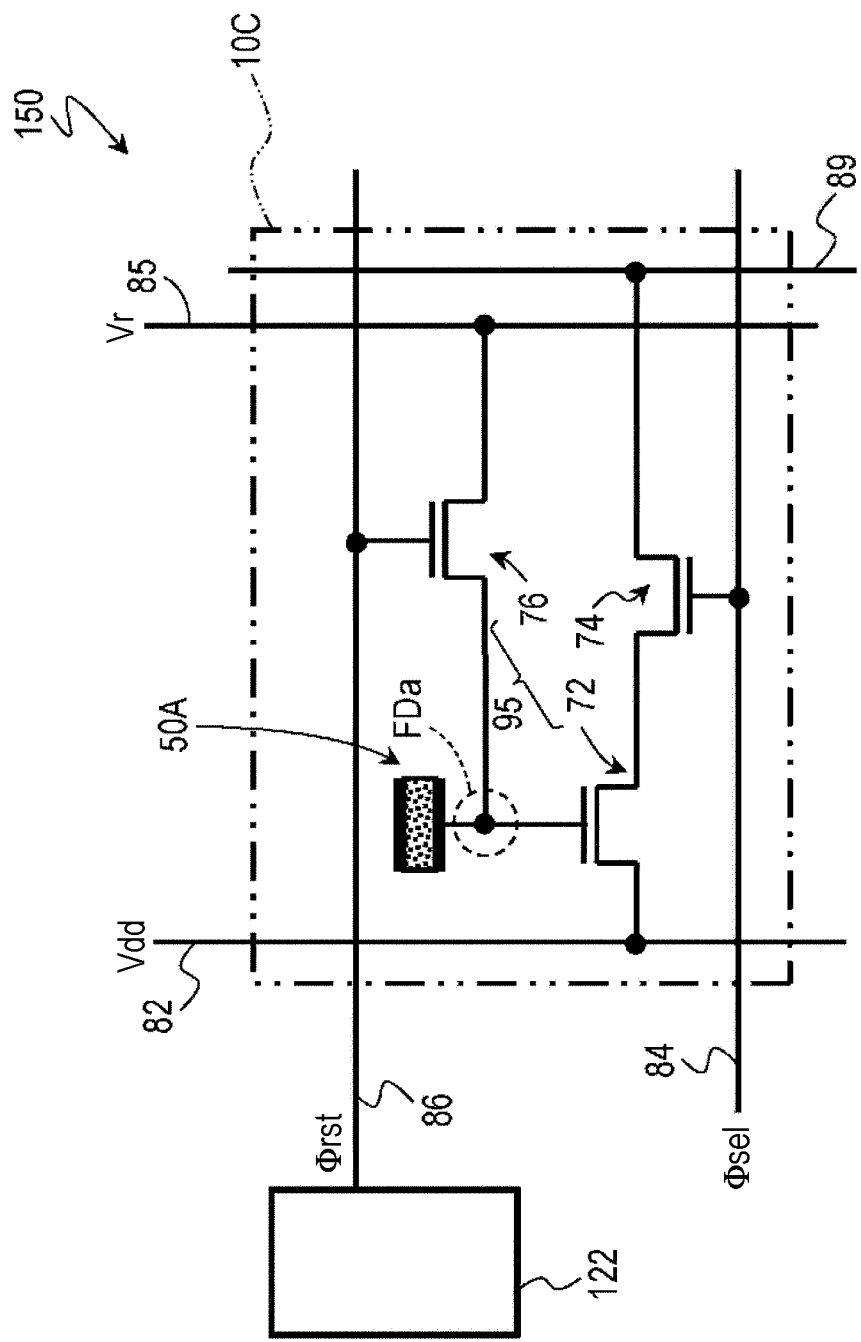
FIG. 21 is a diagram schematically illustrating an example of the circuit configuration of a pixel included in an imaging device according to a fourth embodiment of the present disclosure.

FIG. 21 schematically illustrates an example of the circuit configuration of a pixel included in an imaging device according to a fourth embodiment of the present disclosure. An imaging device 150 illustrated in FIG. 21 includes a pixel 10C. As with the circuit configuration described with reference to FIG. 3, the pixel 10C includes the signal detection transistor 72, the address transistor 74, and the reset transistor 76. The signal detection transistor 72, the address transistor 74, and the reset transistor 76 include a detection circuit 95 that detects signal charges accumulated in the node FDa electrically connected to the photoelectric conversion unit 50A. Unlike the pixel 10A illustrated in FIG. 3, the voltage supply circuit 128 is not connected to the node FDa of the pixel 10C illustrated in FIG. 21. The pixel 10C has the device structure described with reference to FIG. 2 except that the control line 81 is not provided in the interlayer insulating layer 40.

Example of Operation of Imaging Device 150

Figure 22A:
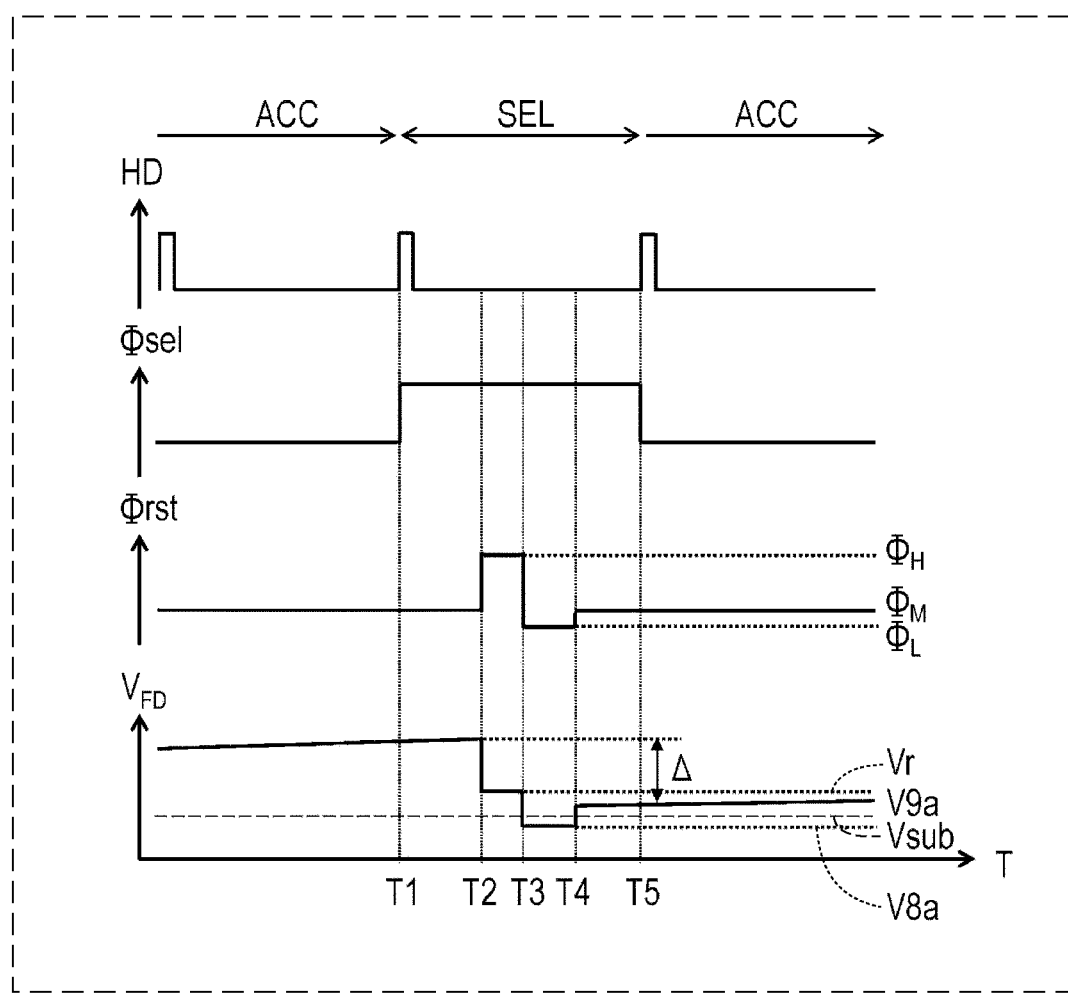
FIG. 22A is a timing chart illustrating an example of the operation of the pixel having the circuit configuration illustrated in FIG. 21.

FIG. 22A is a timing chart illustrating an example of the operation of the pixel 10C having the circuit configuration illustrated in FIG. 21.

This example is the same as the above-described typical example in that, after signal charges are accumulated through exposure, the address transistor 74 is turned on at the time T1 to read a first signal whose voltage level corresponds to the signal charges accumulated in the charge accumulation node. The reset signal Φrst is then turned high at the time T2 as in the first example to turn on the reset transistor 76 and discharge the signal charges from the charge accumulation node through the reset transistor 76. At this time, the potential $V_{FD}$ of the impurity region 60a changes to Vr. Here, Vr>Vsub.

Next, the reset signal Φrst is turned low at the time T3 to turn off the reset transistor 76. When the reset transistor 76 turns off, the potential $V_{FD}$ of the impurity region 60a decreases from Vr due to the electrical coupling caused by the parasitic capacitance of the reset transistor 76. If Vr is close to the substrate potential Vsub, for example, the potential $V_{FD}$ after the reset transistor 76 is turned off falls below the substrate potential Vsub. In this example, the potential $V_{FD}$ of the impurity region 60a decreases from Vr to V8a, which is lower than Vsub, when the reset transistor 76 is turned off.

In the example illustrated in FIG. 22A, however, the reset signal Φrst applied to the gate of the reset transistor 76 is switched to an intermediate-level signal $\Phi_M$, whose voltage level is lower than that of the high-level signal $\Phi_H$ but higher than that of the low-level signal $\Phi_L$. The intermediate-level signal $\Phi_M$ has a voltage level with which the reset transistor 76 remains off.

By switching the reset signal Φrst from the low-level signal $\Phi_L$ to the intermediate-level signal $\Phi_M$ with the reset transistor 76 turned off, the potential $V_{FD}$ of the impurity region 60a can be increased higher than the substrate potential Vsub using the electrical coupling caused by the parasitic capacitance between the gate and the drain of the reset transistor 76. In this example, the potential $V_{FD}$ of the impurity region 60a increases to V9a, which satisfies V9a>Vsub, by switching the reset signal Φrst from the low-level signal $\Phi_L$ to the intermediate-level signal $\Phi_M$.

After the reset signal Φrst is switched from the low-level signal $\Phi_L$ to the intermediate-level signal $\Phi_M$, a second signal corresponding to the voltage level of the charge accumulation node after signal charges are discharged, that is, after resetting, is read before the time T5, at which a next rising edge of the horizontal synchronizing signal HD appears. That is, in this example, the second signal is read with the potential $V_{FD}$ of the impurity region 60a set higher than the substrate potential Vsub.

The potential $V_{FD}$ of the impurity region 60a may thus temporarily fall below the substrate potential Vsub between the reading of the first signal and the reading of the second signal. The voltage level of the intermediate-level signal $\Phi_M$ applied to the reset signal line 86, however, is set such that the potential $V_{FD}$ exceeds the substrate potential Vsub when the reset signal Φrst is switched from the low-level signal $\Phi_L$ to the intermediate-level signal $\Phi_M$. If a period for which the potential $V_{FD}$ of the impurity region 60a falls below the substrate potential Vsub is extremely short and the potential $V_{FD}$ of the impurity region 60a after the resetting is higher than the substrate potential Vsub, an effect of dark current upon the second signal corresponding to the voltage level of the charge accumulation node after the resetting can be suppressed.

Figure 22B:
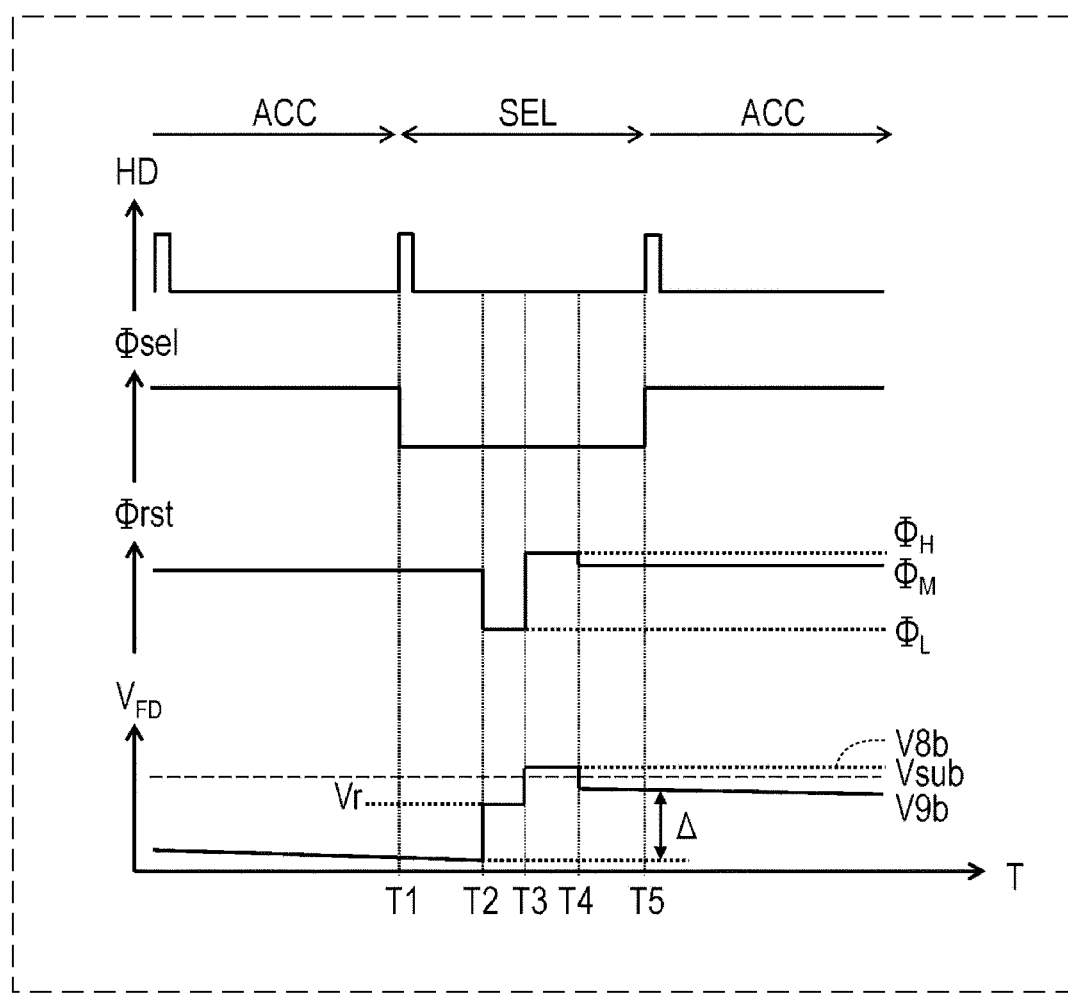
FIG. 22B is a timing chart illustrating an example of an operation at a time when a reset transistor of the pixel illustrated in FIG. 21 is a p-type transistor and electrons are used as signal charges.

FIG. 22B is a timing chart illustrating an example of an operation at a time when the reset transistor 76 of the pixel 10C illustrated in FIG. 21 is a p-type transistor and electrons are used as signal charges. When the signal detection transistor 72, the address transistor 74, and the reset transistor 76 are p-type transistors instead of n-type transistors and electrons are used as signal charges, for example, the following operation may be performed.

After signal charges are accumulated through exposure, the address transistor 74 is turned on at the time T1 to read a first signal whose voltage level corresponds to the signal charges accumulated in the charge accumulation node. Next, the reset signal Φrst is turned low at the time T2 to turn on the reset transistor 76 and discharge the signal charges from the charge accumulation node. At this time, the potential $V_{FD}$ of the impurity region 60a is Vr, and Vr<Vsub in this example.

Next, the reset signal Φrst is switched to the high-level signal $\Phi_H$ at the time T3 to turn off the reset transistor 76. In this example, the potential $V_{FD}$ of the impurity region 60a increases from Vr to V8b, which is higher than Vsub, when the reset transistor 76 is turned off. The reset signal Φrst applied to the gate of the reset transistor 76 is then switched at the time T4 to the intermediate-level signal $\Phi_M$, whose voltage level is between that of the low-level signal $\Phi_L$ and that of the high-level signal $\Phi_H$. In this example, the voltage level of the intermediate-level signal $\Phi_M$ is higher than that of the low-level signal $\Phi_L$ but lower than that of the high-level signal $\Phi_H$. In this example, too, the intermediate-level signal $\Phi_M$ has a voltage level with which the reset transistor 76 remains off.

By switching the reset signal Φrst from the high-level signal $\Phi_H$ to the intermediate-level signal $\Phi_M$ with the reset transistor 76 turned off, the potential $V_{FD}$ of the impurity region 60a can be decreased lower than the substrate potential Vsub using the electrical coupling through the reset transistor 76. In this example, the potential $V_{FD}$ of the impurity region 60a decreases to V9b, which satisfies V9b<Vsub, by switching the reset signal Φrst from the high-level signal $\Phi_H$ to the intermediate-level signal $\Phi_M$. A second signal corresponding to the voltage level of the charge accumulation node after the signal charges are discharged is read before the time T5.

In this example, the potential $V_{FD}$ of the impurity region 60a is lower than the substrate potential Vsub when the second signal is read. If the potential $V_{FD}$ of the impurity region 60a is lower than the substrate potential Vsub when the second signal is read, the potential $V_{FD}$ of the impurity region 60a may temporarily exceed the substrate potential Vsub between the reading of the first signal and the reading of the second signal. If a period for which the potential $V_{FD}$ of the impurity region 60a exceeds the substrate potential Vsub is extremely short and the potential $V_{FD}$ of the impurity region 60a after the resetting is lower than the substrate potential Vsub, an effect of dark current upon the second signal corresponding to the voltage level of the charge accumulation node after the resetting can be suppressed.

In the fourth embodiment, the vertical scanning circuit 122 resets the potential $V_{FD}$ of the impurity region 60a by sequentially applying a first-level signal for turning on the reset transistor 76, a second-level signal for turning off the reset transistor 76, and an intermediate-level signal to the gate of the reset transistor 76. The intermediate-level signal $\Phi_M$ has a voltage level between a voltage level of the first-level signal and a voltage level of the second-level signal and with which the reset transistor 76 remains off. In the circuit configuration illustrated in FIG. 21, if the potential $V_{FD}$ of the impurity region 60a is higher than the substrate potential Vsub when the intermediate-level signal $\Phi_M$ is applied to the gate of the reset transistor 76, an effect of dark current upon the second signal corresponding to the voltage level of the charge accumulation node after the resetting can be suppressed, and deterioration of image quality can be avoided as described with reference to FIG. 22A. At this time, the potential $V_{FD}$ of the impurity region 60a may temporarily fall below the substrate potential Vsub when the second-level signal is applied to the gate of the reset transistor 76.

According to the fourth embodiment, deterioration of image quality due to dark current can be prevented while avoiding excessive complication of circuits. In addition, the potential $V_{FD}$ of the impurity region 60a when the second signal corresponding to the voltage level of the charge accumulation node after the resetting is read becomes close to the substrate potential Vsub and as low as possible, for example, and dark current can be effectively suppressed.

Modification of Fourth Embodiment

Figure 23:
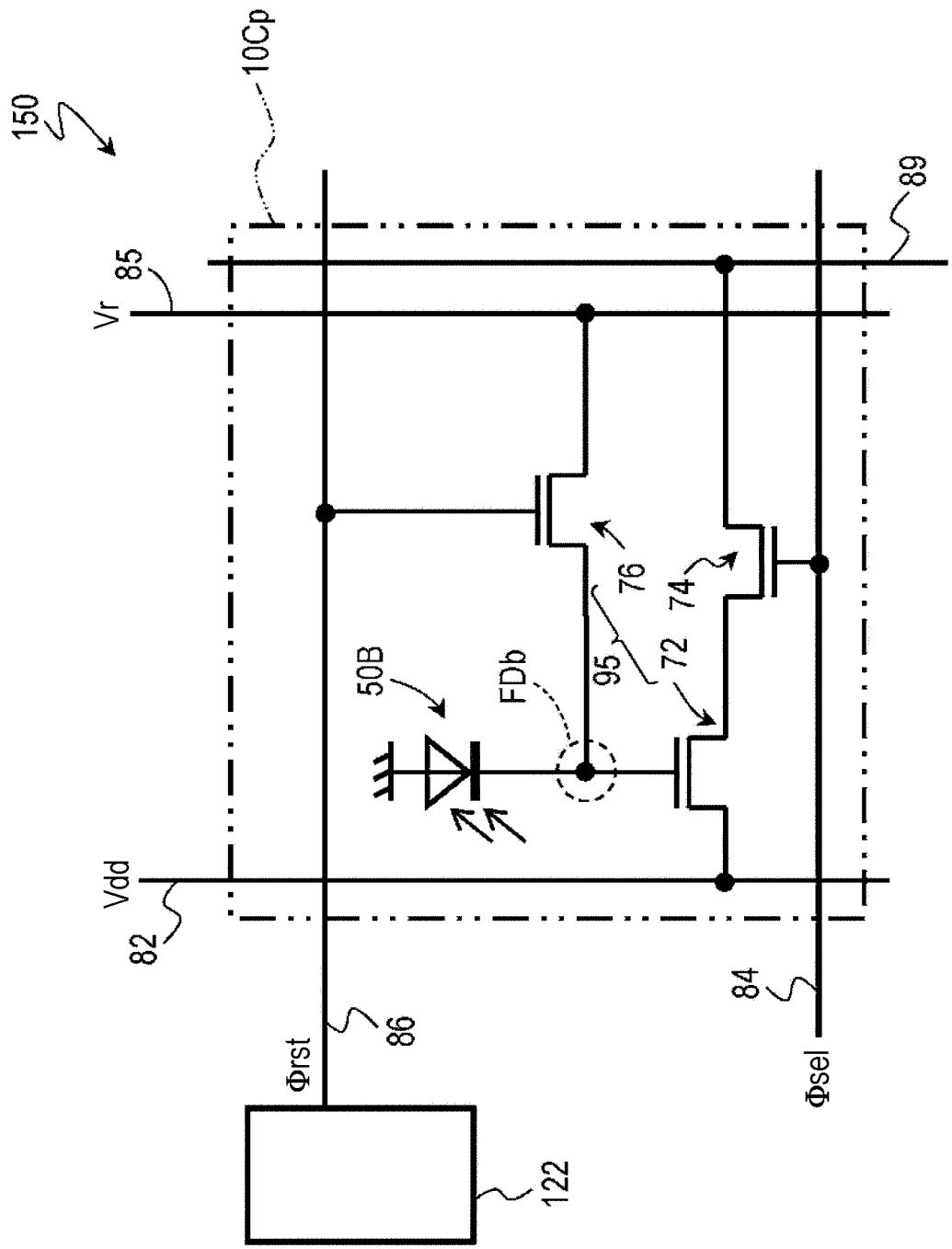
FIG. 23 is a diagram illustrating an imaging device according to a modification of the fourth embodiment of the present disclosure.

FIG. 23 illustrates an imaging device according to a modification of the fourth embodiment of the present disclosure. In the circuit configuration of a pixel 10Cp illustrated in FIG. 23, the photoelectric conversion unit 50A of the pixel 10C illustrated in FIG. 21 is replaced by the photoelectric conversion unit 50B.

The operation of the imaging device 100 including the pixel 10Cp may be the same as that described with reference to FIGS. 22A and 22B. With the circuit configuration illustrated in FIG. 23, as with that of the pixel 10C illustrated in FIG. 21, deterioration of image quality due to dark current can be prevented while avoiding excessive complication of circuits. As in the pixel 10Aq illustrated in FIG. 6, the transfer transistor 79 may be connected between the signal detection transistor 72 and the photoelectric conversion unit 50B.

As described above, according to the embodiments of the present disclosure, for example, the potential of an impurity region included in a floating node can be controlled through a capacitor, and the number of lattice defects in a depletion layer formed between the impurity region and an adjacent region can be decreased by reducing the depletion layer in size. In addition, entry of noise due to a forward current generated in a p-n junction between the impurity region included in the floating node and the adjacent region can be suppressed. As a result, an imaging device in which a decrease in the S/N ratio due to dark current is suppressed is provided.

Imaging devices according to embodiments of the present disclosure are not limited to those described in the above examples, which may be modified in various ways. The operation of the peripheral circuit 120 including the voltage supply circuit 128 may be performed on the basis of an instruction from a control circuit provided on the semiconductor substrate 60 or another substrate. Each circuit included in an imaging device may be achieved by an integrated circuit such as a large-scale integration (LSI) circuit, or some or all of circuits included in an imaging device may be integrated on a chip as a single circuit. Each circuit included in an imaging device may be achieved as a field-programmable gate array (FPGA), a reconfigurable processor, or the like. Each circuit included in an imaging device may be achieved as a circuit intended for a specific process or may be achieved by combining a general-purpose processing circuit and a program in which the process described in one of the above embodiments is described. The program may be stored in a memory provided on the semiconductor substrate 60 or another substrate.

Fifth Embodiment

Figure 24:
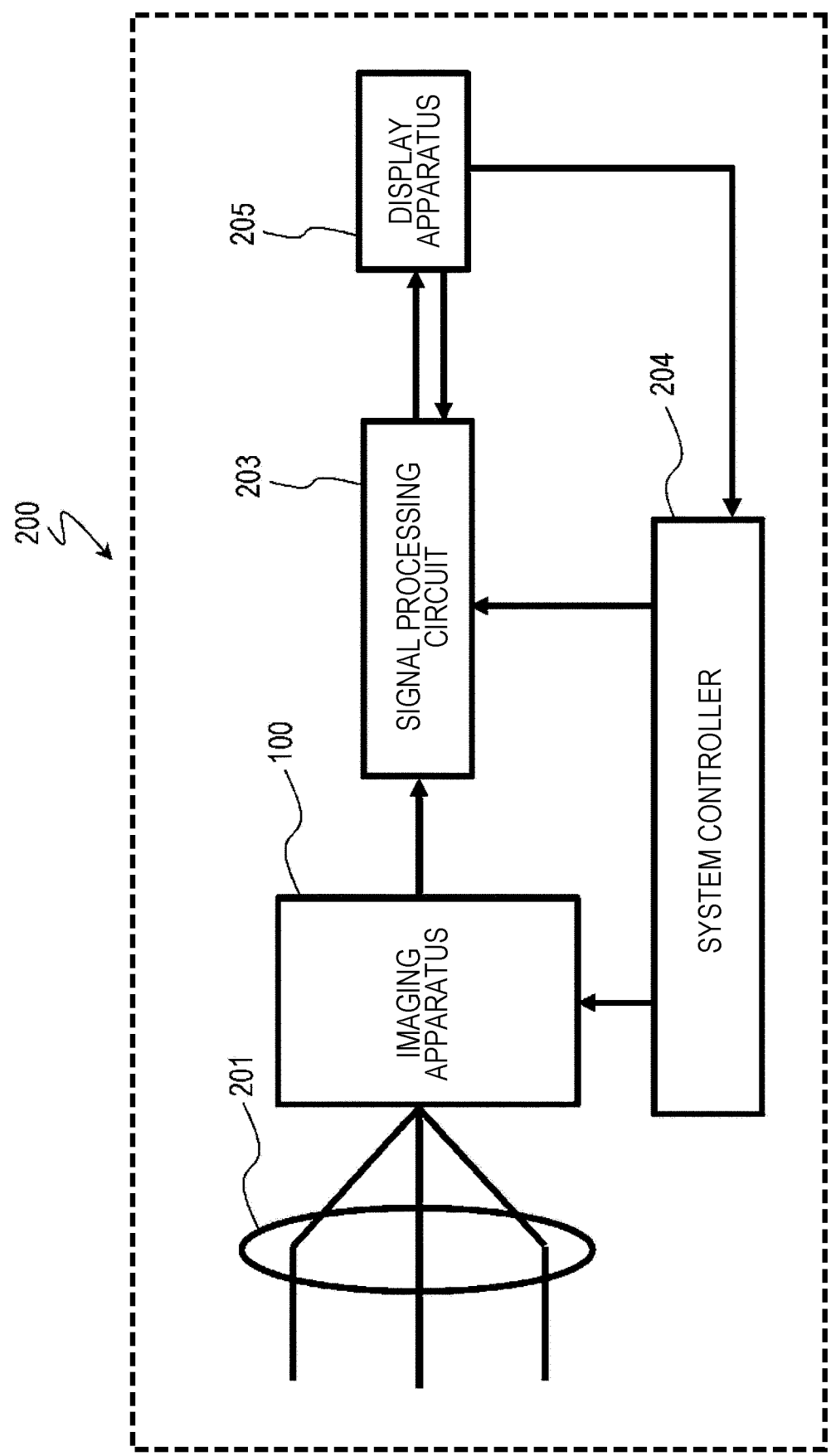
FIG. 24 is a functional block diagram schematically illustrating an example of a camera system according to a fifth embodiment of the present disclosure.

FIG. 24 schematically illustrates functional blocks of a camera system according to a fifth embodiment of the present disclosure. A camera system 200 illustrated in FIG. 24 includes an optical system 201, the imaging device 100, a signal processing circuit 203, a system controller 204, and a display apparatus 205. The camera system 200 may be, for example, a smartphone, a digital camera, a video camera, or the like.

The optical system 201 includes, for example, lenses such as an optical zoom lens and an autofocus lens and a diaphragm. The imaging device 100 may be one of the imaging devices 100 according to the first to fourth embodiments.

The signal processing circuit 203 is, for example, a digital signal processor (DSP). The signal processing circuit 203 receives output data from the imaging device 100 and performs processes such as gamma correction, color interpolation, space interpolation, and auto white balance. The imaging device 100 and the signal processing circuit 203 may be achieved as a single semiconductor apparatus. The semiconductor apparatus may be, for example, a so-called "system on a chip (SoC)". With this configuration, an electronic device including the imaging device 100 can be reduced in size.

The system controller 204 controls the entirety of the camera system 200. The system controller 204 is typically a semiconductor integrated circuit, that is, for example, a central processing unit (CPU).

The display apparatus 205 is, for example, a liquid crystal display or an organic electroluminescent (EL) display. The display apparatus 205 may include an input interface such as a touch panel. As a result, a user can select and control processes to be performed by the signal processing circuit 203 and set imaging conditions through the input interface using a stylus pen.

The signal detection transistor 72, the address transistor 74, the reset transistor 76, the transistor 71, the transistor 78, the load transistor 73, and the transfer transistor 79 may be p-channel MOS transistors, instead. As described above, when these transistors are p-channel MOS transistors, the second voltage may be lower than the first voltage. The signal detection transistor 72, the address transistor 74, the reset transistor 76, the transistor 71, the transistor 78, the load transistor 73, and the transfer transistor 79 need not be uniformly n-channel MOS transistors or p-channel MOS transistors. FETs or bipolar transistors may also be used.

According to the embodiments of the present disclosure, an imaging device capable of performing high-quality imaging is provided by suppressing an effect of dark current. The imaging device in the present disclosure is effective, for example, as an image sensor, a digital camera, or the like. The imaging device in the present disclosure may be used as a mobile device camera, a medical camera, a robot camera, a security camera, a camera mounted on a vehicle, or the like.

What is claimed is:

1. An imaging device comprising:
   a semiconductor substrate that includes a first impurity region, the first impurity region having n-type conductivity;
   a photoelectric converter that includes a first electrode electrically connected to the first impurity region, a second electrode, and a photoelectric conversion layer between the first electrode and the second electrode, and that converts light into charges;
   a capacitor that includes a first terminal and a second terminal, the first terminal being electrically connected to the first impurity region;
   a first voltage supply circuit electrically connected to the second terminal;
   a second voltage supply circuit electrically connected to the second electrode;
   a first transistor including the first impurity region as a source or a drain; and
   a control circuit, wherein:
   the first voltage supply circuit includes a first voltage source for supplying a first voltage, a second voltage source for supplying a second voltage greater than the first voltage in a positive direction and a switch for selecting the first voltage source and the second voltage source,
   the second voltage supply circuit is configured to supply, to the second electrode, a positive voltage on the basis of a voltage of the first electrode, to cause positive charges generated by the photoelectric converter to be accumulated in the first impurity region, and
   the control circuit is programmed to cause the switch to connect the first voltage source to the second terminal in a first period, and to cause the switch to connect the second voltage source to the second terminal in a second period continuous to the first period, the first transistor being in on-state in the first period, the first transistor being in off-state in the second period.

2. The imaging device according to claim 1, wherein:
   the semiconductor substrate includes a second impurity region,
   the first transistor includes the second impurity region as the other of the source and the drain, and
   the first terminal is electrically connected to the second impurity region.

3. The imaging device according to claim 1, wherein
   the capacitor and the first impurity region are at least a part of a charge accumulation node that accumulates positive charges generated by the photoelectric converter, and
   a capacitance of the capacitor is lower than a capacitance of a part of the charge accumulation node other than the capacitor.

4. The imaging device according to claim 1, wherein one of the first voltage source and the second voltage source is coupled to a ground.

5. The imaging device according to claim 1, wherein
the control circuit is programmed to cause the first voltage supply circuit to generate the first, voltage and the second voltage in each frame period.

6. The imaging device according to claim 1, further comprising one or more wiring layers disposed between the substrate and the photoelectric converter,
wherein the first electrode of the photoelectric converter is connected to the first impurity region by one or more conductive plugs and wires.

7. An imaging device comprising:
a semiconductor substrate that includes a first impurity region, the first impurity region having n-type conductivity;
a photoelectric converter that includes a first electrode electrically connected to the first impurity region, a second electrode, and a photoelectric conversion layer between the first electrode and the second electrode, and that converts light into charges;
a capacitor that includes a first terminal and a second terminal, the first terminal being electrically connected to the first impurity region;
a first voltage supply circuit electrically connected to the second terminal;
a second voltage supply circuit electrically connected to the second electrode;
a first transistor including the first impurity region as a source or a drain; and
a control circuit, wherein
the voltage supply circuit includes a first voltage source for supplying a first voltage, a second voltage source for supplying a second voltage greater than the first voltage in a positive direction and a switch for selecting the first voltage source and the second voltage source,
the second voltage supply circuit is configured to supply, to the second electrode, a positive voltage on the basis of a voltage of the first electrode, to cause positive charges generated by the photoelectric converter to be accumulated in the first impurity region, and
the control circuit is programmed to cause the switch to connect the first voltage source to the second terminal in a first period that is an exposure period in which the positive charges are accumulated in the first impurity region, and to cause the switch to connect the second voltage source to the second terminal in a second period that is a non-exposure period including a reset period in which a voltage of the first impurity region is reset.

8. An imaging device comprising:
a semiconductor substrate that includes a first impurity region, the first impurity region having p-type conductivity;
a photoelectric converter that includes a first electrode electrically connected to the first impurity region, a second electrode, and a photoelectric conversion layer between the first electrode and the second electrode, and that converts light into charges;
a capacitor that includes a first terminal and a second terminal, the first terminal being electrically connected to the first impurity region;
a first voltage supply circuit electrically connected to the second terminal;
a second voltage supply circuit electrically connected to the second electrode;
a first transistor including the first impurity region as a source or a drain; and
a control circuit, wherein:
the first voltage supply circuit includes a first voltage source for supplying a first voltage, a second voltage source for supplying a second voltage less than the first voltage in a positive direction and a switch for selecting the first voltage source and the second voltage source,
the second voltage supply circuit is configured to supply, to the second electrode, a negative voltage on the basis of a voltage of the first electrode, to cause negative charges generated by the photoelectric converter to be accumulated in the first impurity region, and
the control circuit is programmed to cause the switch to connect the first voltage source to the second terminal in a first period, and to cause the switch to connect the second voltage source to the second terminal in a second period continuous to the first period, the first transistor being in on-state in the first period, the first transistor being in off-state in the second period.

9. The imaging device according to claim 8, wherein:
the semiconductor substrate includes a second impurity region,
the first transistor includes the second impurity region as the other of the source and the drain, and
the first terminal is electrically connected to the second impurity region.

10. The imaging device according to claim 8, wherein
the capacitor and the first impurity region are at least a part of a charge accumulation node that accumulates negative charges generated by the photoelectric converter, and
a capacitance of the capacitor is lower than a capacitance of a part of the charge accumulation node other than the capacitor.

11. The imaging device according to claim 3, wherein one of the first voltage source and the second voltage source is coupled to a ground.

12. The imaging device according to claim 8, wherein
the control circuit is programmed to cause the first voltage supply circuit to generate the first voltage and the second voltage in each frame period.

13. The imaging device according to claim 8, further comprising one or more wiring layers disposed between the substrate and the photoelectric converter,
wherein the first electrode of the photoelectric converter is connected to the first impurity region by one or more conductive plugs and wires.

14. An imaging device comprising:
a semiconductor substrate that includes a first impurity region, the first impurity region having p-type conductivity;
a photoelectric converter that includes a first electrode electrically connected to the first impurity region, a second electrode, and a photoelectric conversion layer between the first electrode and the second electrode, and that converts light into charges;
a capacitor that includes a first terminal and a second terminal, the first terminal being electrically connected to the first impurity region;
a first voltage supply circuit electrically connected to the second terminal;
a second voltage supply circuit electrically connected to the second electrode;

a first transistor including the first impurity region as a source or a drain; and a control circuit, wherein the voltage supply circuit includes a first voltage source for supplying a first voltage, a second voltage source for supplying a second voltage less than the first voltage in a positive direction and a switch for selecting the first voltage source and the second voltage source, the second voltage supply circuit is configured to supply, to the second electrode, a negative voltage on the basis of a voltage of the first electrode, to cause negative charges generated by the photoelectric converter to be accumulated in the first impurity region, and the control circuit is programmed to cause the switch to connect the first voltage source to the second terminal in a first period that is an exposure period in which the positive charges are accumulated in the first impurity region, and to cause the switch to connect the second voltage source to the second terminal in a second period that is a non-exposure period including a reset period in which a voltage of the first impurity region is reset.

* * * * *